United States Patent [19]

Iwamatsu et al.

[11] Patent Number: 5,440,161
[45] Date of Patent: Aug. 8, 1995

[54] SEMICONDUCTOR DEVICE HAVING AN SOI STRUCTURE AND A MANUFACTURING METHOD THEREOF

[75] Inventors: Toshiaki Iwamatsu; Yasuo Yamaguchi; Yasuo Inoue; Tadashi Nishimura, all of Hyogo, Japan

[73] Assignee: Mitsubishi Denki Kabushiki Kaisha, Tokyo, Japan

[21] Appl. No.: 273,175

[22] Filed: Jul. 26, 1994

[30] Foreign Application Priority Data

Jul. 27, 1993 [JP] Japan .................................. 5-184908
Jul. 11, 1994 [JP] Japan .................................. 6-158536

[51] Int. Cl.6 .................. H01L 27/01; H01L 29/06; H01L 21/265
[52] U.S. Cl. .................. 257/349; 257/350; 257/351; 257/398; 257/400; 437/21; 437/40; 437/56; 437/61
[58] Field of Search ............. 257/349, 350, 351, 354, 257/398, 394, 399, 400, 630, 648, 652, 297, 413, 751; 437/21, 40, 56, 61

[56] References Cited

FOREIGN PATENT DOCUMENTS 57-36842 2/1982 Japan .
3171673 7/1991 Japan ............................ 257/349

OTHER PUBLICATIONS

"Shielded Silicon Gate Complementary MOS Integrated Circuit", Hung Chang Lin et al., IEEE Transactions on Electron Devices, vol. ED-19, No. 11, Nov. 1972, pp. 1199-1206.
"CAD-Compatible High-Speed CMOS/SIMOX Technology Using Filed-Shield Isolation for 1M Gate Array", T. Iwamatsu et al., IEEE 1993.
Physics of Semiconductor Devices, S. M. Sze.

Primary Examiner—Mark V. Prenty
Attorney, Agent, or Firm—Lowe, Price, LeBlanc & Becker

[57] ABSTRACT

A buried oxide film 4 is formed on a main surface of a silicon substrate 1. An SOI layer 5 is formed on buried oxide film 4. Channel stop regions 22a and 22b respectively connected to channel regions of an nMOS 2 and a pMOS 3 are formed in an element isolation region of SOI layer 5. nMOS 2 and pMOS 3 are formed in an element formation region of SOI layer. A concentration of a p type impurity or an n type impurity included in channel stop regions 22a and 22b is higher than a concentration of the p type impurity or the n type impurity included in the channel region of nMOS 2 or the channel region of pMOS 3. An FS gate 16 is formed on channel stop regions 22a and 22b with an FS gate oxide film 15 interposed therebetween. Therefore, a semiconductor device having an SOI structure which is capable of suppressing a parasitic bipolar operation by drawing out efficiently excessive carriers stored in the channel region of transistor can be obtained.

18 Claims, 48 Drawing Sheets

SEMICONDUCTOR DEVICE HAVING AN SOI STRUCTURE AND A MANUFACTURING METHOD THEREOF

BACKGROUND OF THE INVENTION

1. Field of the Invention

The present invention relates to a semiconductor device having an SOI (Semiconductor On Insulator) structure and a manufacturing method thereof, and more particularly, it is concerned with a semiconductor device having an SOI structure in which elements are isolated from each other by using a field shield gate and a manufacturing method of such a semiconductor device.

2. Description of the Background Art

Conventionally, a field shield (hereinafter referred merely to as "FS") isolation has been known as a method for isolating elements electrically from each other. A semiconductor memory device utilizing the conventional FS isolation will be described below.

FIG. 69 is a cross sectional view showing a conventional semiconductor device formed on a bulk silicon substrate wherein elements are isolated by the FS isolation. The use of an FS gate for isolation of transistors on the bulk silicon substrate has been proposed in several reports including *IEEE TRANSACTIONS ON ELECTRON DEVICES*, Vol. ED-19, No. 11, November, 1972, pp. 1199-pp. 1206 by H. C. Lin et al.

With reference to FIG. 69, an n well region 104 and a p well region 105 are respectively formed on a main surface of a p type silicon substrate 101. An nMOS 102 is formed on the surface of p well region 105. A pMOS 103 is formed on the surface of n well region 104. A CMOS is formed by pMOS 103 and nMOS 102 which are isolated from each other by an FS gate 116.

nMOS 102 includes an n⁻ diffusion region 107, an n+ diffusion region 108, a gate oxide film 111, and a gate electrode 112. Gate electrode 112 is formed by polycrystalline silicon which includes phosphorus (P) of at least $1 \times 10^{20}/cm^3$. A tungsten silicide (WSi$_2$) layer 113 is formed on gate electrode 112 so as to reduce resistance of gate electrode 112.

pMOS 103 includes a p$^{31}$ diffusion region 109, a p+ diffusion region 110, gate oxide film 111, and gate electrode 112. FS gate 116 is formed on an element isolation region with an FS gate oxide film 115 interposed therebetween.

A silicide layer 114 is formed on the surfaces of n+ diffusion region 108 and p+ diffusion region 110 so as to reduce resistance of these diffusion regions 108 and 110. A silicon oxide film 117 is formed to cover gate electrode 112 and FS gate 116. An interlayer oxide film 118 is formed to cover silicon oxide film 117. A contact hole 119 is formed at a predetermined position in interlayer oxide film 118. An interconnection layer 120 mainly made of aluminum (Al) is formed in contact hole 119.

Now, a manufacturing method of a semiconductor device shown in FIG. 69 will be described by using FIGS. 70–82. FIGS. 70–82 show cross sections of first through thirteenth steps of a manufacturing process of the semiconductor device shown in FIG. 69.

With reference to FIG. 70, silicon oxide film 115 having a thickness of about 1000 Å is formed by a CVD (Chemical Vapor Deposition) method on the main surface of p type silicon substrate 101. Polycrystalline silicon layer 116 having a thickness of about 2000 Å is formed on silicon oxide film 115 by CVD. At this time, phosphorus (P) is introduced into polycrystalline silicon layer 116 at a high concentration of about $1 \times 10^{20}/cm^3$. A silicon oxide film 117a having a thickness of about 2000 Å is formed by CVD on polycrystalline silicon layer 116. A resist pattern 121 which is patterned into a predetermined shape is formed on silicon oxide film 117a. Using resist pattern 121 as a mask, silicon oxide film 117a, polycrystalline silicon layer 116, and silicon oxide film 115 are successively etched, whereby FS gate 116 and FS gate oxide film 115 are formed. Then, resist pattern 121 is removed.

With reference to FIG. 71, silicon oxide film 117b having a thickness of about 2000 Å is formed by CVD on the entire main surface of p type silicon substrate 101. Silicon oxide film 117b is subjected to etching in an ambience of gas having a high anisotropic characteristic, whereby silicon oxide film 117 covering FS gate 116 is formed as shown in FIG. 72.

With reference to FIG. 73, resist patten 121 is formed on the main surface of p type silicon substrate 101 so as to cover only a pMOS formation region. Using resist pattern 121 as a mask, boron (B) ions are implanted onto the main surface of p type silicon substrate 101. The ion implantation is conducted in three steps based on the following three kinds of conditions. Conditions are: $1-2 \times 10^{13}/cm^2$ at 700 keV; $2-4 \times 10^{12}/cm^2$ at 160 keV; and $1-2 \times 10^{13}/cm^2$ at 50 keV. Through such three steps of ion implantation, p well region 105 is formed.

With reference to FIG. 74, resist pattern 121 is formed on the main surface of p type silicon substrate 101 so as to cover only an nMOS formation region. Using resist pattern 121 as a mask, phosphorus (P) ions are implanted onto the main surface of p type silicon substrate 101. Ion implantation is also conducted in three steps in this case. Conditions are: $1-2 \times 10^{13}/cm^2$ at 1200 keV; $2-4 \times 10^{12}/cm^2$ at 400 keV; and $1-2 \times 10^{13}/cm^2$ at 180 keV. Then, boron (B) ions are implanted at 20 keV for $2-3 \times 10^{13}/cm^2$, whereby n well region 104 is formed.

As described above, in order to form a transistor on the bulk silicon substrate, it is necessary to conduct ion implantation in several steps with implantation energy or implantation concentration changed. The reasons for this include prevention of punch-through in a short channel region (a gate length of 0.5 μm or less), suppression of the change of transistor characteristics caused by variation of the substrate bias, and avoidance of deterioration of the device characteristics (soft error) caused by charge generated by radiation such as an α-line injected from the external ambience. Therefore, the above-described complex well formation is required for forming the transistor on the bulk silicon substrate.

Now, with reference to FIG. 75, the channel region surfaces of pMOS 103 and nMOS 102 are subjected to wet etching by using a solvent including aqueous ammonia (NH$_4$OH), hydrofluoric acid (HF) and hydrogen chloride (HCl), thus removing a foreign object or natural oxide film provided on the channel region surface. Then, gate oxide film 111 is formed by thermal oxidation or the like to have a thickness of, preferably, about 80–100 Å. The thickness of gate oxide film 111 is determined to conform to a desired transistor characteristic. Gate oxide film 111 is formed by oxidation at temperatures of 800° C.–950° C.

Polycrystalline silicon layer 112 including phosphorus (P) at a high concentration ($1 \times 10^{20}/cm^3$) is formed by CVD on gate oxide film 111. WSi$_2$ layer 113 is formed by sputtering on polycrystalline silicon layer 112 to have a thickness of, preferably, about 1000 Å. Then, a silicon oxide film 117c having a thickness of about 1000 Å is formed by CVD or the like on WSi$_2$ layer 113. Resist pattern 121 patterned into a predetermined shape is formed on silicon oxide film 117c. Using resist pattern 121 as a mask, silicon oxide film 117c is etched. Then, resist pattern 121 is removed. Using silicon oxide film 117c as a mask, WSi$_2$ layer 113 and polycrystalline silicon layer 112 are patterned.

With reference to FIG. 76, resist pattern 121 is formed to cover only the pMOS formation region. Using resist pattern 121 as a mask, phosphorus (P) ions are implanted by continuous rotation at an angle of 45° with 70 keV to attain $1-2\times 10^{13}$/cm$^2$ whereby n$^+$ diffusion region 107 is formed. Then, resist pattern 121 is removed.

With reference to FIG. 77, resist pattern 121 is formed to cover only the nMOS formation region. Using resist pattern 121 as a mask, boron (B) ions are implanted at 10 keV to attain $1-2\times 10^{11}$/cm$^2$, whereby p$^-$ diffusion region 109 is formed.

With reference to FIG. 78, a silicon oxide film 117d having a thickness of about 1000–2000 Å is formed by CVD on the entire main surface of p type silicon substrate 101. Silicon oxide film 117d is subjected to etching in an ambience of gas of a high anisotropic characteristic, whereby silicon oxide film 117 is formed to cover gate electrode 112, as shown in FIG. 79. Then, a Ti layer 122 having a thickness of about 500–800 Å is formed by sputtering. At this time, sputter etching is conducted before formation of Ti layer 122 in order to remove the natural oxide film or foreign objects provided on the surface of p type silicon substrate 101.

With reference to FIG. 80, resist pattern 121 is formed to cover only the pMOS formation region. Using resist pattern 121 as a mask, arsenic (As) ions are implanted at 50 keV to attain $4-6\times 10^{15}$/cm$^2$ and phosphorus (P) ions are implanted by continuous rotation at 60° with 100 keV to attain $1-2\times 10^{14}$/cm$^2$ onto the main surface of p type silicon substrate 101, whereby n$^+$ diffusion region 108 is formed. Then, resist pattern 121 is removed.

With reference to FIG. 81, resist pattern 121 is formed to cover only the nMOS formation region. Using resist pattern 121 as a mask, BF$_2$ ions are implanted at 40 keV to attain $4-6\times 10^{15}$/cm$^2$ onto the main surface of p type silicon substrate 101, whereby a p$^+$ diffusion region 110 is formed. Then, resist pattern 121 is removed.

With reference to FIG. 82, interlayer oxide film 118 having a thickness of about 5000–10000 Å is formed by CVD or the like on the main surface of p type silicon substrate 101. Resist pattern 121 patterned into a predetermined shape is formed on interlayer oxide film 118. Using resist pattern 121 as a mask, interlayer oxide film 118 is etched, whereby contact hole 119 shown in FIG. 69 is formed. By sputtering or the like, interconnection layer 120 is formed in contact hole 119 and on interlayer oxide film 118, thus patterning interconnection layer 120 into a predetermined shape. Through above steps is provided the semiconductor device shown in FIG. 69.

FIG. 83 shows an interconnection layer 120a connected to a power supply Vcc terminal being formed at a predetermined position between FS gates 116 in the semiconductor device shown in FIG. 69. As can be seen from FIG. 83, n well region 104 is usually formed between nMOS 102 and pMOS 103 as shown in FIG. 83.

The reason for this is to fix p well region 105 to a ground potential and to fix n well region 104 to a power supply Vcc potential in the case of using p type silicon substrate 101. More particularly, this is because a Vcc terminal is formed on the top surface of p type silicon substrate 101 and a ground terminal is formed on the back surface thereof for the sake of structure of the circuit.

However, there are three disadvantages in isolation of nMOS 102 and pMOS 103 formed on the bulk silicon substrate by FS gate 116, as follows.

The first disadvantage is latch up between nMOS 102 and pMOS 103. One method to avoid such latchup is to increase concentrations of n well region 104 and p well region 105. However, concentrations of n well region 104 and p well region 105 cannot be increased freely because those concentrations are determined for the sake of setup of threshold voltages in nMOS 102 and pMOS 103.

The second disadvantage is a complex formation process of n well region 104 and p well region 105. As described above, several steps are required in ion implantation for forming n well region 104 and p well region 105, thus causing a complex manufacturing process.

The third disadvantage is regarding an isolation capability. A high threshold voltage is desired for the transistor including FS gate 116 in the FS gate isolation. Accordingly, the isolation capability is improved. One method for this is to increase the concentration of p well region 105 or n well region 104 located directly under FS gate 116, or to increase the thickness of FS gate oxide film 115. Increasing the concentration of the region located directly under FS gate 116 can provide an advantage. More particularly, since excessive carriers generated by impact ionization are diffused and collected by a substrate potential fixing terminal (not shown), resistance of a diffusion path of carriers can be reduced. In other words, collection of excessive carries can be conducted effectively.

However, as described above, the concentration of p well region 105 or n well region 104 cannot be increased freely because it is determined for the sake of the threshold voltages of pMOS 103 and nMOS 102. Therefore, the method for increasing the thickness of FS gate oxide film 115 has been adapted commonly to incur a problem of increase of a stepped portion. Thus, in the conventional example, increase of the threshold voltage of the transistor including the FS gate has been difficult. In other words, improvement of the isolation capability has been difficult.

One conceivable method to solve the above-described problems is to use an SOI substrate instead of the bulk silicon substrate. The SOI substrate represents a substrate having an SOI (Semiconductor On Insulator) structure, and includes a substrate, an insulating layer formed on the surface of the substrate, and a thin film silicon layer (hereinafter referred merely to as "SOI layer") formed on the insulating layer.

At the SOI layer in the above-described SOI substrate are provided various circuit elements. In general, a LOCOS method has been conventionally used to isolate circuit elements from each other formed on the SOI substrate. Since each element isolated by this isolating method (LOCOS isolation) is formed on the semiconductor layer having a complete island shape, the problem of latchup is eliminated. Also, this eliminates the complex well formation process, unlike the case of using the bulk silicon substrate. Further, the isolation capability is sufficient.

FIG. 84 is a cross sectional view showing a semiconductor device formed on a conventional SOI substrate. With reference to FIG. 84, a buried oxide film 130 is formed on the main surface of silicon substrate 101. An SOI layer 131 is formed on buried oxide film 130. An isolation oxide film 132 is formed at a predetermined position (element isolation region) of SOI layer 131. nMOS 102 and pMOS 103 are respectively formed within an island-shaped region surrounded by isolation oxide film 132. A p+ region 133 is formed on nMOS 102 side at the end of isolation oxide film 132, whereby generation of a parasitic MOS can be suppressed. It is noted that in FIG. 84 portions corresponding to components of the semiconductor device shown in FIG. 83 are designated by the same reference numerals and the description thereof will not be repeated.

The following disadvantage is included in nMOS 102 or pMOS 103 completely isolated by the above-described isolation oxide film 132. More particularly, such a complete isolation causes carriers generated by impact ionization to be stored in the channel region of nMOS 102 or pMOS 103 to incur rising of a channel potential. This causes a parasitic bipolar operation, thus reducing a source-drain breakdown voltage of nMOS 102 or pMOS 103. The source/drain breakdown voltage decreases gradually as the gate length is shortened, as shown in FIG. 21 (the LOCOS isolation in FIG. 21). Note that FIG. 21 is a graph showing a relationship between the source/drain breakdown voltage and the gate length.

In order to solve such a problem, the following improvement has been proposed. FIG. 85 is a plan view showing an nMOS portion in an improved example. FIG. 86 is a cross sectional view along line A—A of FIG. 85, and FIG. 85 is a cross sectional view along line C—C of FIG. 85.

First, with reference to FIGS. 85 and 86, an n− diffusion region 107 and an n+ diffusion region 108 are respectively formed to define a channel region 140 at an SOI layer 131 enclosed by an isolation oxide film 132. A gate electrode 112 is formed on channel region 140 with gate oxide film 111 interposed therebetween. A silicide layer 114 is formed on the surface of n+ diffusion region 108. A silicon oxide film 117 is formed to cover gate electrode 112, and an interlayer oxide film 118 is formed to cover silicon oxide film 117. Contact holes 134 and 135 are respectively formed in interlayer oxide film 118, and an interconnection 120 is formed in contact holes 134 and 135.

Next, with reference to FIGS. 85 and 87, a p region 138 formed continuously with channel region 140 and including a p type impurity at the same concentration as that included in channel region 140, and a p+ region 139 are respectively formed in SOI layer 131. A contact hole 137 is formed in interlayer oxide film 118 located on p+ region 139. Interconnection layer 120 is formed in contact hole 137 to serve to fix a potential of SOI layer 131.

Excessive carriers stored in channel region 140 by impact ionization reaches to p+ region 139 through p region 138, and are drawn out by interconnection layer 120 formed in contact hole 137. Thus, rising of the channel potential and the parasitic bipolar operation can be restrained.

However, the following problem occurs even in the above-described improvement. With reference to FIGS. 85 and 87, p region 138 through which the excessive carriers are passed is located under gate electrode 112. This causes depletion of p region 138 as well as channel region 140 in the case when a high voltage is applied to gate electrode 112, whereby movement of the excessive carriers is prevented. In other words, in the above improvement, an efficiency of drawing out the excessive carriers is significantly reduced when the high voltage is applied to gate electrode 112.

SUMMARY OF THE INVENTION

The present invention is made to solve the above problems, and one object of the present invention is to provide a semiconductor device having an SOI structure capable of drawing out efficiently excessive carriers stored in a channel region of a transistor regardless of a voltage applied to a gate of the transistor.

Another object of the present invention is to provide a method of manufacturing a semiconductor device having an SOI structure capable of drawing out excessive carriers efficiently with a suppressed manufacturing cost.

A semiconductor device having an SOI structure according to one aspect of the present invention includes a semiconductor substrate having a main surface, an insulting layer, a semiconductor layer, a channel region, a pair of impurity diffusion regions, a gate electrode, a channel stop region, and a field shield gate. The insulating layer is formed on the main surface of the semiconductor substrate. The semiconductor layer is formed on the insulating layer and includes an element isolation region and an element formation region. An SOI substrate is formed by the semiconductor substrate, the isolating layer, and the semiconductor layer. The channel region is formed within the element formation region of the semiconductor layer and includes an impurity of a first conductivity type having a first concentration. The pair of impurity diffusion regions are formed within the element formation region so as to sandwich the channel region. The gate electrode is formed on the channel region with the insulating layer interposed therebetween. The channel stop region is formed in the element isolation region of the semiconductor layer so as to be connected to the channel region at a predetermined position. The channel stop region includes an impurity of a first conductivity type having a second concentration higher than the first concentration. The field shield gate is formed on the channel stop region with the insulating layer interposed therebetween.

In the semiconductor device having the SOI structure according to one aspect of the present invention, there is provided the channel stop region which is connected to the channel region at the predetermined position. The concentration of the first conductivity type impurity included in the channel stop region is set higher than that included in the channel region, thus achieving efficient diffusion of excessive carriers within the channel stop region. Also, the excessive carriers generated in the channel region can be drawn out efficiently. The field shield gate is provided on the channel stop region. A potential of the field shield gate can be set independently regardless of a potential of the gate electrode, whereby expansion of a depletion layer in the channel stop region can be suppressed even if a high voltage is applied to the gate electrode. Therefore, the excessive carriers generated in the channel region can be drawn out efficiently through the channel stop region. Thus, rising of the channel potential can be prevented effectively and a parasitic bipolar operation can be suppressed effectively.

A semiconductor device having an SOI structure according to another aspect of the present invention includes a semiconductor substrate having a main surface, an insulating layer, a semiconductor layer, a channel region, a pair of impurity diffusion regions, a channel stop region, a gate electrode, a field shield gate, an interlayer insulating layer, and an electrode. The insulating layer is formed on the main surface of the semiconductor substrate. The semiconductor layer is formed on the insulating layer. An SOI substrate is formed by the semiconductor substrate, the insulating layer, and the semiconductor layer. The channel region is formed in the semiconductor layer and includes an impurity of a first conductivity type having a first concentration. The pair of impurity diffusion regions are formed in the semiconductor layer so as to sandwich the channel region and includes an impurity of a second conductivity type. The gate electrode is formed on the channel region with the insulating layer interposed therebetween. The channel stop region is formed connected to both ends of the channel region in the semiconductor layer so as to enclose the channel region and the pair of impurity diffusion regions. Also, the channel stop region includes an impurity of the first conductivity type having a second concentration higher than the first concentration. The field shield gate is formed on the channel stop region with the insulating layer interposed therebetween. The interlayer insulating layer is formed to cover the field shield gate and the gate electrode, and includes a contact hole which penetrates through part of the field shield gate to reach a surface of the channel stop region. The electrode is formed in the contact hole and serves to draw out externally excessive carriers generated in the channel region through the channel stop region.

In the semiconductor device having the SOI structure according to another aspect of the present invention, the channel stop region is connected to both ends of the channel region, whereby the excessive carriers can be drawn out from both ends of the channel region efficiently by the same principle as the above-described one aspect of the present invention. Accordingly, the excessive carriers moved into the channel stop region are drawn out externally through the electrode. Conventionally, a region of a high concentration has not been formed between the electrode (interconnection layer 120) and channel region 140, except for a high concentration region (p+ region 139) at a contact portion between the electrode and the SOI layer. In other words, the high concentration region is not formed in a diffusion path of the excessive carriers ranging from channel region 140 to the high concentration region (p+ region 139). On the contrary, in this aspect of the present invention, the channel stop region having a high concentration is provided in the diffusion path of the excessive carriers ranging from the channel region to the electrode, so that the excessive carriers can be drawn out efficiently from the channel region.

A semiconductor device having an SOI structure according to still another aspect of the present invention includes a semiconductor substrate having a main surface, an insulating layer, a semiconductor layer, a channel region, a pair of impurity diffusion regions, a gate electrode, an isolation insulating layer, a channel stop region, and a field shield gate. The insulating layer is formed on the main surface of the semiconductor substrate. The semiconductor layer is formed on the insulating layer and includes an element isolation region and an element formation region. An SOI substrate is formed by the semiconductor substrate, the insulating layer, and the semiconductor layer. The channel region is formed within the element formation region of the semiconductor layer and includes an impurity of a first conductivity type having a first concentration. The pair of impurity diffusion regions are formed in the element formation region so as to sandwich the channel region, and includes an impurity of a second conductivity type. The gate electrode is formed on the channel region with the insulating layer interposed therebetween. The isolation insulating layer is formed selectively in the element isolation region of the semiconductor layer. The channel stop region is formed in the element isolation region excluding a region in which the isolation insulting layer is formed so as to be connected to the channel region at a predetermined position. Also, the channel stop region includes an impurity of the first conductivity type having a second concentration higher than the first concentration. The field shield gate is formed on the channel stop region with the insulting layer interposed therebetween.

In the semiconductor device having the SOI structure according to still another aspect of the present invention, the isolation insulating layer and the channel stop region are selectively formed in the element isolation region. In other words, both isolation by the isolation insulating layer and isolation by the field shield gate are utilized. This allows selective usage of isolation by the isolation insulating layer and isolation by the field shield gate as needed. More particularly, the isolation insulating layer can be used in a portion where a complete isolation by the isolation insulating layer is desired, while the field shield gate can be used for isolation in the other portions. Also, this allows formation of the channel stop region within the element formation region which is formed into a complete island shape by the isolation insulating layer to draw out excessive carriers. Thus, by selective formation of the isolation insulating layer and the channel stop region in the element isolation region, the elements can be isolated effectively from each other and the excessive carriers can be drawn out efficiently, whereby the parasitic bipolar operation can be suppressed effectively as in the case of the above-described one or another aspect of the present invention.

In a method of manufacturing a semiconductor device having an SOI structure according to one aspect of the present invention, firstly a semiconductor layer is formed on a main surface of a semiconductor substrate with an insulating layer interposed therebetween, thus forming an SOI substrate. Then, a field shield gate is formed on a predetermined region of the semiconductor layer with the insulating layer interposed therebetween. An impurity of a first conductivity type is implanted so as to penetrate through the field shield gate to reach the semiconductor layer to form a channel stop region in the semiconductor layer located under the field shield gate. Then, a MOS transistor is formed at a predetermined region on the semiconductor layer.

In a method of manufacturing a semiconductor device having an SOI structure according to another aspect of the present invention, firstly a semiconductor layer is formed on a main surface of a semiconductor substrate with an insulating layer interposed therebetween, thus forming an SOI substrate. An impurity of a first conductivity type is implanted onto the entire surface of the semiconductor layer. Then, a field shield gate is formed at a predetermined position on a surface of the semiconductor layer with the insulating layer interposed therebetween. Using the field shield gate as a mask, an impurity of a second conductivity type is implanted into the semiconductor layer to carry out channel doping of a MOS transistor, and form a channel stop region under the field shield gate. Then, the MOS transistor is formed at a predetermined region on the semiconductor layer.

In the method of manufacturing the semiconductor device having the SOI structure according to the present invention, the complex step of forming a well required in the case when the elements are formed on the bulk silicon substrate is eliminated. Further, the channel stop region is formed by using the field shield gate as a mask, or by implanting after formation of the field shield gate the impurity of the first conductivity type into the semiconductor layer so as to penetrate through the field shield gate, thus allowing formation of the channel stop region by using the same mask as used for channel implantation of the MOS transistor. Therefore, the manufacturing cost can be suppressed. In other words, the semiconductor device having the SOI structure realizing reduction of the manufacturing cost and effective suppression of the parasitic bipolar operation can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with FIGS. 1-68.
(Embodiment 1)

First, with reference to FIGS. 1-32, a first embodiment according to the present invention will be described. FIG. 1 is a cross sectional view showing a semiconductor device having an SOI structure according to the first embodiment of the present invention.

Figure 1:
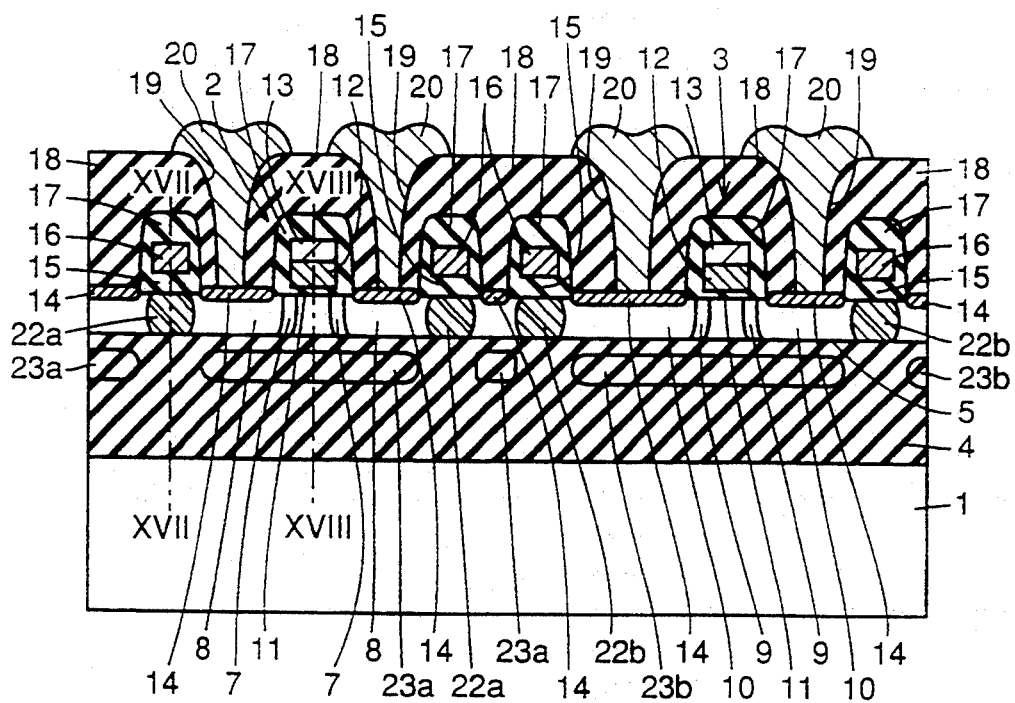
FIG. 1 is a cross sectional view showing a semiconductor device having an SOI structure according a first embodiment of the present invention.

With reference to FIG. 1, a buried oxide film 4 is formed on a main surface of a silicon substrate 1. An SOI layer (semiconductor layer) 5 is formed on buried oxide film 4. An SOI substrate is formed by silicon substrate 1, buried oxide film 4, and SOI layer 5.

An nMOS 2 and a pMOS 3 are respectively formed on SOI layer 5. nMOS 2 includes an n− diffusion region 7, an n+ diffusion region 8, and a gate electrode (transfer gate) 12. Gate electrode 12 is formed on a channel region of the nMOS with a gate oxide film 11 interposed therebetween. Also, a WSi$_2$ layer 13 is formed on gate electrode 12 for reduction of resistance.

pMOS 3 includes a p− diffusion region 9, a p+ diffusion region 10, and a gate electrode 12. Gate electrode 12 is formed of polycrystalline silicon including phosphorus (P) of $1 \times 10^{20}/cm^3$ or more.

On the surface of p+ diffusion region 10 and n+ diffusion region 8 is formed a silicide layer 14 for reducing resistance. Channel stop regions 22a and 22b are respectively formed in SOI layer 5 so as to sandwich a pair of n+ diffusion regions 8 and a pair of p+ diffusion regions 10, respectively.

A p type impurity is introduced into channel stop region 22a. A concentration of the p type impurity ($1 \times 10^{17}$–$5 \times 10^{18}/cm^3$) included in channel stop region 22a is set higher than a concentration of the p type impurity ($1 \times 10^{15}$–$1 \times 10^{16}/cm^3$) included in the channel region of the nMOS. Also, channel stop region 22a is connected to the channel region of nMOS 2 at a predetermined position, whereby excessive carriers generated in the channel region of the nMOS can be drawn out efficiently into channel stop region 22a. This can effectively suppress a parasitic bipolar operation in the nMOS.

An n type impurity is introduced into channel stop region 22b. A concentration of the n type impurity ($1 \times 10^{17}$–$5 \times 10^{18}/cm^3$) included in channel stop region 22b is set higher than a concentration of the n type impurity ($1 \times 10^{15}$–$1 \times 10^{16}/cm^3$) included in a channel region of pMOS 3, whereby the parasitic bipolar operation can be suppressed effectively as in the nMOS. Further, by increasing concentrations of channel stop regions 22a and 22b, a threshold voltage of an FS gate transistor including an FS gate 16 can be increased, thus improving a capability to provide isolation between the elements.

FS gate 16 is formed on channel stop regions 22a and 22b with FS gate oxide film 15 interposed therebetween. A silicon oxide film 17 is formed to cover FS gate 16 and gate electrode 12. An interlayer oxide film 18 is formed to cover silicon oxide film 17. A contact hole 19 is formed in a predetermined position of interlayer oxide film 18. An interconnection layer 20 is formed within contact hole 19. Preferably, interconnection layer 20 is made of a material including aluminum (Al) as a major component. It is noted that impurity implantation regions 23a and 23b are respectively formed in buried oxide film 4 during formation of channel stop regions 22a and 22b, for which a detailed description will be given later when a manufacturing process is described.

Figure 16:
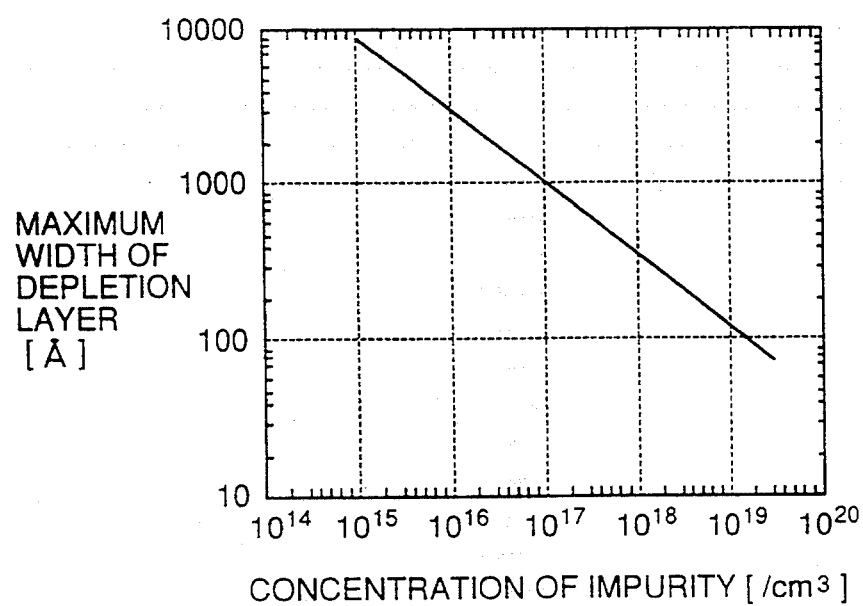
FIG. 16 is a graph showing a relationship between the maximum width of depletion layer and concentration of impurity in the SOI layer.
Figure 17:
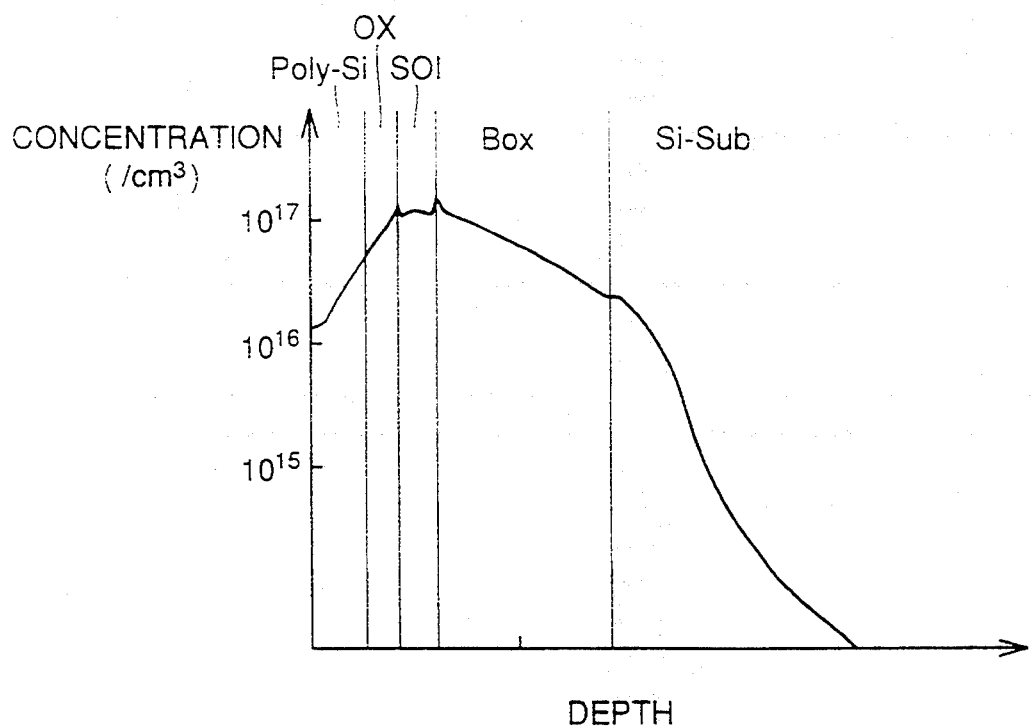
FIG. 17 is a graph showing profile of boron (B) in a cross section taken along line XVII—XVII in FIG. 1.
Figure 18:
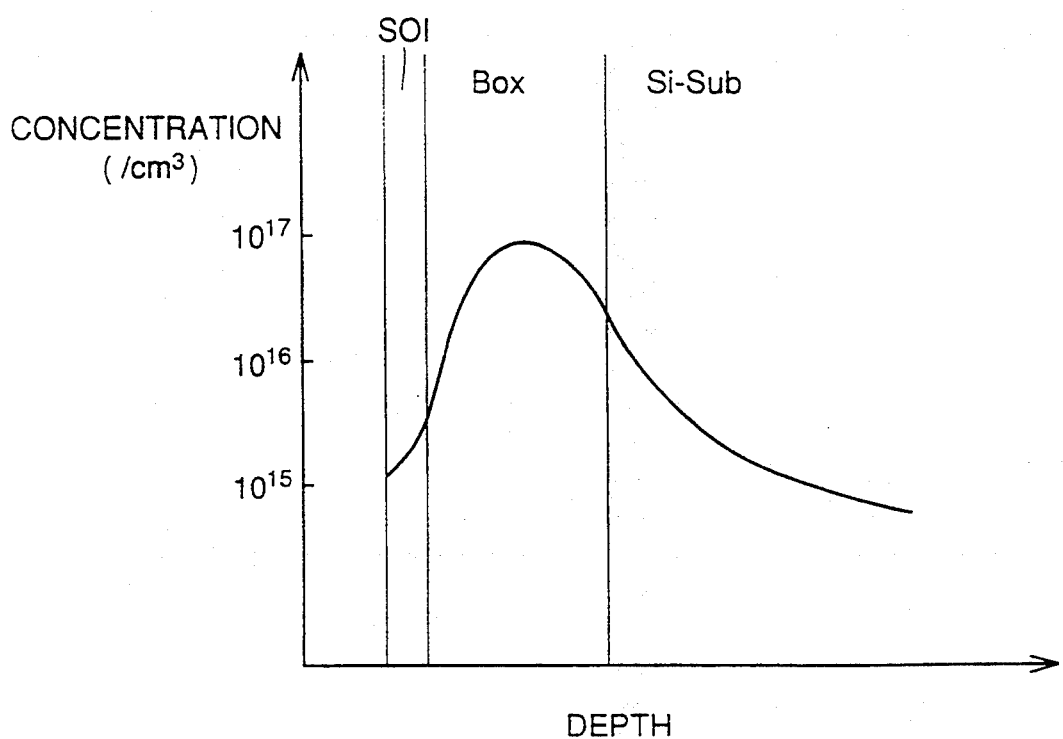
FIG. 18 is a graph showing profile of boron (B) in a cross section taken along line XVIII—XVIII in FIG. 1.

Now, a structural characteristic of this embodiment will be described in more detail by using FIGS. 15-32. With reference to FIGS. 17-24, firstly given are impurity profile along line XVII—XVII and impurity profile along line XVIII—XVIII in FIG. 1. FIG. 17 is a graph showing profile of a p type impurity (boron) along line XVII—XVII in FIG. 1. FIG. 18 is a graph showing profile of the p type impurity (boron) along line XVIII—XVIII in FIG. 1.

Figure 19:
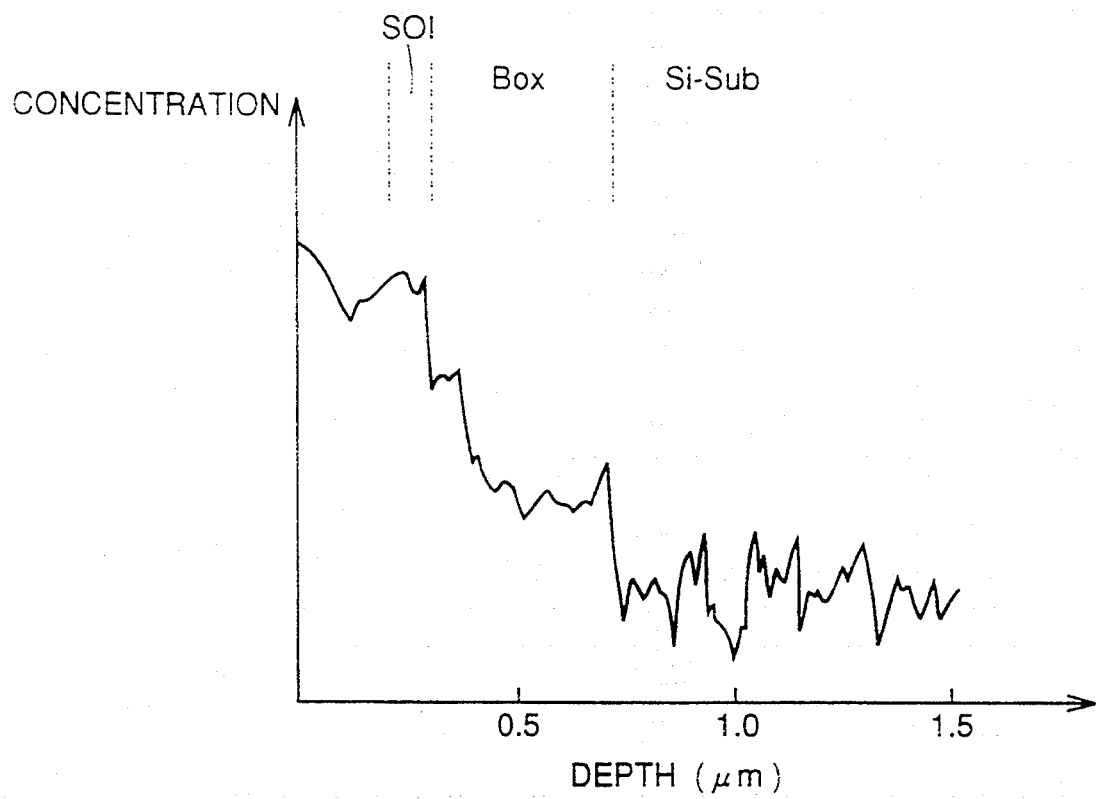
FIG. 19 is a graph showing profile of an impurity according to the SIMS analysis in a cross section taken along line XVII—XVII in FIG. 1.
Figure 20:
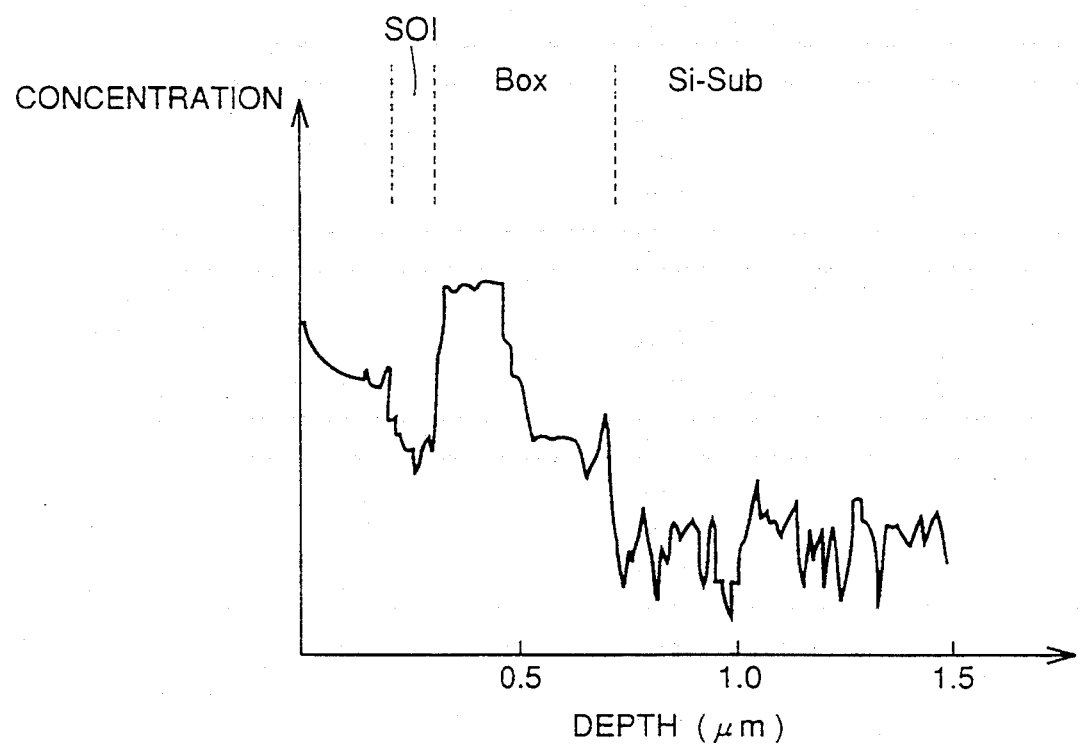
FIG. 20 is a graph showing profile of an impurity according to the SIMS analysis in a cross section taken along line XVIII—XVIII in FIG. 1.

As can be seen from FIG. 17, the p type impurity at a high concentration of about $10^{17}/cm^3$ is introduced into channel stop region 22a. On the contrary, it can be seen that the p type impurity having a concentration lower than that of the p type impurity included in channel stop region 22a is introduced into the channel region of nMOS 2. FIGS. 19 and 20 correspond respectively to FIGS. 17 and 18 to show an result of the SIMS analysis of the p type impurity (boron) profile.

Figure 23:
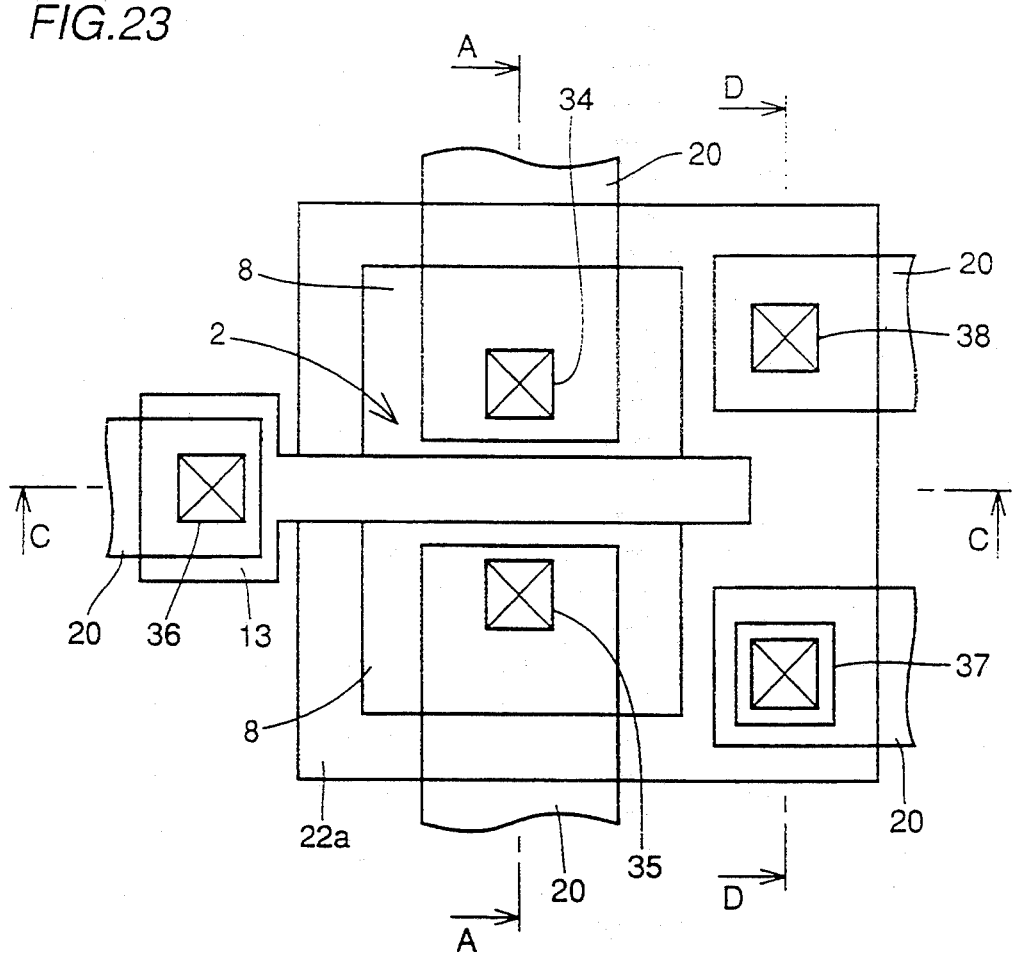
FIG. 23 is an enlarged plan view of an nMOS portion in the first embodiment of the present invention.
Figure 24:
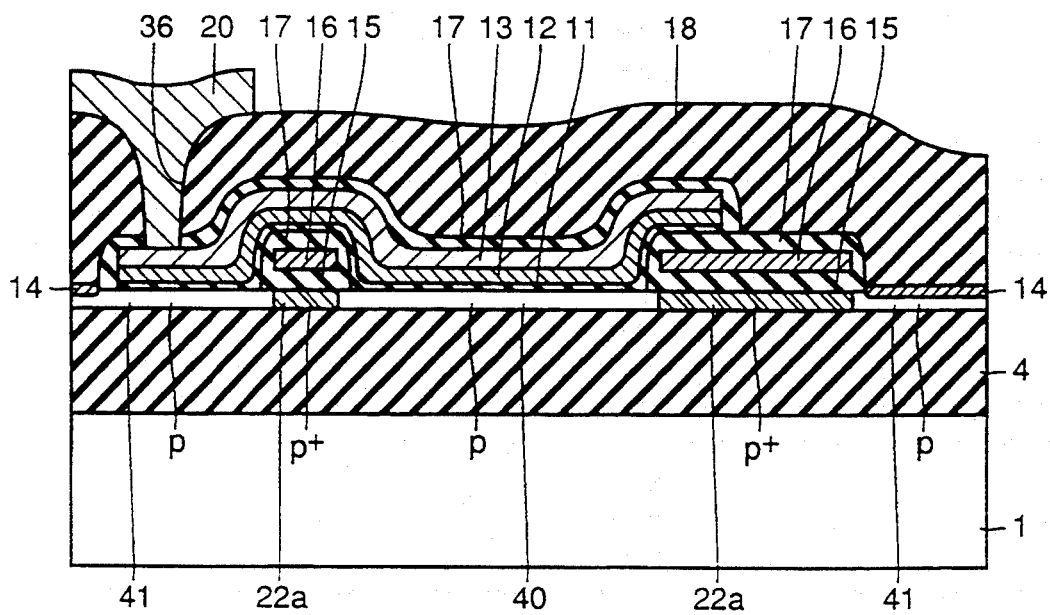
FIG. 24 is a cross sectional view taken along line C—C in FIG. 23.
Figure 25:
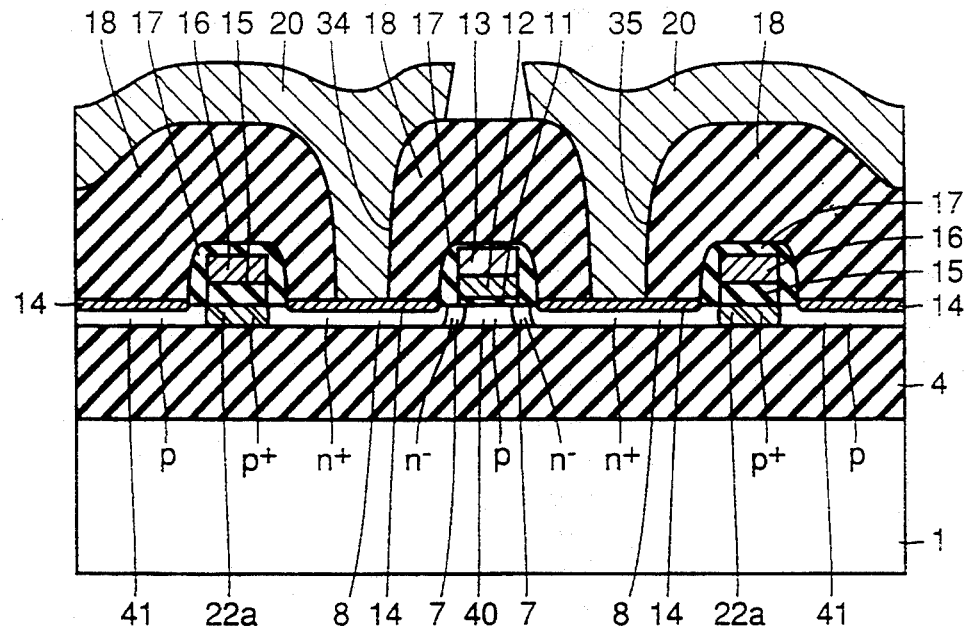
FIG. 25 is a cross sectional view taken along line A—A in FIG. 23.
Figure 26:
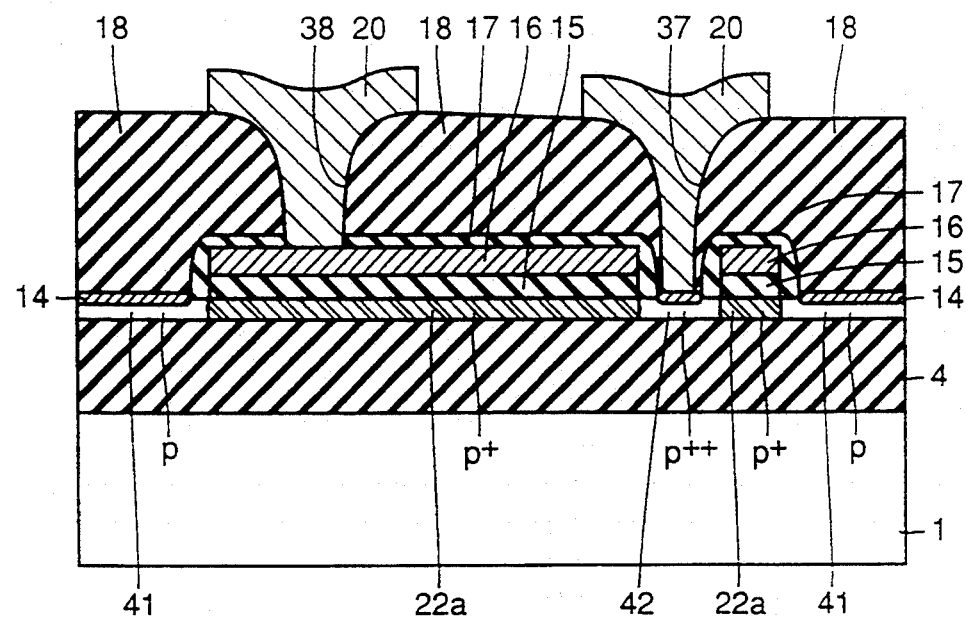
FIG. 26 is a cross sectional view taken along line D—D in FIG. 23.
Figure 27:
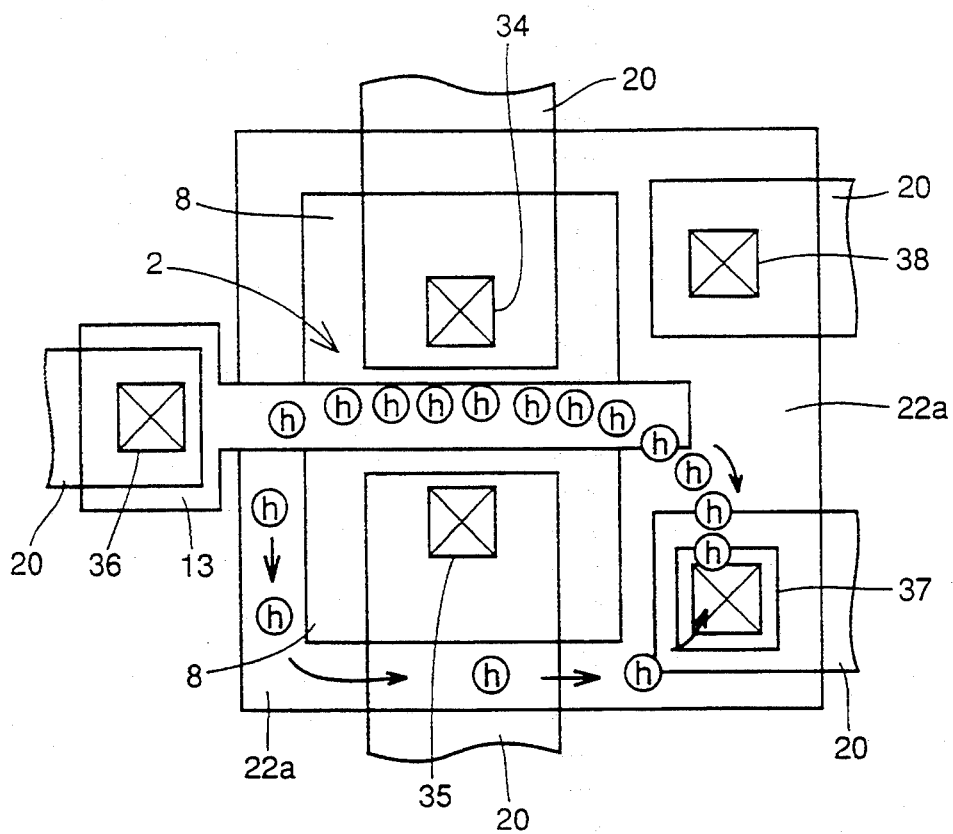
FIG. 27 is a schematic view showing how excessive carriers are drawn out from an nMOS channel region.

Next, a method to draw out excessive carriers by the semiconductor device according to this embodiment will be described with reference to FIGS. 23-27. FIG. 23 is an enlarged plan view showing the nMOS portion in FIG. 1, in which a cross section along line A—A corresponds to a cross section shown in FIG. 1. FIG. 24 is a cross section taken along line C—C in FIG. 23. FIG. 25 is a cross section taken along line A—A in FIG. 23. FIG. 26 is a cross section taken along line D—D in FIG. 23. FIG. 27 is a plan view showing movement of excessive carriers schematically.

As can be seen from FIG. 23, channel stop region 22a is formed connected to both ends of the channel region of nMOS 2 to enclose the pair of n+ diffusion regions 8. FS gate 16 is formed on channel stop region 22a. FS gate 16 is connected to interconnection layer 20 via a contact hole 38. In other words, a potential of FS gate 16 is controlled by interconnection layer 20. Channel stop region 22a is connected to interconnection layer 20 via a contact hole 37. Interconnection layer 20 serves an electrode for drawing out excessive carriers generated in the channel region of nMOS 2, while gate electrode 12 of nMOS 2 formed under WSi$_2$ layer 13 is connected to interconnection layer 20 via contact hole 36.

With reference to FIG. 24, a channel region 40 of nMOS 2 has its both ends connected to channel stop region 22a, as described above. At this time, the concentration of the p type impurity included in channel stop region 22a is set higher than that of p type impurity included in channel region 40, whereby the excessive carriers can be drawn out efficiently from both ends of channel region 40. Also, a potential FS gate 16 can be set independently from a potential of gate electrode 12, so that expansion of a depletion layer within channel stop region 22a can be suppressed even if a high potential is applied to gate electrode 12. Therefore, the excessive carriers generated by impact ionization in channel region 40 can be drawn out efficiently into channel stop region 22a. Thus, the excessive carriers can be drawn out efficiently from channel region 40.

Now, with reference to FIG. 26, the excessive carriers drawn out from channel region 40 are diffused in channel stop region 22a of the high concentration, and moved into a p type high concentration region (having concentration of $6 \times 10^{19} - 1 \times 10^{20}/cm^3$) to be drawn out externally through interconnection layer 20. At this time, diffusion of carrier is conducted efficiently, since the concentration of channel stop region 22a is set at a high concentration.

With reference to FIG. 27, an operation of drawing out the excessive carriers is briefly described. As can be seen from FIG. 27, an excessive carrier h generated in the channel region of nMOS 2 is moved from both ends of the channel region of nMOS 2 into channel stop region 22a. Then, these excessive carriers are diffused within channel stop region 22a to reach a p type high concentration region 42 located under contact hole 37. Accordingly, the excessive carriers collected within p type high concentration region 42 are drawn out externally through interconnection layer 20 formed in contact hole 37.

Thus, since the excessive carriers are drawn out efficiently from the channel region of transistor, rising of a channel potential of the transistor can be prevented effectively, whereby the parasitic bipolar operation can be suppressed effectively.

Figure 21:
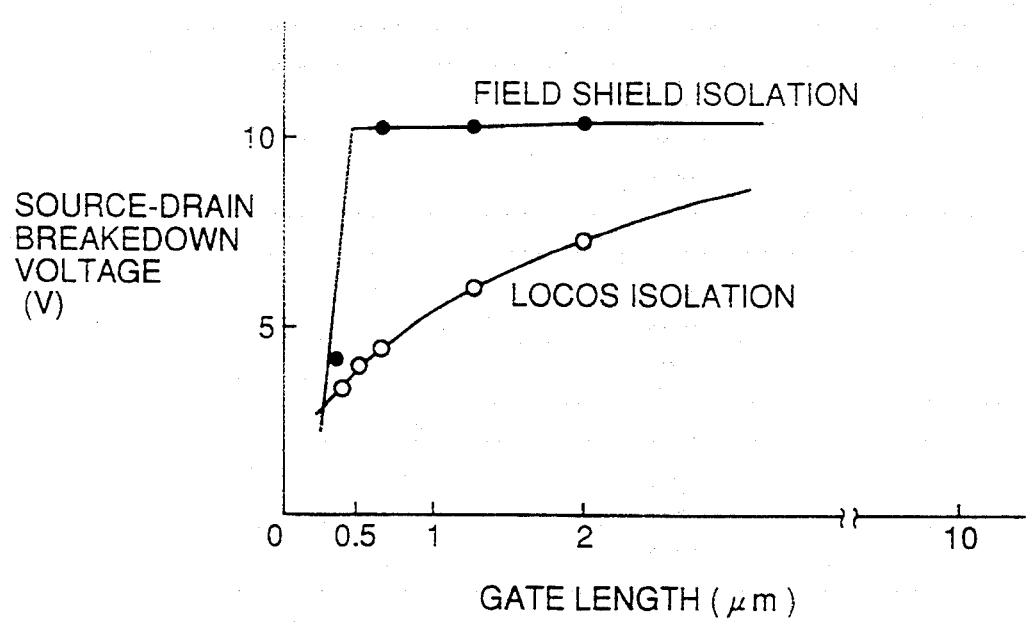
FIG. 21 is a graph showing gate length dependency of a source-drain breakdown voltage plotted respectively for field shield isolation and LOCOS isolation.

FIG. 21 is a graph showing gate length dependency of a source-drain breakdown voltage when field shield isolation using FS gate 16 is carried out and when LOCOS isolation using isolation oxide film 132 is carried out in the semiconductor device having the SOI structure. As can be seen from FIG. 21, since the excessive carriers are drawn out efficiently from the channel region of transistor in the case of field shield isolation, the excessive carriers are not stored in the channel region. Therefore, rising of the channel potential and the parasitic bipolar operation can be suppressed effectively, whereby the source-drain breakdown voltage can remain at 10 V or more almost until the punch through limit length.

Figure 22:
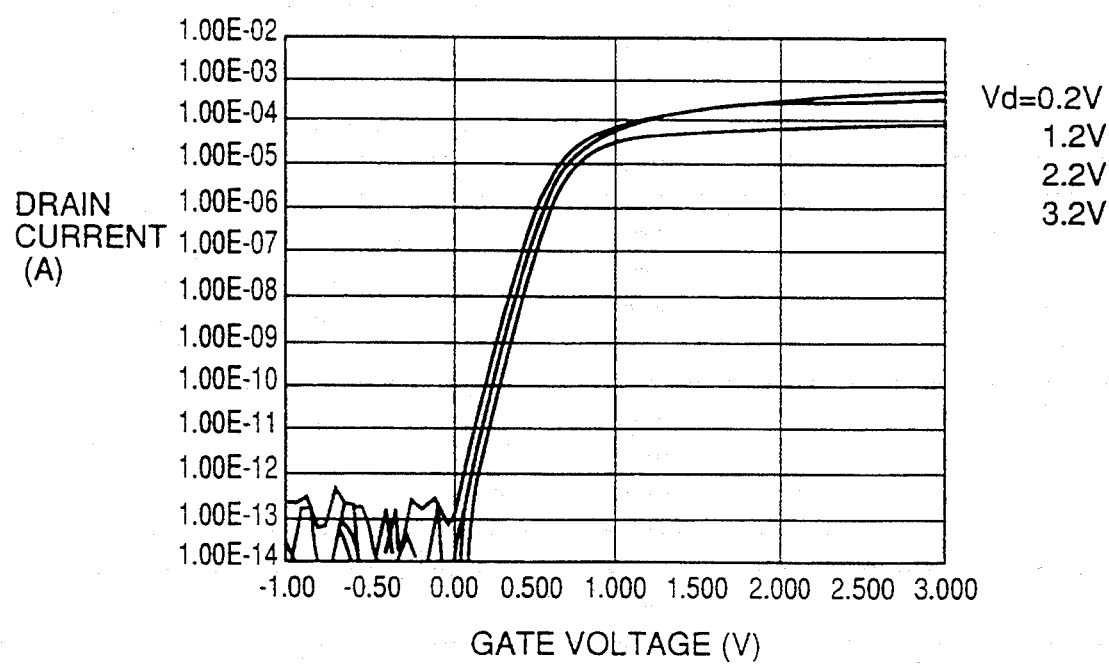
FIG. 22 is a graph showing characteristics of a MOS transistor according to the first embodiment of the present invention.

With reference to FIG. 22, a characteristic of a transistor in which field shield isolation is provided will be described. FIG. 22 is a graph showing a characteristic of the transistor in which field shield isolation is provided, wherein a drain current is plotted against a gate voltage. Note that Vd indicates a drain voltage. As can be seen from FIG. 22, an electrical characteristic obtained in the transistor in which field shield isolation is provided is ideal.

Figure 15:
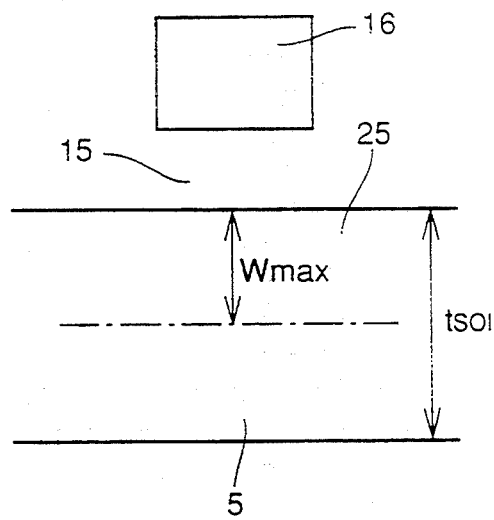
FIG. 15 is a schematic view showing expansion of a depletion layer in the SOI layer under an FS gate.

Now, with reference to FIGS. 15 and 16, a characteristic part of this embodiment will be described. FIG. 15 is a schematic view showing expansion of a depletion layer 25 within channel stop region 22a. As can be seen from FIG. 15, a thickness $t_{SOI}$ of SOI layer 5 is preferably set greater than the maximum width (the maximum width of depletion layer) Wmax of expanded depletion layer 25 in a direction of depth. More preferably, thickness $t_{SOI}$ of SOI layer 5 is about twice Wmax. Thus, the excessive carriers can be diffused efficiently through a region under depletion layer 25.

The maximum width of depletion layer Wmax is determined depending on a concentration of a region in SOI layer 5 wherein depletion layer 25 is formed. The relationship between the maximum width of depletion layer Wmax and the concentration of SOI layer 5 is shown in FIG. 16. By determining a concentration of SOI layer 5 in accordance with the relationship shown in FIG. 16, SOI layer 5 can be prevented from being completely depleted, whereby the excessive carriers can be diffused efficiently.

A relationship has been proposed by S. M. Sze for the above-described maximum width of depletion layer Wmax as below:

$$W_{max} \simeq \sqrt{\frac{2\epsilon_s \psi_s(inv)}{qN_A}} = \sqrt{\frac{4\epsilon_s kT \ln(N_A/ni)}{q^2 N_A}} \quad (1)$$

In the above expression (1), $\epsilon_S$ indicates a dielectric constant of silicon, $\psi_S(inv)$ indicates a surface potential at the beginning a strong inversion, $N_A$ indicates a concentration of an acceptor, k indicates Boltzmann's constant, T indicates an absolute temperature, ni indicates a density of holes (electrons) in a vacuum semiconductor, and q indicates charge. The above expression (1) can be found in *Physics of Semiconductor Devices* (by S. M. Sze). By setting a thickness of SOI layer 5 at value greater than Wmax in expression (1), the excessive carriers can be efficiently diffused in SOI layer 5, as described above. Thus, the parasitic bipolar operation can be suppressed effectively.

Next, with reference to FIGS. 2–14, a method of manufacturing the semiconductor device having the SOI structure shown in FIG. 1 will be described. FIGS. 2–14 are cross sectional views showing first through thirteenth steps of a manufacturing process of the semiconductor device having the SOI structure according to this embodiment.

Figure 2:
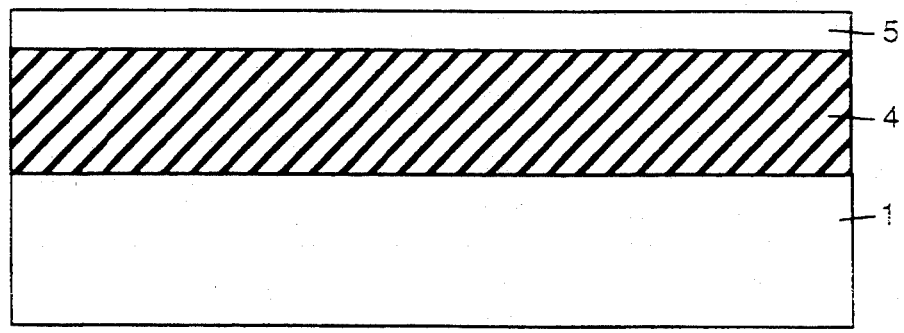
FIGS. 2–14 are cross sectional views showing first through thirteenth steps of a manufacturing process of the semiconductor device having the SOI structure shown in FIG. 1.

As can be seen from FIG. 2, by the same method as in the conventional example, a buried oxide film 4 is formed on a main surface of a silicon substrate 1, and an SOI layer 5 is formed on buried oxide film 4, whereby an SOI substrate is formed.

Figure 3:
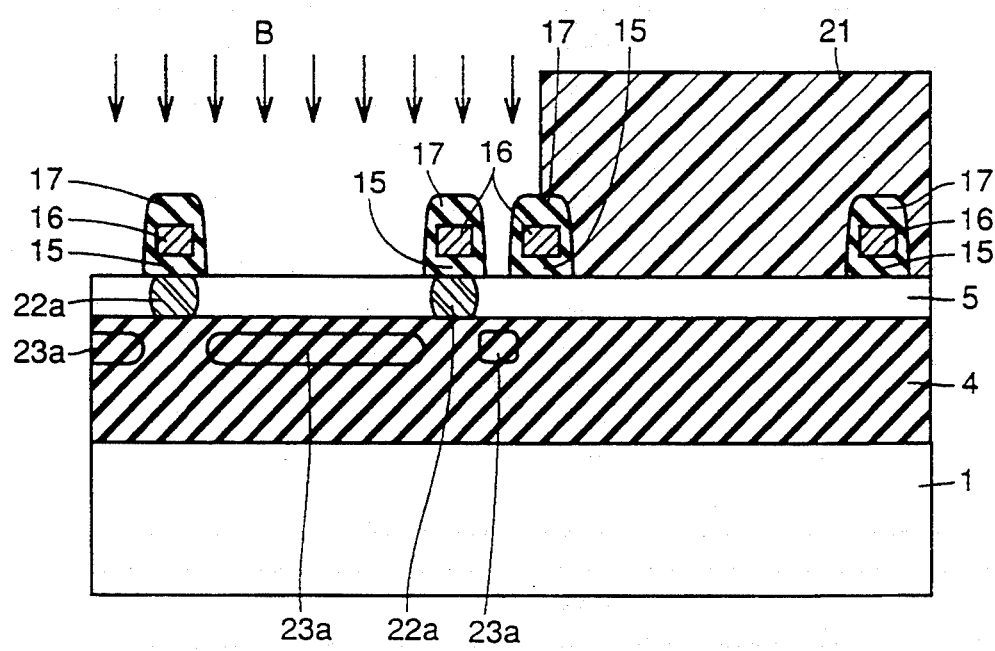

With reference to FIG. 3, an FS gate oxide film 15 is formed at a temperature of about 800° C. to have a thickness of about 500 Å by CVD. A polycrystalline silicon layer 16 including at least $1 \times 10^{20}/cm^3$ of phosphorus (P) is formed to have a thickness of about 1000 Å on FS gate oxide film 15. A silicon oxide film is formed on polycrystalline silicon layer 16 to have a thickness of about 1000 Å by CVD. Then, the silicon oxide film, polycrystalline silicon layer 16, FS gate oxide film 15 are successively patterned into predetermined shapes. A silicon oxide film is formed on the entire surface of SOI layer 5 to have a thickness of about 2000 Å by CVD. This silicon oxide film is subjected to dry etching with an etching condition for a strong anisotropic characteristic, whereby a silicon oxide film 17 covering field shield gate 16 is formed.

A resist pattern 21 is formed on SOI layer 5 so as to cover only a pMOS formation region. Using resist pattern 21 as a mask, boron (B) ions are implanted into SOI layer 5 with such an energy as to penetrate through FS gate 16 to reach within SOI layer 5 located under FS gate 16. At this time, boron (B) is implanted at 190 keV for $1-3 \times 10^{13}/cm^2$. By implanting boron (B) with such an energy, a channel stop region 22a is formed in SOI layer 5 located under FS gate 16, and at the same time an impurity implantation region 23a is formed in buried oxide film 4.

As is well known, many crystal defects caused by implantation damage are provided in the vicinity of a peak position of impurity concentration. In this case, a peak concentration of boron (B) is not included in SOI layer 5 in which the nMOS is formed. Therefore, no defect is formed by implantation of boron (B) in the nMOS formation region, whereby the nMOS of high performance can be formed.

Figure 4:
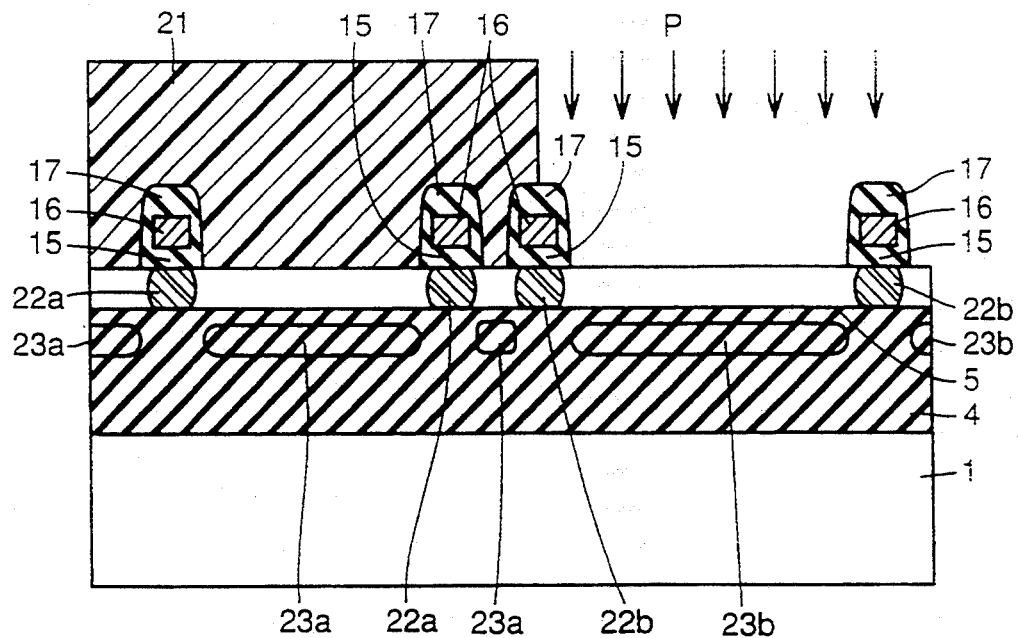

With reference to FIG. 4, resist pattern 21 is formed to cover only an nMOS formation region. Using resist pattern as a mask, phosphorus (P) is implanted into SOI layer 5 located under FS gate 16 at 190 keV for $1-3 \times 10^{13}/cm^2$. By thus implanting phosphorus (P), phosphorus penetrates through FS gate 16, so that a channel stop region 22b is formed in SOI layer 5 located under FS gate 16, and at the same time an impurity implantation region 23b is formed in buried oxide film 4. As in the above case, crystal defects are unlikely to be generated within SOI layer 5 in the pMOS formation region.

Figure 5:
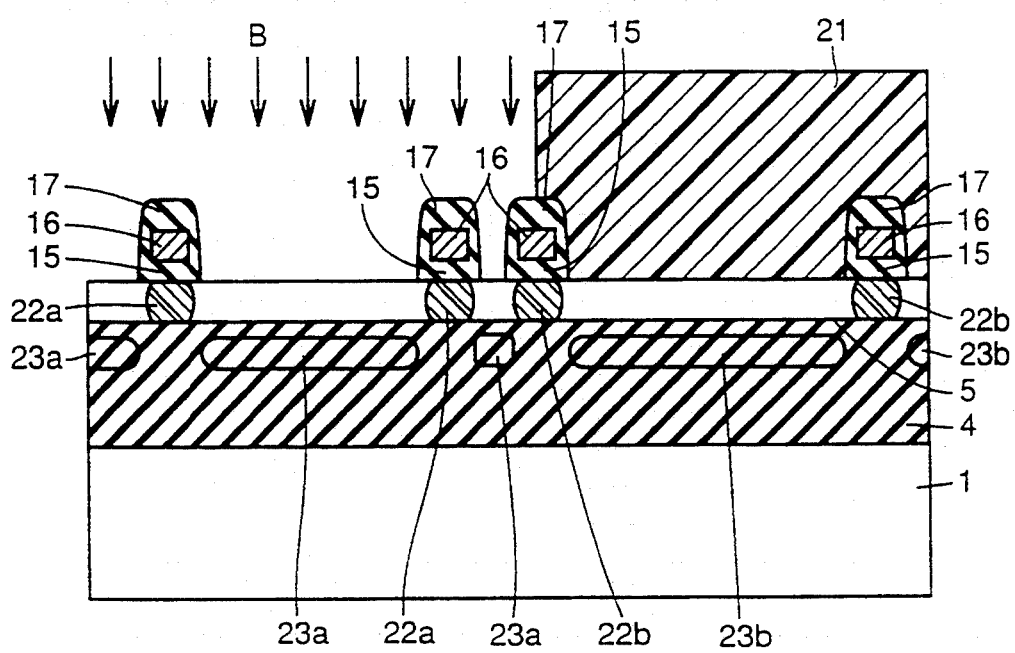

With reference to FIG. 5, resist pattern 21 is formed again to cover the pMOS formation region. Using resist pattern 21 and FS gate 16 as a mask, boron (B) ions are implanted into SOI layer 5 at 20 keV for $3-5 \times 10^{12}/cm^2$. This implantation serves as channel-dope ion implantation of the nMOS. Then, resist pattern 21 is removed.

Figure 6:
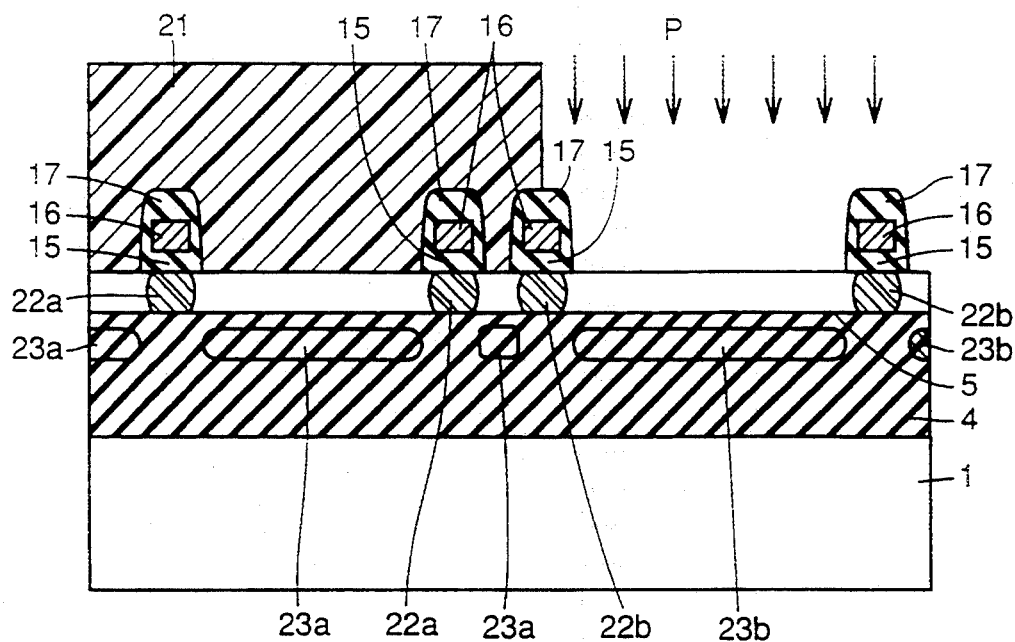

With reference to FIG. 6, resist pattern 21 is again formed to cover only the nMOS formation region. Using resist pattern 21 and FS gate 16 as a mask, phosphorus (P) is implanted into SOI layer 5 at 20 keV for $3-5 \times 10^{11}/cm^2$. This implantation serves as channel-dope ion implantation of the pMOS. Then, resist pattern 21 is removed.

As described above, the same mask as used for channel dope ion implantation of nMOS and pMOS can be used for formation of channel stop regions 22a and 22b. Therefore, a new mask is not required, thus achieving reduction of the manufacturing cost.

Figure 7:
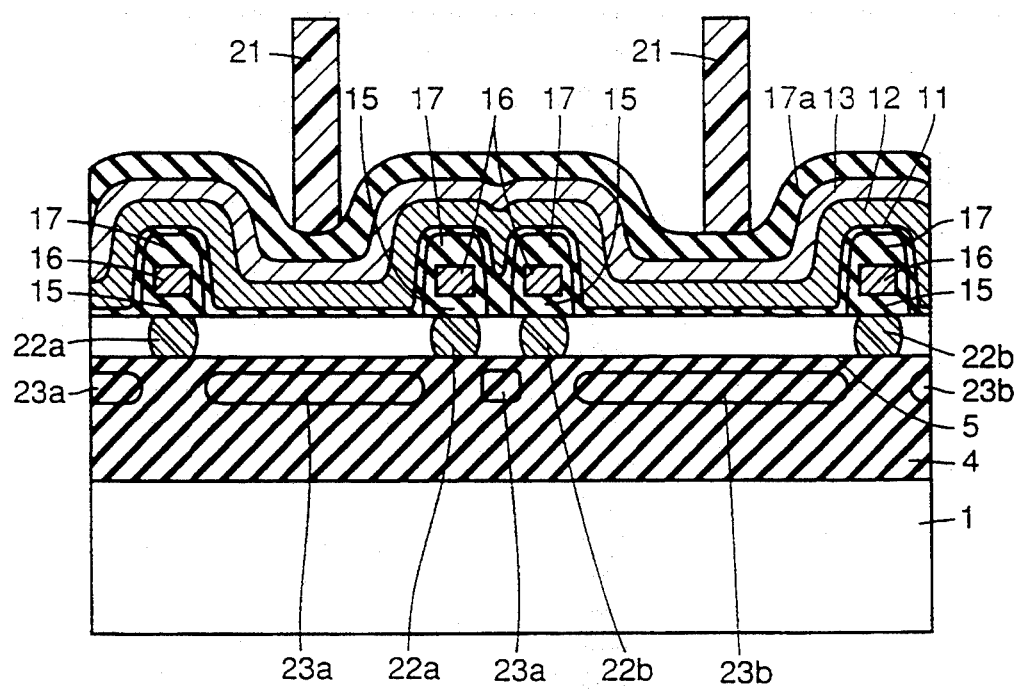

With reference to FIG. 7, by the same method as in the conventional example, a gate oxide film 11 is formed to have a thickness of about 60–100 Å after a foreign object or natural oxide film on the surface of nMOS and pMOS channel regions. Gate oxide film 11 is formed by oxidizing SOI layer 5 in a wet ambience or a dry ambience at a temperature within the range of 800° C.–950° C.

Gate oxide film 11 may be formed by a stacked structure wherein an oxide film having a thickness of about 50 Å is formed by LPCVD (Low Pressure Chemical Vapor Deposition) or the like on a thermal oxidation film formed by the above-described steps to have a thickness of 10–50 Å. Also, gate oxide film 11 may be formed by a structure ($SiO_2/SiNO/SiO_2$) obtained by a nitride oxide film nitrided in a nitrogen ambience being sandwiched by thermal oxidation films. Further, nitrogen may be implanted after formation of gate oxide film 11 through the above steps for improving reliability.

On thus formed gate oxide film 11 is formed polycrystalline silicon or amorphous silicon including phosphorus (P) at a high concentration at a temperature of about 500° C.–600° C. $WSi_2$ layer 13 is formed to have a thickness of about 1000 Å by sputtering on such polycrystalline silicon or amorphous silicon. A silicon oxide film 17a is formed to have a thickness of about 1000 Å on $WSi_2$ layer 13. Then, resist patterned 21 patterned into a predetermined shape is deposited in silicon oxide film 17a.

Figure 8:
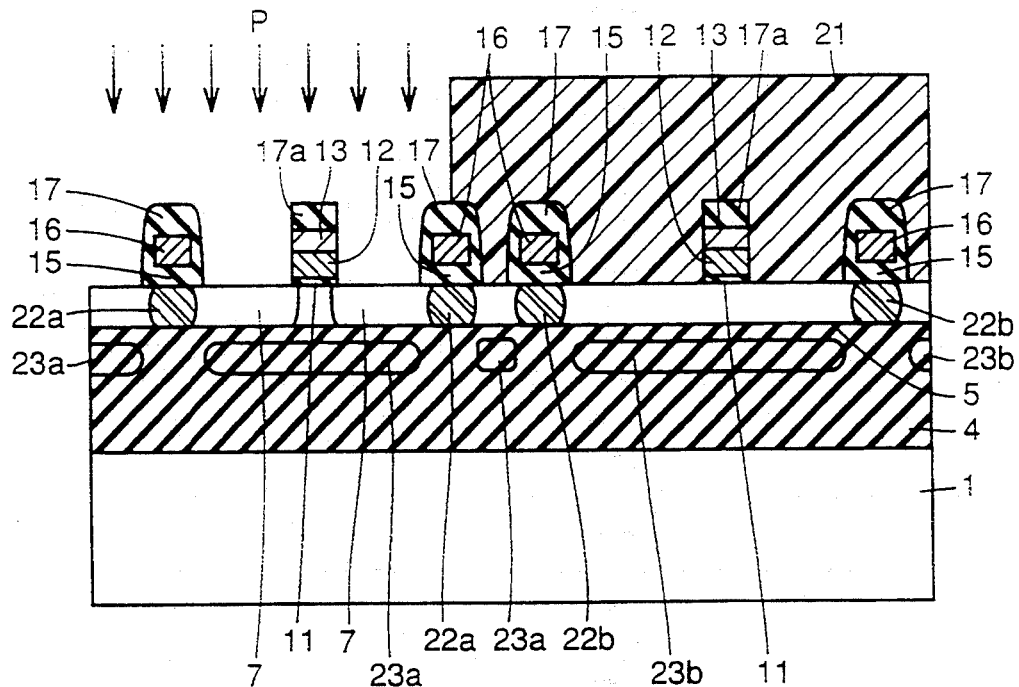

With reference to FIG. 8, using resist pattern 21 as a mask, silicon oxide film 17a is patterned. Then, resist pattern 21 is removed. Using silicon oxide film 17a as a mask, $WSi_2$ layer 13, polycrystalline silicon layer 12, and gate oxide film 11 are successively patterned, whereby gate electrode 12 is formed. Resist pattern 21 is formed to cover only the pMOS formation region. Using resist pattern 21, gate electrode 12, and FS gate 16 as a mask, phosphorus (P) is implanted into SOI layer 5 at 40 keV for $1-2 \times 10^{13}/cm^2$, whereby an n− diffusion region 7 is formed. Then, resist pattern 21 is removed.

Figure 9:
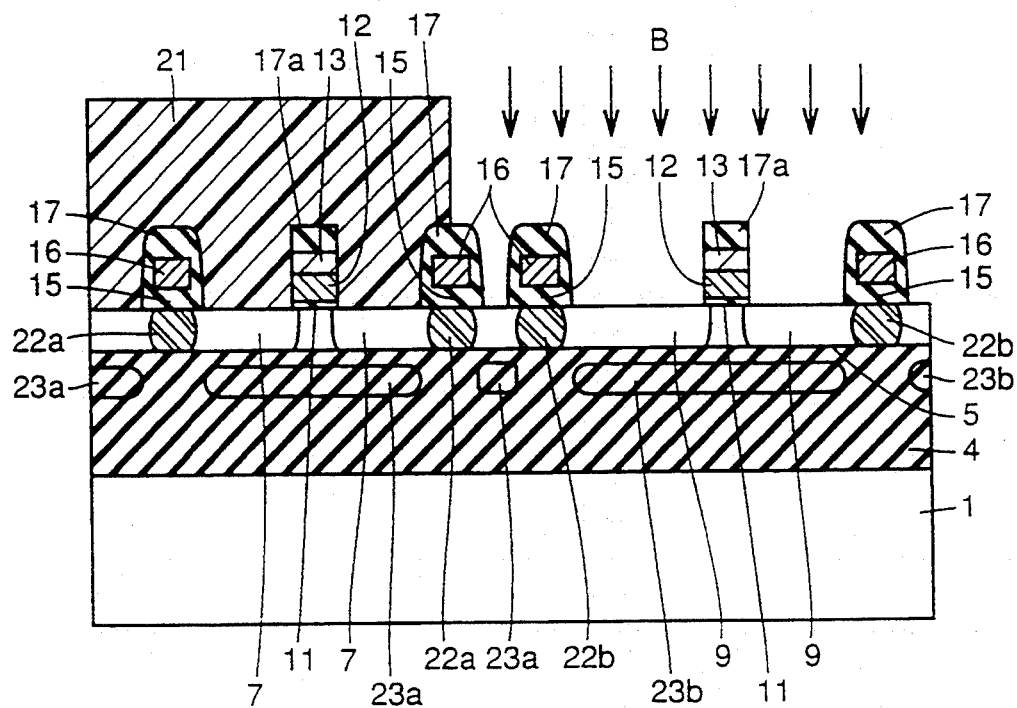

With reference to FIG. 9, resist pattern 21 is formed to cover only the nMOS formation region. Using resist pattern 21, gate electrode 12 and FS gate 16 as a mask, boron (B) is implanted into SOI layer 5 at 20 keV for $1-3 \times 10^{11}/cm^2$, whereby a p− diffusion region 9 is formed. Then, resist pattern 21 is removed.

Figure 10:
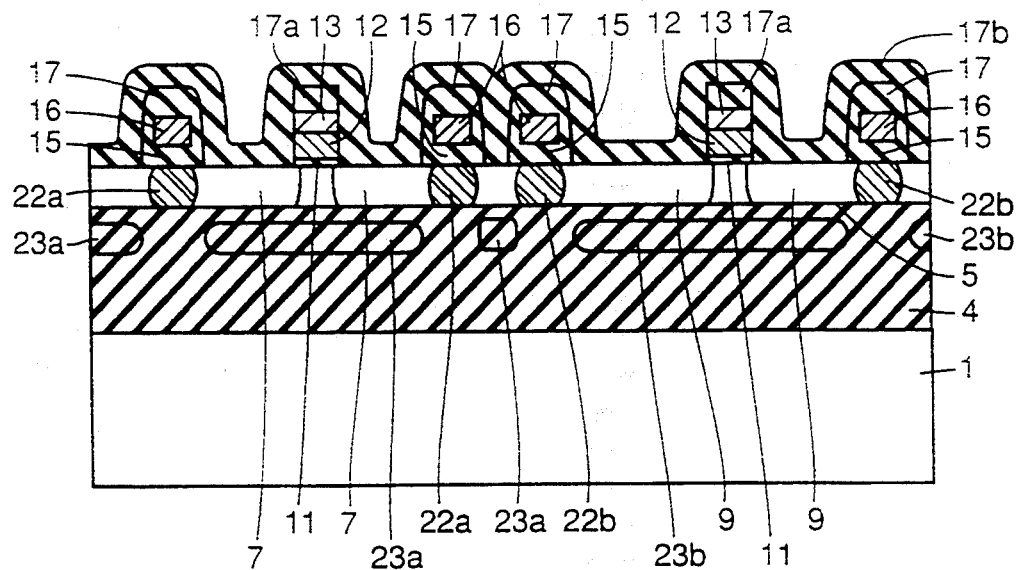
Figure 11:
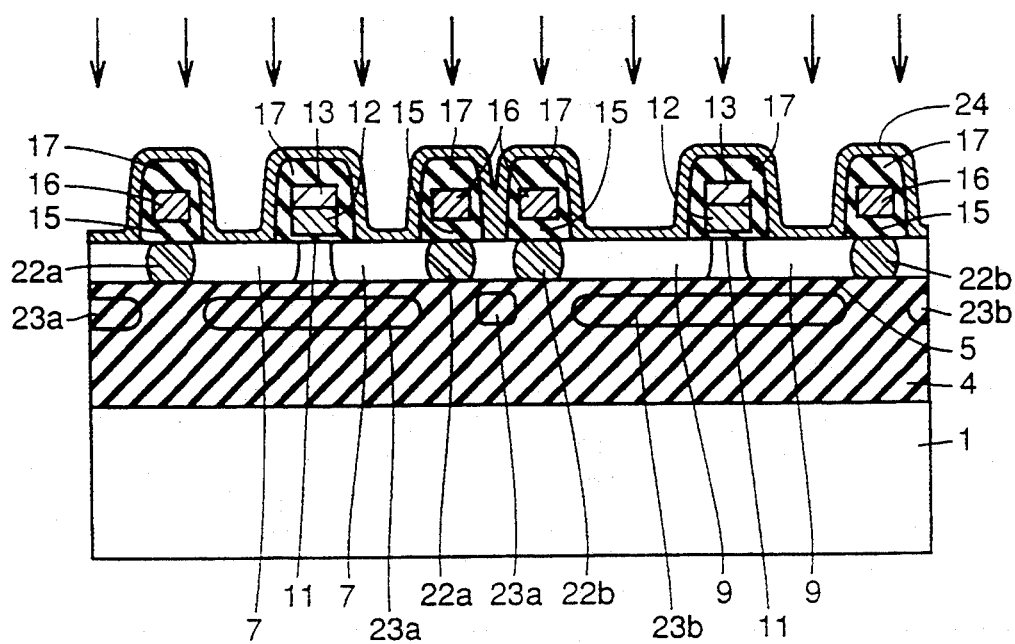

With reference to FIG. 10, a silicon oxide film 17b is formed to have a thickness of about 1000–2000 Å by CVD. Silicon oxide film 17b is subjected to etching in an ambient of gas having a strong anisotropic characteristic, whereby a silicon oxide film 17 covering FS gate 16 is formed. A Ti layer 24 is formed to have a thickness of about 200–350 Å by sputtering. At this time, sputtering is carried out prior to formation of Ti layer 24 for removing a natural oxide film or foreign object on the surface of the SOI layer. Then, silicon ions are implanted into Ti layer 24 at 30–100 keV for $4 \times 10^{15}-5 \times 10^{15}/cm^2$. Ti layer 24 is subjected to heat treatment, whereby a silicide layer (titanium silicide layer) 14 is formed on the surface of an n+ diffusion region and a p+ diffusion region 8 and 10. At this time, silicidation takes place uniformly thanks to implantation of silicon ions.

Figure 12:
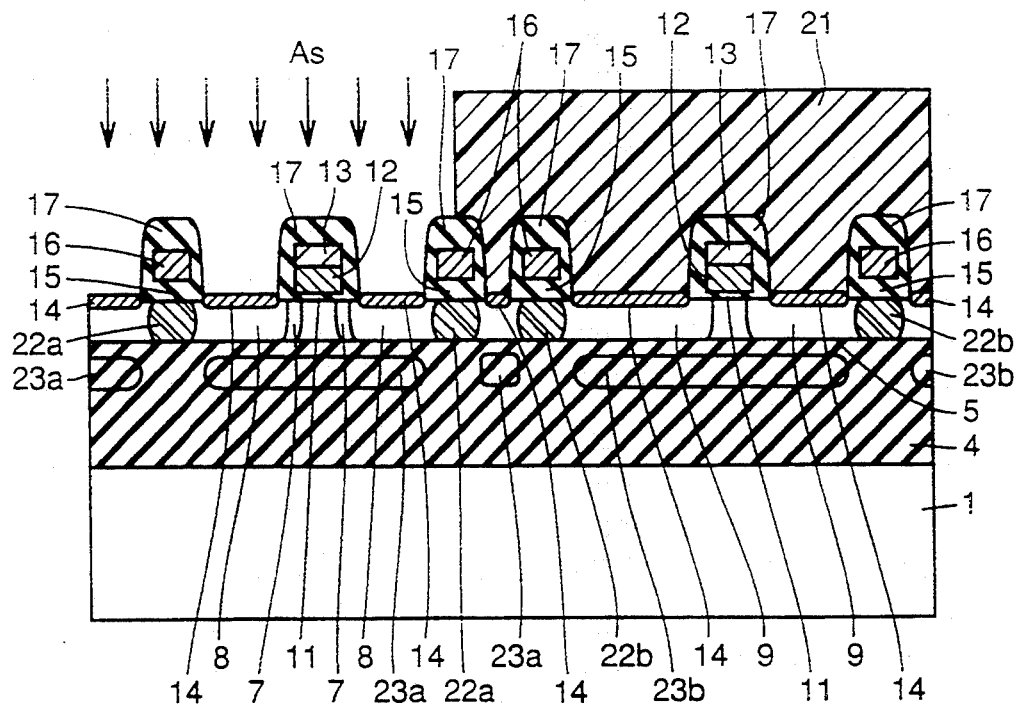

With reference to FIG. 12, resist pattern 21 is formed to cover only the pMOS formation region. Using resist pattern 21, FS gate 16 and gate electrode 12 as a mask, arsenic (As) is implanted into SOI layer 5 at 50 keV for $4-6 \times 10^{15}/cm^2$ whereby n+ diffusion region 8 is formed Then, resist pattern 21 is removed.

Figure 13:
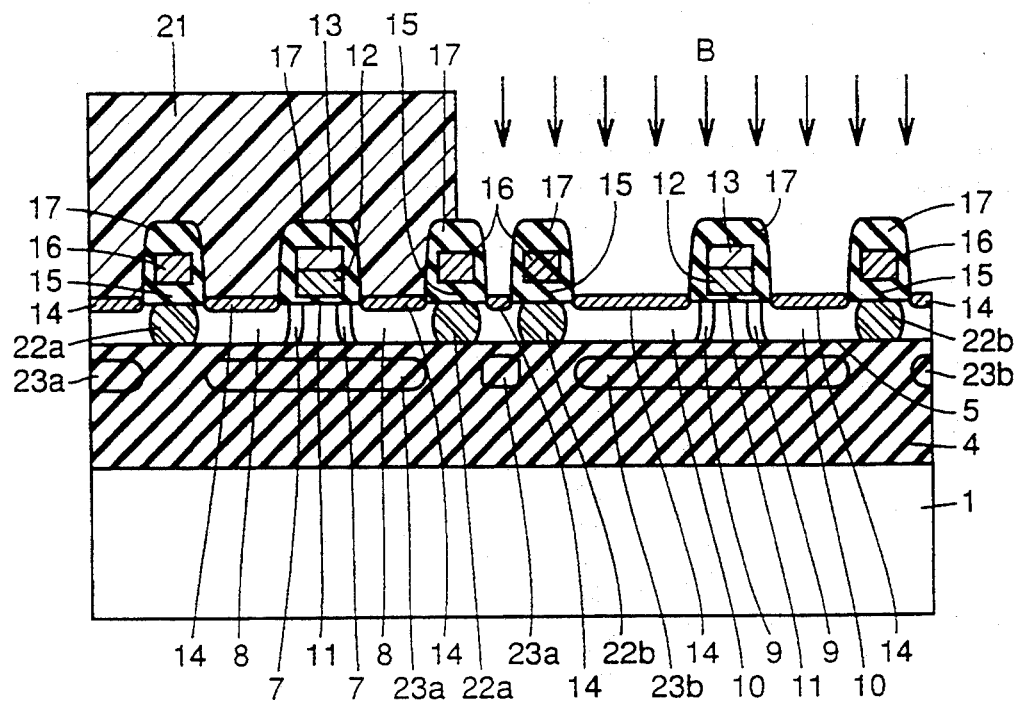

With reference to FIG. 13, resist pattern 21 is formed to cover only the nMOS formation region. Using resist pattern 21, FS gate 16 and gate electrode 12 as a mask, boron (B) is implanted into SOI layer 5 at 20 keV for $4-6 \times 10^{15}/cm^2$, whereby p+ diffusion region 10 is formed. Then, resist pattern 21 is removed.

Figure 14:
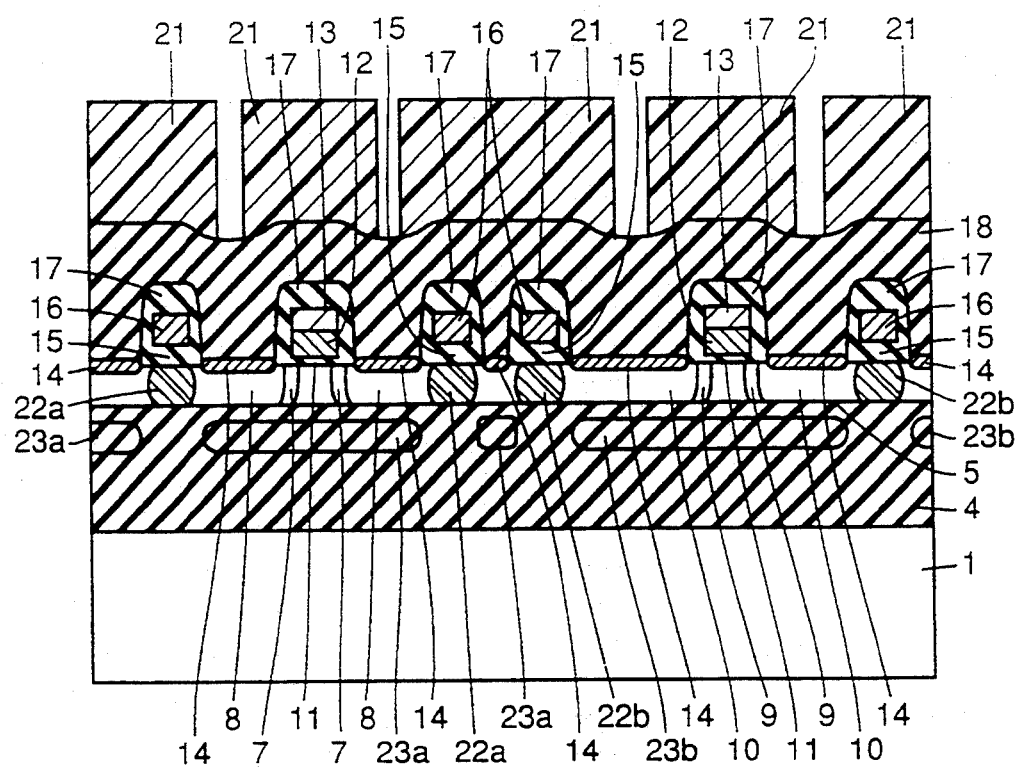

With reference to FIG. 14, an interlayer oxide film 18 is formed to have a thickness of about 5000–10000 Å on the entire surface of SOI layer 5 by CVD or the like. Resist pattern 21 patterned into a predetermined shape is formed on interlayer oxide film 18. Using resist pattern 21 as a mask, interlayer oxide film 18 is etched to form a contact hole 19. Then, an interconnection layer 20 is formed in contact hole 19 by the same method as in the conventional example. Through these steps, the semiconductor device having the SOI structure shown in FIG. 1 is formed.

It is noted that $BF_2$ may be used instead of boron (B) ions. Also, ions of indium (In), antimony (Sb) nitrogen, silicon, oxygen or the like can be implanted simultaneously with source/drain implantation of nMOS or pMOS.

Now, with reference to FIGS. 28–32, the film thickness $t_{FS}$ of FS gate will be described in more detail. It is noted that the film thickness $t_{FS}$ of FS gate represents the sum of thicknesses of FS gate 16, gate oxide film 15, and silicon oxide film 17 located on FS gate 16.

Figure 28:
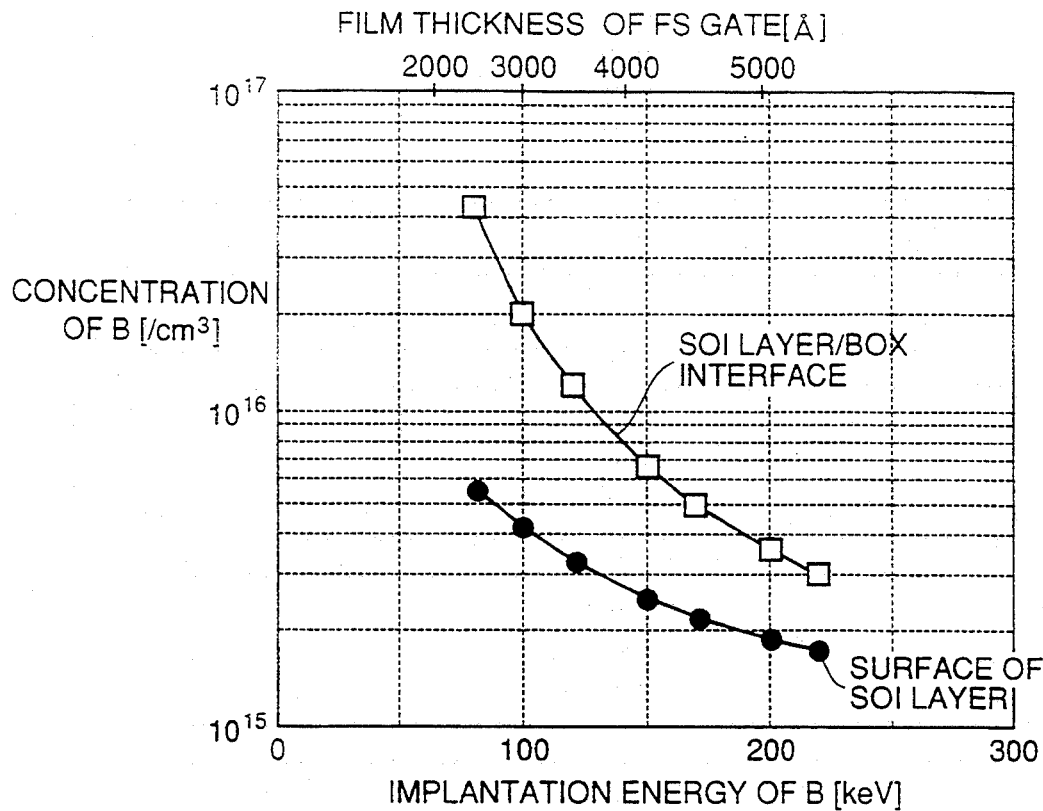
FIG. 28 is a graph showing a relationship between concentration of B, implantation energy of B, and film thickness of FS gate.
Figure 29:
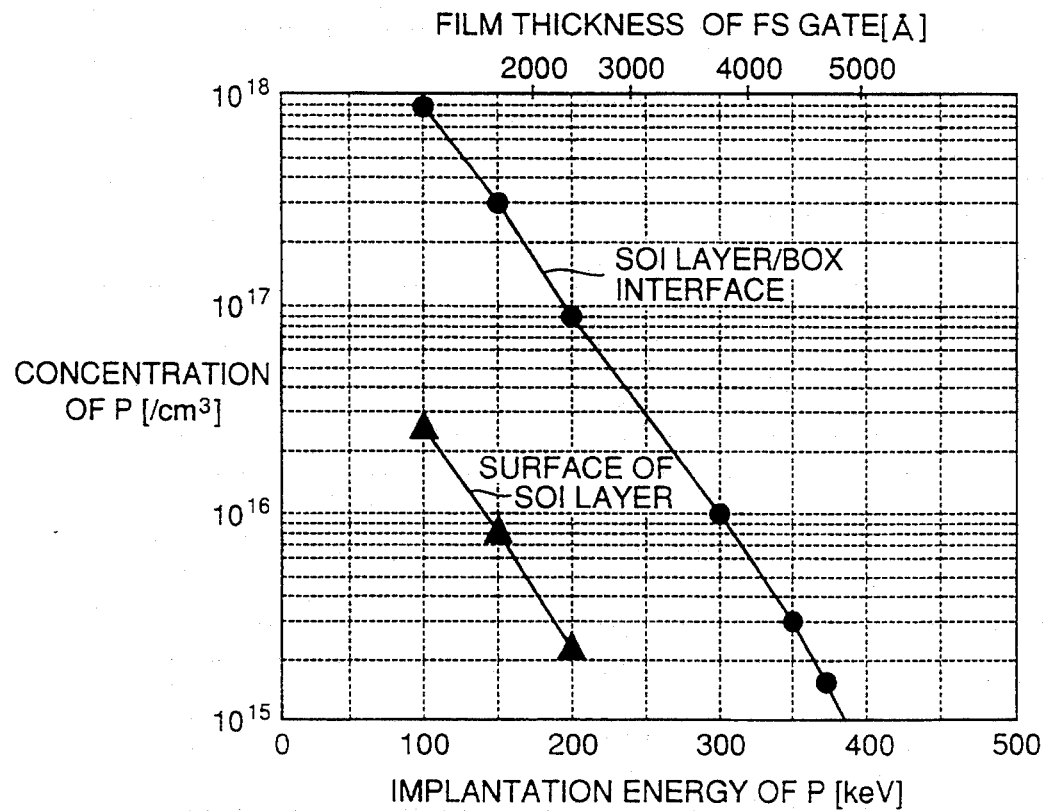
FIG. 29 is a graph showing a relationship between concentration of P, implantation energy of P, and film thickness of FS gate.

FIG. 28 is a graph showing a relationship of implantation energy of boron (B), concentration of boron (B) implanted into SOI layer 5 located under FS gate 16, and film thickness $t_{FS}$ of FS gate. FIG. 29 is a graph showing a relationship between implantation energy of phosphorus (P), concentration of phosphorus (P) implanted into SOI layer 5 located under FS gate 16, and film thickness $t_{FS}$ of FS gate. It is noted that concentrations of boron or phosphorus on the surface of SOI layer 5 and concentrations of boron or phosphorus at an interface between SOI layer 5 and buried oxide film (Box) 4 are plotted in FIGS. 28 and 29.

As can be seen from FIGS. 28 and 29, as the implantation energy of boron (B) and phosphorus (P) increases, concentrations of these materials left in SOI layer 5 are reduced. Since a concentration of impurity included in channel stop regions 22a and 22b should be at a predetermined value or more, the film thickness $t_{FS}$ of FS gate and the implantation energy of impurity have to be selected appropriately.

Figure 31:
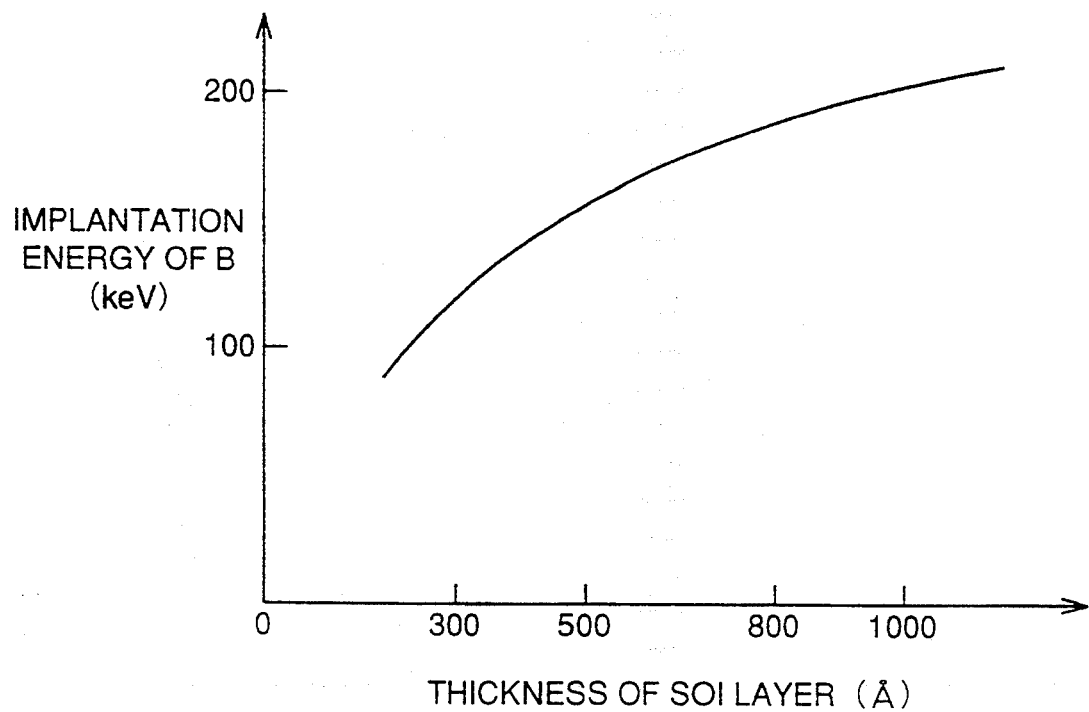
FIG. 31 is a graph showing a relationship between implantation energy of B and thickness of the SOI layer.

FIG. 31 is a graph showing the implantation energy of boron (B) with respect to thicknesses of SOI layer 5. It is noted that the implantation energy of boron (B) shown in FIG. 31 is the minimum energy required for preventing unnecessary increase of concentration of boron (B) within SOI layer 5 in the MOS transistor formation region. As can be seen from FIG. 31, assuming, for example, a thickness of SOI layer 5 is 300 Å, a high energy such as 120 keV is necessary as the implantation energy of boron (B).

In the meanwhile, the film thickness $t_{FS}$ Of FS gate has to be thinned in order to improve flatness of the device or increase a margin when patterning gate electrode 12. Accordingly, the implantation energy of impurity for formation of channel stop regions 22a and 22b has to be lowered. However, there is concern over increase of the concentration of impurity left in SOI layer 5 other than channel stop regions 22a and 22b because of reduction of the implantation energy of impurity. Besides, the pMOS or nMOS might be adversely affected.

Figure 30:
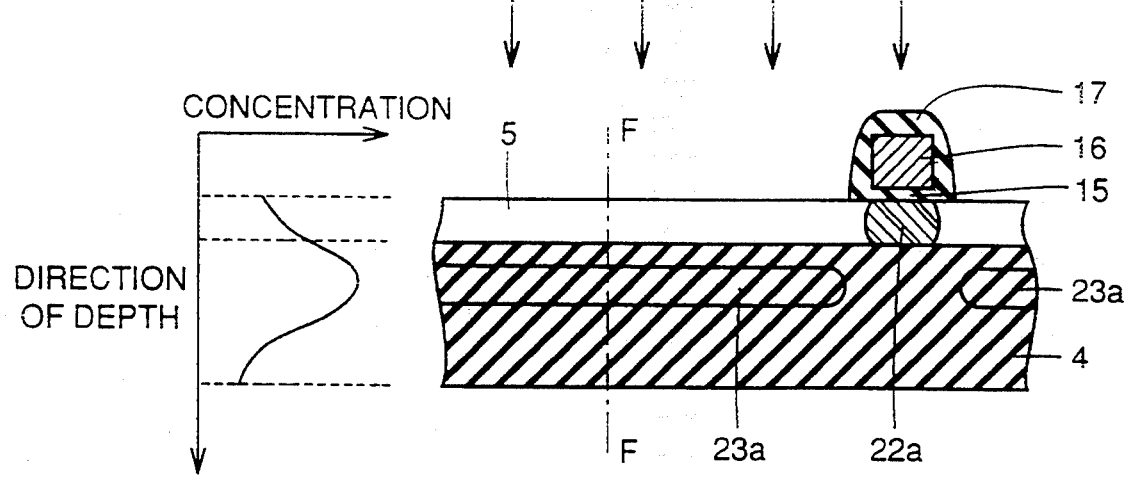
FIG. 30 shows a cross section in the vicinity of the FS gate after implantation of a channel stop and profile of boron (B) along line F—F.

FIG. 30 shows a partial sectional view of the semiconductor device having the SOI structure after an impurity is implanted for forming channel stop regions 22a and 22b and an accompanying impurity profile taken along line F—F. As can be seen from FIG. 30, even if a peak position of concentration of the implanted impurity is set within buried oxide film 4, some of impurities are implanted into SOI layer 5.

The film thickness $t_{FS}$ of FS gate has to be determined in view of the above conditions. As a result, concentrations of boron and phosphorus in SOI layer 5 for both nMOS and pMOS have to be set not more than $1 \times 10^{17}/cm^3$ in the case of a so-called dual-gate structure wherein a polycrystalline silicon layer having the n type impurity introduced thereto is used as gate electrode 12 of the nMOS, and a polycrystalline silicon layer having the p type impurity introduced thereto is used as gate electrode 12 of the pMOS. Correspondingly, the film thickness $t_{FS}$ of FS gate is required to be at least about 2900 Å, as shown in FIGS. 28 and 29.

On the contrary, in the case of a so-called reverse dual-gate structure wherein gate electrode 12 made of polycrystalline silicon having the p type impurity introduced thereto is used for the nMOS, and gate electrode 12 made of polycrystalline silicon having the n type impurity introduced thereto is used for the pMOS, concentrations of boron and phosphorus in SOI layer 5 for both the nMOS and pMOS are required to be set not more than $5 \times 10^{15}/cm$. Correspondingly, the film thickness $t_{FS}$ of FS gate is required to be at least 4500 Å.

If gate electrode 12 made of polycrystalline silicon having the n type impurity introduced thereto is used for both the nMOS and pMOS, then the film thickness $t_{FS}$ of FS gate which is governed by a concentration of phosphorus in SOI layer 5 of the pMOS is required to be at least 4500 Å. This is because a concentration of phosphorus in SOI layer 5 of the pMOS has to be set not more than $5 \times 10^{15}/cm^2$.

If gate electrode 12 made of polycrystalline silicon having the p type impurity introduced thereto is used for both the nMOS and pMOS, then the film thickness of FS gate $t_{FS}$ which is governed by a concentration of boron in SOI layer 5 of the nMOS is required to be at least 6300 Å.

This is because a concentration of boron in SOI layer 5 of the nMOS has to be set not more than $1 \times 10^{15}/cm^3$.

Figure 32:
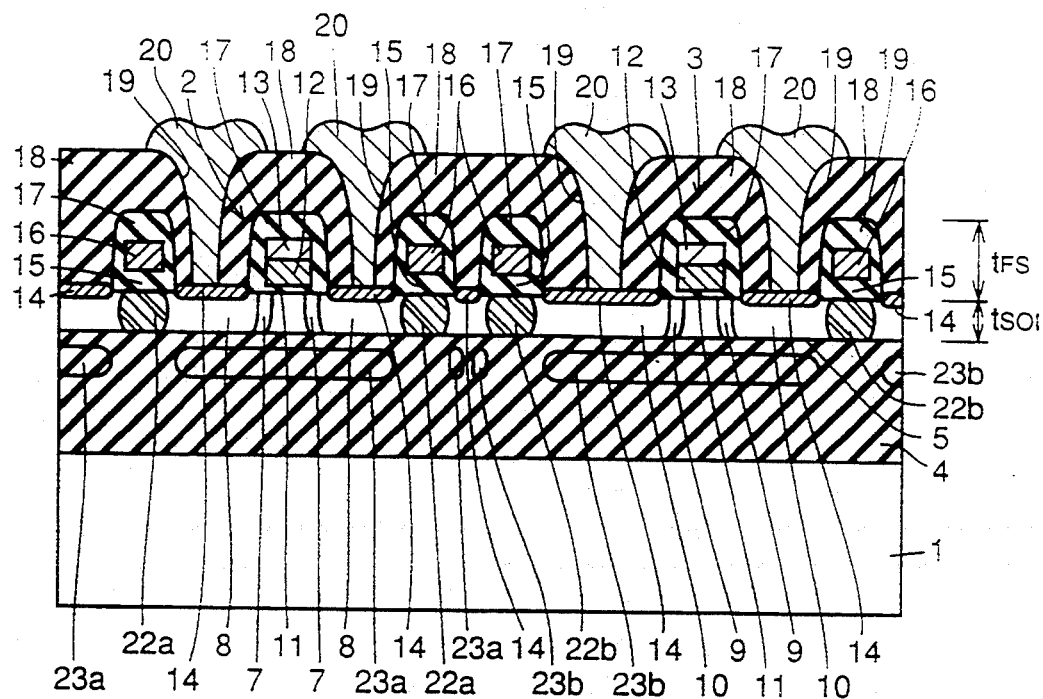
FIG. 32 is a cross sectional view of the semiconductor device having the SOI structure according to the first embodiment of the present invention, in which both a film thickness $t_{FS}$ of the FS gate and a thickness $t_{SOI}$ of the SOI layer are indicated.

FIG. 32 shows the semiconductor device having the above-described dual gate structure. As can be seen from the figure, the film thickness $t_{FS}$ of FS gate is set about 3000 Å, and a thickness $t_{SOI}$ of SOI layer 5 is set about 1000 Å, whereby channel stop regions 22a and 22b can be formed without introducing an unnecessarily large amount of impurities such as boron or phosphorus into the channel regions of nMOS 2 and pMOS 3.

In view of the above, a relationship between film thickness $t_{FS}$ of FS gate and film thickness $t_{SOI}$ of SOI layer 5 will be described. A relationship of range $R_P$ and variation $\Delta R_P$ of the implanted impurities, film thickness $t_{SOI}$ of SOI layer 5, and film thickness $t_{FS}$ of FS gate can be expressed as:

$$(R_P - t_{SOI})/\Delta R_P \geq 4.7 \tag{2}$$

$$t_{FS} = 0.8 \times t_{SOI} \tag{3}$$

Writing this expressions in another way to give:

$$t_{FS} \geq (4.7 \times \Delta R_P + t_{SOI})/1.25 \tag{4}$$

The minimum film thickness $t_{FS}$ of FS gate is determined by the above expression (4).

(Embodiment 2)

Figure 33:
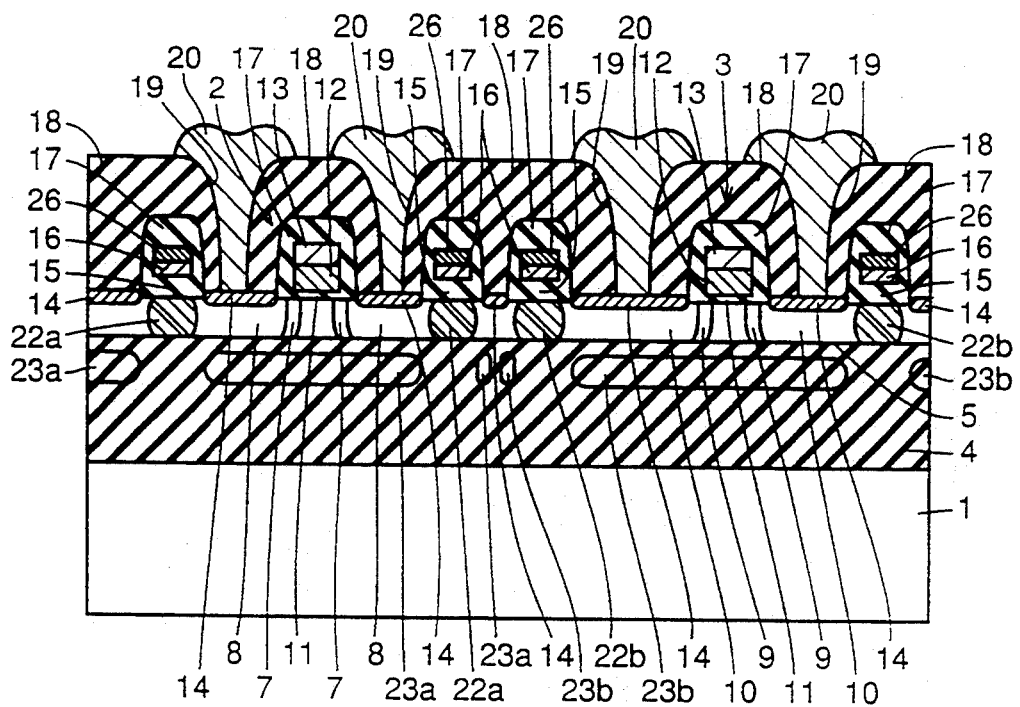
FIG. 33 is a cross sectional view showing a semiconductor device having an SOI structure according to a second embodiment of the present invention.

Now, a second embodiment of the present invention will be described with reference to FIGS. 33–42. FIG. 33 is a cross sectional view showing a semiconductor device having an SOI structure according to the second embodiment of the present invention.

With reference to FIG. 33, in the semiconductor device having the SOI structure in this embodiment, a layer having an excellent capability for stopping impurity implantation such as a metal layer 26 is formed on FS gate 16. By providing such a layer, a thickness of FS gate 16 can be reduced, whereby planarization of the device can be carried out. Such planarization of the device contributes to increase of a margin at the time of patterning of gate electrode 12, as described above. Also, since the implantation energy of impurities for formation of channel stop regions 22a and 22b can be set at a relatively high energy, a remaining amount of impurities for formation of channel stop regions 22a and 22b in the formation regions of nMOS 2 and pMOS 3 can be suppressed.

Thus, performance of nMOS 2 and pMOS 3 can be improved. The other parts of the structure are the same as those in the semiconductor device having the SOI structure in the first embodiment shown in FIG. 1.

It is noted that a layer made of a material having a larger atomic weight than silicon, and oxides, nitrides, or silicides thereof can be considered for the layer having an excellent capability for stopping impurity implantation. Preferably, such a layer is formed by metal layer 26 or layer made of a metal compound. More specifically, metal layer 26 made of Ti, W, Co, Mo, Ta, Pt, Au, Cu, or compounds thereof is preferred.

For the sake of reduction of resistance of FS gate 16, it is most preferable to use a Ti layer for metal layer 26. Also, for the sake of the capability for stopping impurity implantation, it is most preferable to select a metal having a large atomic weight such as W. Also, for the sake of future miniaturization of the device, a material such as Co is preferred, because it is capable of reducing resistance uniformly even in the case of a width of interconnections reduced to about 0.3 μm.

Figure 38:
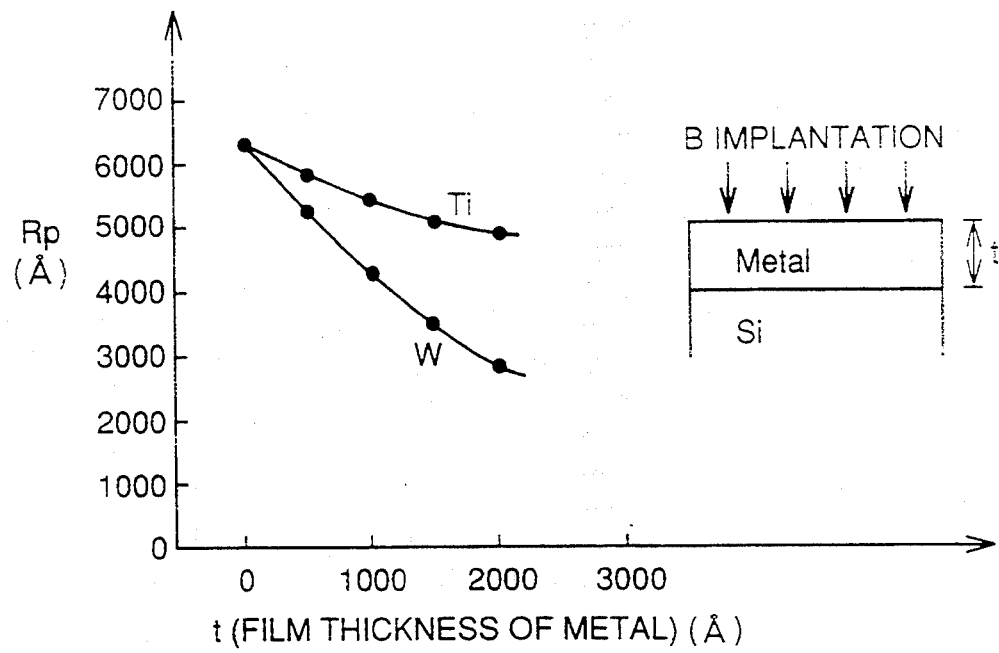
FIG. 38 is a graph showing a relationship between range $R_P$ of B and film thickness t of a metal layer.
Figure 39:
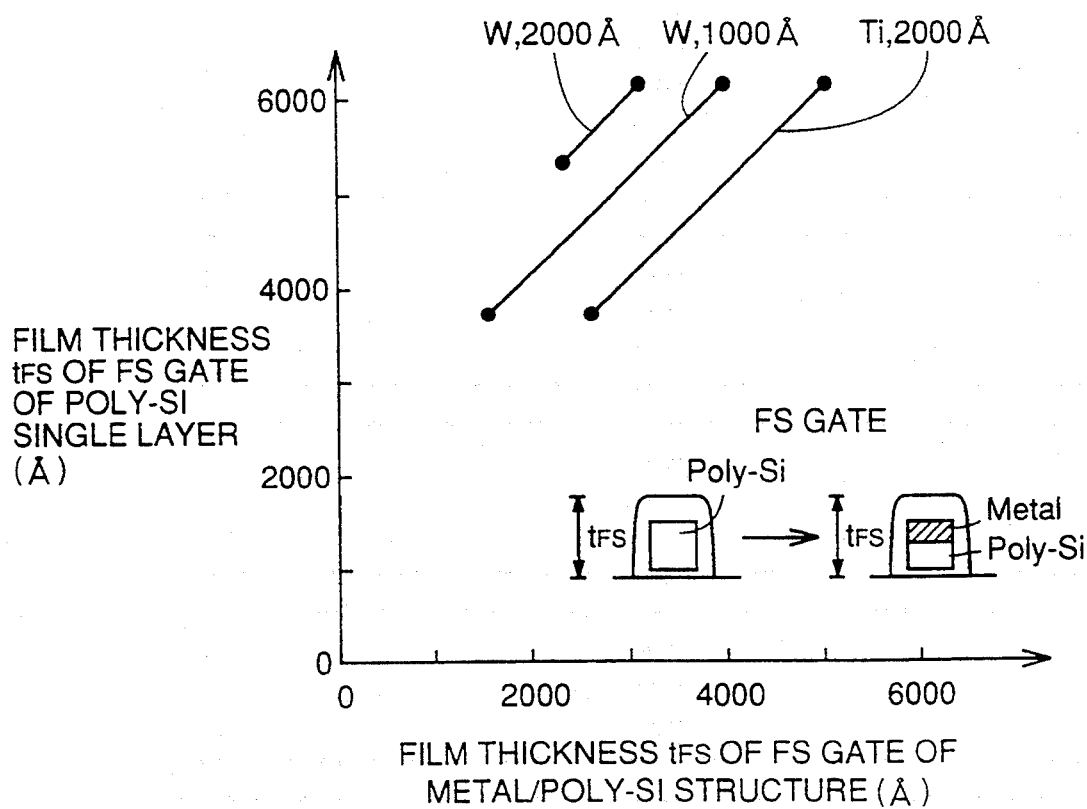
FIG. 39 is a graph showing the film thickness of FS gate with and without the metal layer being formed.

Now, with reference to FIGS. 38 and 39, film thickness $t_{FS}$ of FS gate will be described in detail. FIG. 38 is a graph showing the range of implantation ion seeds with respect to a film thickness of metal layer 26 in the case of Ti and W are used for metal layer 26. In FIG. 39, film thickness $t_{FS}$ of FS gate is plotted in the case when metal layer 26 is formed on FS gate 16 and in the case when the layer is not formed.

As can be seen from FIG. 38, the capability for stopping impurity implantation is better in W having a larger atomic weight than Ti. In other words, for the sake of the capability for stopping impurity implantation, it is preferable to select metal layer 26 having a larger atomic weight.

As can be seen from FIG. 39, film thickness $t_{FS}$ of FS gate can be suppressed more in the case of metal layer 26 formed on FS gate 16 (in the case of metal/poly-Si). More specifically, while film thickness $t_{FS}$ of FS gate is about 3500 Å when 2000 Å of W is deposited on FS gate 16, film thickness $t_{FS}$ of FS gate required is about 6000 Å in the case of a single layer of polycrystalline silicon. Film thickness $t_{FS}$ of FS gate can be suppressed by forming metal layer 26 on FS gate 16, whereby the device can be planarized.

Now, with reference to FIGS. 34-37, a method of manufacturing the semiconductor device having the SOI structure according to the present embodiment shown in FIG. 33 will be described. FIGS. 34-37 are cross sectional views showing first through fourth steps of the manufacturing process of the semiconductor device having the SOI structure according to this embodiment.

Figure 34:
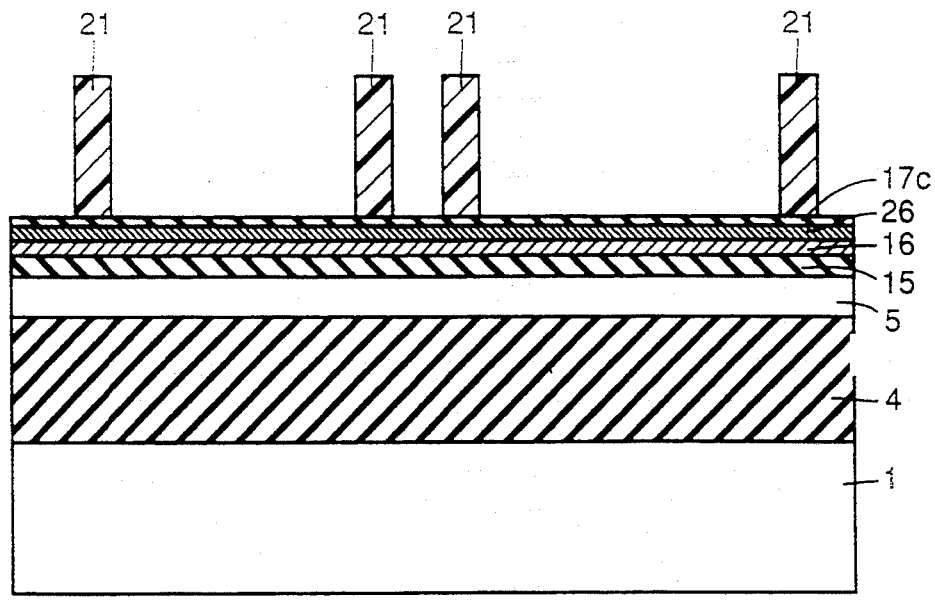
FIGS. 34–37 are cross sectional views showing first through fourth steps of a manufacturing process of the semiconductor device having the SOI structure shown in FIG. 33.

With reference to FIG. 34, the SOI substrate is formed by the same method as in the above first embodiment. A silicon oxide film 15 is formed to have a thickness of 500 Å on SOI layer 5 at 800° C. by CVD. A polycrystalline silicon layer 16 including phosphorus (P) of at least $1 \times 10^{20}/cm^3$ is formed to have a thickness of 1000 Å on silicon oxide film 15 by CVD. A Ti layer 26 is formed to have a thickness of 2000 Å on polycrystalline silicon layer 16 by sputtering. A silicon oxide film 17c is formed to have a thickness of 1000 Å on Ti layer 26 by CVD. A resist pattern 21 patterned into a predetermined shape is formed on silicon oxide film 17c. Using resist pattern 21 as a mask, silicon oxide film 17c is patterned, and then resist pattern 21 is removed. Using silicon oxide film 17c as a mask, Ti layer 26, polycrystalline silicon layer 16, silicon oxide film 15 are successively etched.

Figure 35:
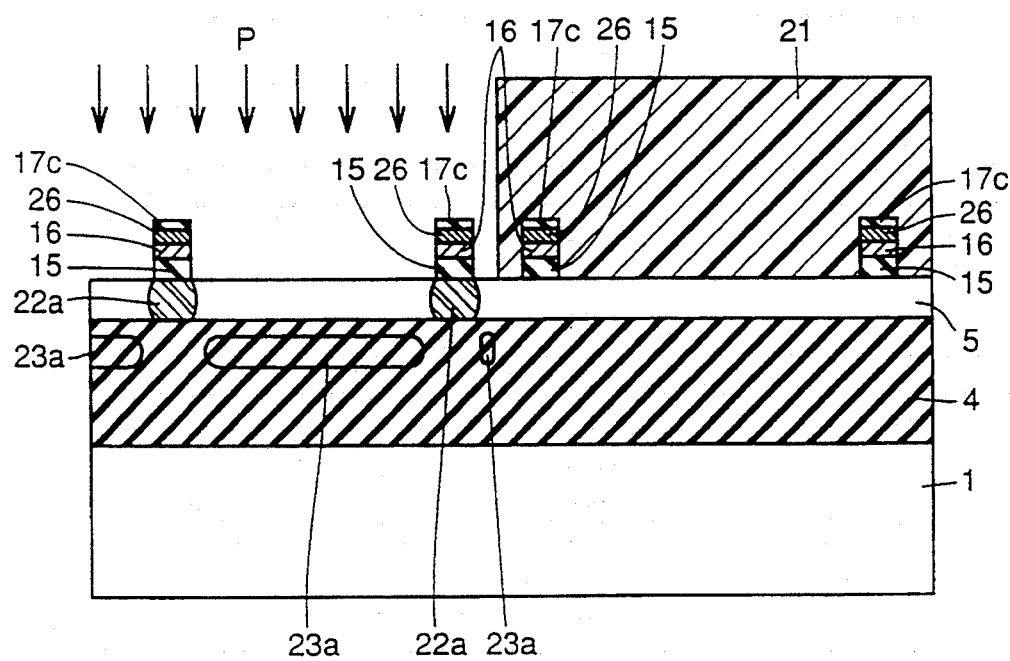

With reference to FIG. 35, resist pattern 21 is formed to cover only a pMOS formation region. Using resist pattern 21 as a mask, phosphorus (P) ions are implanted into SOI layer 5 at 400 keV for $0.8-3 \times 10^{13}/cm^2$, whereby a channel stop region 22a is formed in SOI layer 5 located under FS gate 16. At this time, an impurity implantation region 23a is simultaneously formed in a buried oxide film 4. Therefore, phosphorus (P) is implanted at a high energy, so that a concentration of phosphorus (P) left in a formation region of nMOS 2 can be suppressed.

Figure 36:
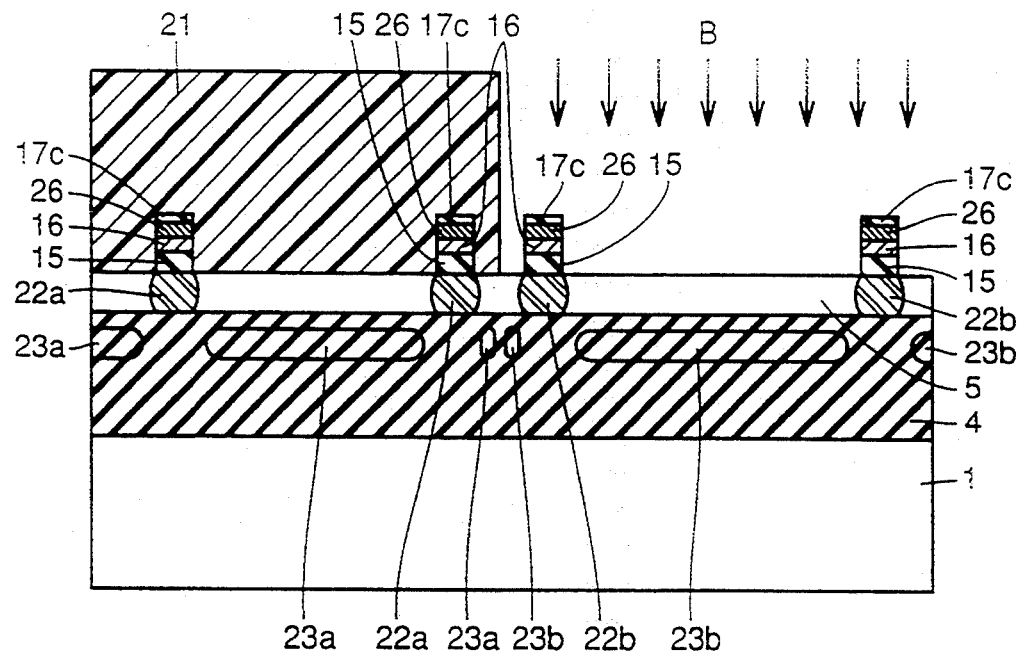

With reference to FIG. 36, resist pattern 21 is formed to cover only the formation region of nMOS. Using resist pattern 21 as a mask, boron (B) is implanted into SOI layer 5 at 400 keV for $0.9-5 \times 10^{13}/cm^2$ whereby a channel stop region 22b is formed in SOI layer 5 located under FS gate 16. At the same time, an impurity implantation region 23b is formed in buried oxide film 4. Then, resist pattern 21 is removed. Therefore, boron (B) is also implanted at a high energy, a concentration of boron (B) left in the formation region of pMOS 3 can be suppressed.

A silicide layer is formed on FS gate 16 by lamp annealing in an ambience of oxygen or nitrogen at a temperature of 800° C.-900° C. for thirty seconds. Accordingly, a resistance value of FS gate 16 can be reduced by formation of the silicide layer on FS gate 16. It is noted that the silicide layer is formed after formation of channel stop regions 22a and 22b, because a simple substance of metal has a better capability for stopping impurity implantation than the silicide layer, thus setting film thickness $t_{FS}$ of FS gate at a small value.

Figure 37:
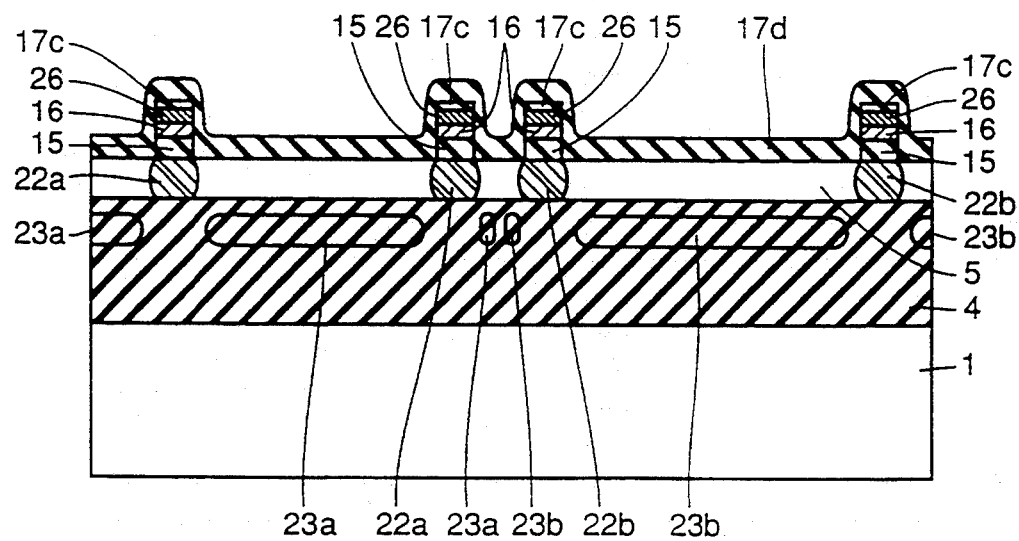

With reference to FIG. 37, a silicon oxide film 17d is formed to have a thickness of about 2000-2500 Å by CVD. Silicon oxide film 17d is subjected to etching in an ambience of gas having a strong anisotropic characteristic as in the above first embodiment, whereby a silicon oxide film 17 covering FS gate 16 can be formed. The subsequent steps are the same as in the above first embodiment. Thus, the semiconductor device having the SOI structure shown in FIG. 33 is formed.

Figure 40:
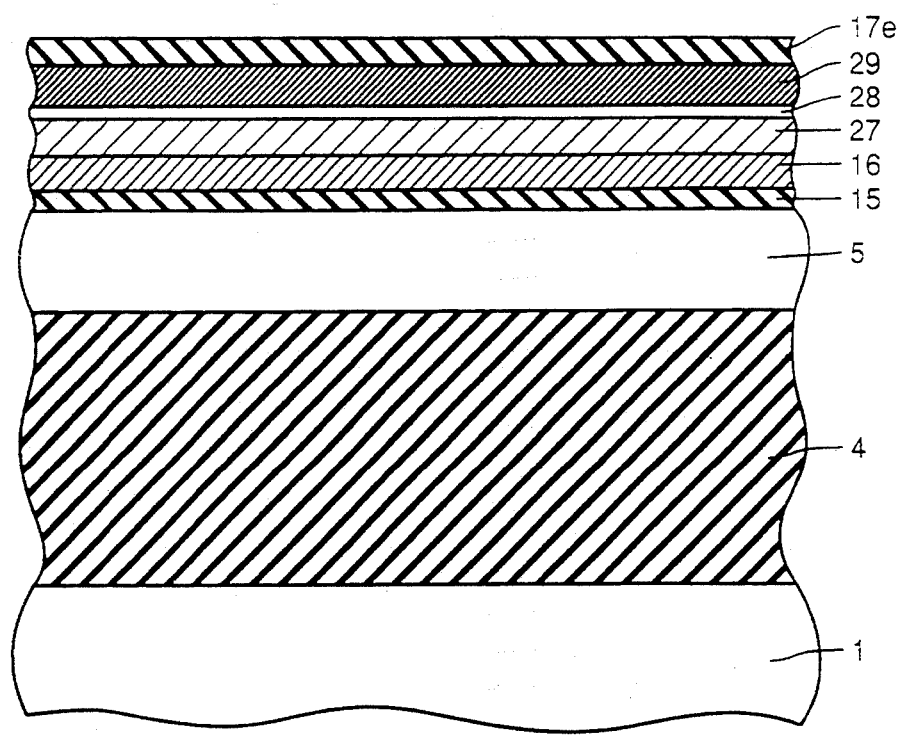
FIG. 40 is a cross sectional view showing a characteristic step for manufacturing an altered example of the second embodiment according to the present invention.
Figure 41:
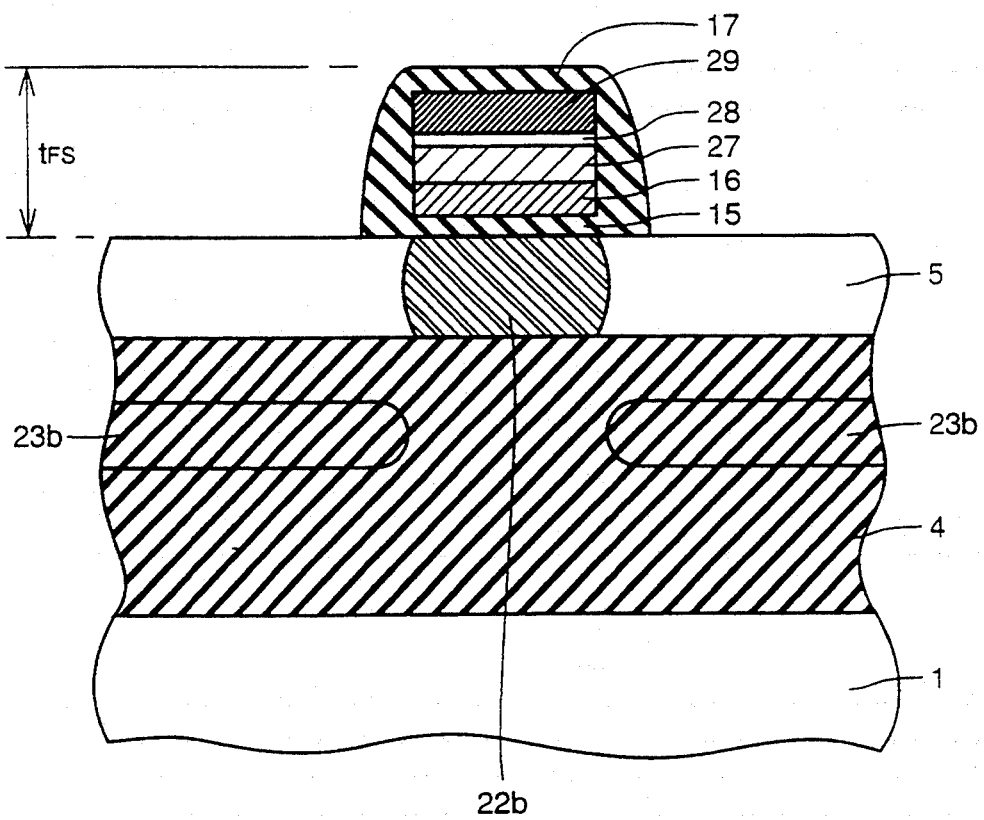
FIG. 41 is an enlarged cross sectional view showing the vicinity of the FS gate in the altered example of the second embodiment according to the present invention.

Now, with reference to FIGS. 40 and 41, an altered example of this embodiment will be described. FIG. 40 is a cross sectional view showing a characteristic step for manufacturing this altered example. FIG. 41 is a cross sectional view showing the vicinity of FS gate 16 in an enlarged manner in this altered example.

As can be seen from FIG. 40, the SOI substrate is formed by the same method as in the above second embodiment. Then, a silicon oxide film 15 having a thickness of 500 Å, a polycrystalline silicon layer 16 having a thickness of 300 Å, a $WSi_2$ layer 27 having a thickness of 200 Å, a silicon oxide film 28 having a thickness of 20 Å, a W layer 29 having a thickness of 1000 Å, and a silicon oxide film 17e having a thickness of 200 Å are successively formed on SOI layer 5. At this time, silicon oxide films 15, 28, and 17e are formed by CVD or thermal oxidation. Polycrystalline silicon layer 16 is formed by CVD so that phosphorus (P) of at least $1 \times 10^{20}/cm^2$ is introduced. $WSi_2$ layer 27 and W layer 29 are formed by sputtering. After formation of silicon oxide film 17e, the same steps as in the above second embodiment are carried out to form the semiconductor device having the SOI structure.

As described above, as can be seen from FIG. 41, film thickness $t_{FS}$ Of FS gate is reduced to 2220 Å, thus allowing planarization of the device. Also, by providing silicon oxide film 28 between $WSi_2$ layer 27 and W layer 29, a reaction between W layer 29 and FS gate 16 can be restrained. More particularly, silicon oxide film 28 serves as a barrier layer for restraining the reaction between W layer 29 and FS gate 16. By providing silicon oxide film 28 serving as the barrier layer, an electrical characteristic of FS gate 16 can be stabilized. Also, silicon oxide film 28 allows usage of a $TiSi_2$ layer or a CoSi layer instead of $WSi_2$ layer 27. It is noted that a silicon nitride, a metal nitride film, or a metal oxide film may be used instead of silicon oxide film 28.

(Embodiment 3)

Figure 42:
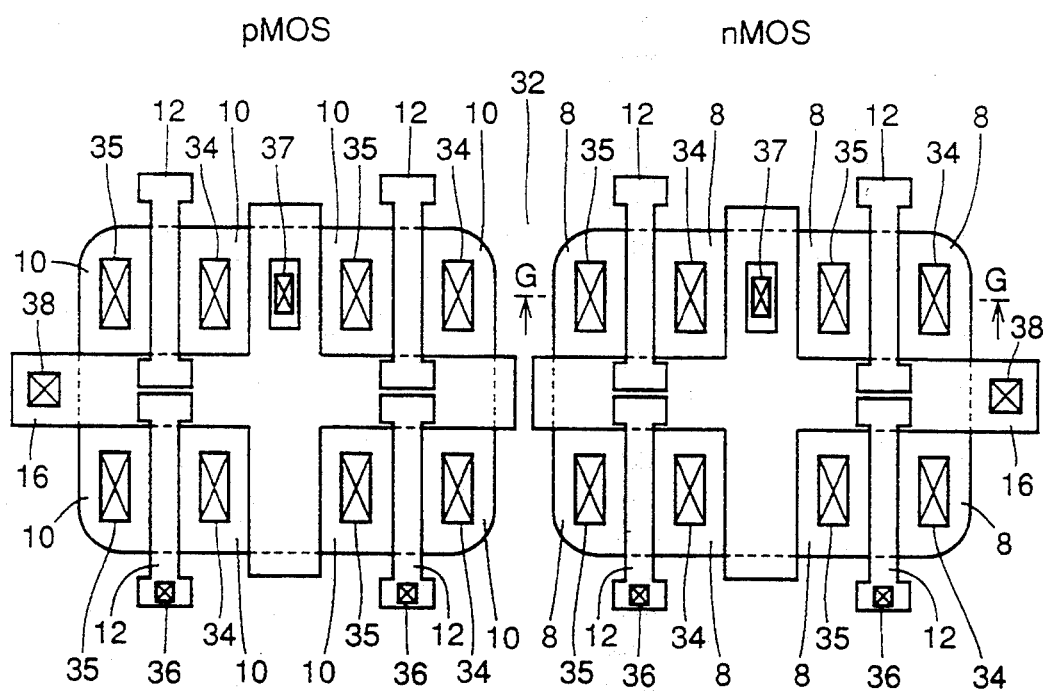
FIG. 42 is a plan view showing a semiconductor device having an SOI structure according to a third embodiment of the present invention.
Figure 43:
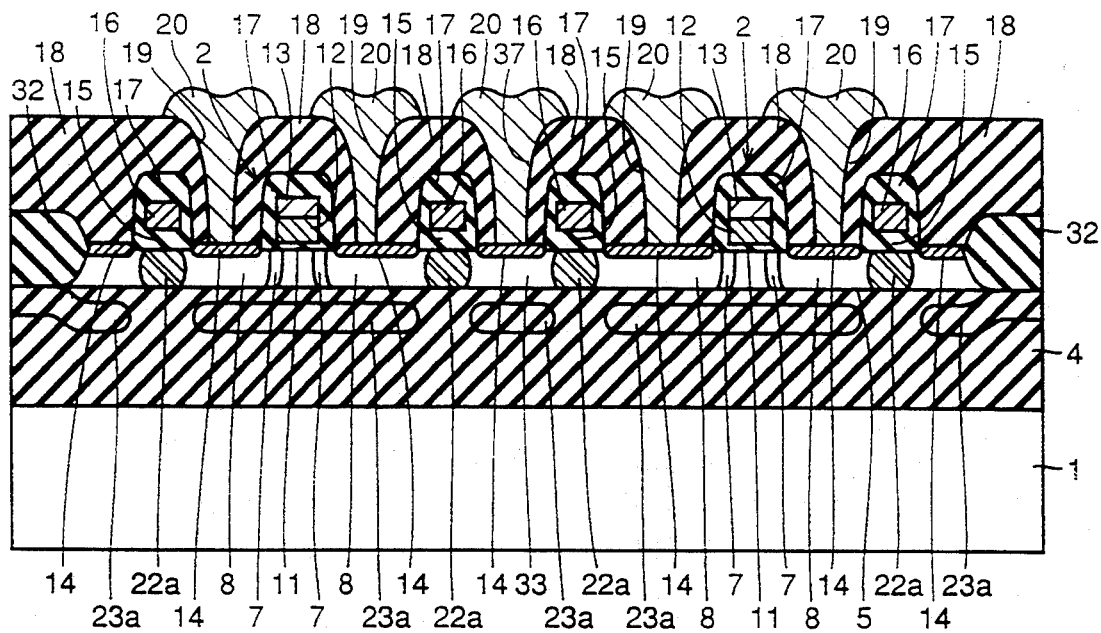
FIG. 43 is a cross sectional view taken along line G—G in FIG. 42.

Now, a third embodiment of the present invention will be described with reference to FIGS. 42–54. FIG. 42 is a plan view of a semiconductor device having an SOI structure according to the third embodiment of the present invention. FIG. 43 is a cross sectional view taken along line G—G in FIG. 42.

As can be seen from FIG. 42, both isolation by an isolation oxide film 32 and isolation by an FS gate 16 are used in this embodiment. More particularly, formation regions of pMOS and nMOS are complete by isolated from each other by isolation oxide film 32. More specifically, isolation oxide film 32 is formed to enclose formation regions of pMOS and nMOS, whereby the pMOS and nMOS are respectively formed in SOI layer having a complete island shape.

A plurality of pMOS and nMOS are formed in respective formation regions of pMOS and nMOS. Isolation is provided between pMOSs or nMOSs by FS gate 16. At this time, a channel stop region having a high concentration is formed under FS gate 16, as in the above respective embodiments, so that excessive carriers generated in respective pMOS and nMOS channel regions are moved into this channel stop region efficiently. These excessive carriers are efficiently diffused within the channel stop region having a high concentration, and drawn out externally by an interconnection (electrode) formed in contact hole 37.

Thus, by using both isolation oxide film 32 and FS gate 16 for isolation, a device having a high reliability and high performance can be obtained.

Now, with reference to FIG. 43, a structure of the semiconductor device having the SOI structure according to this embodiment will be described. In a cross section shown in FIG. 43, two nMOSs 2 are formed. A $p^+$ region 33 having a high concentration is formed in a region sandwiched by these nMOSs 2 in SOI layer 5. Also, a contact hole 37 is provided in an interlayer oxide film 18 located on $p^+$ region 33. An interconnection layer 20 is provided in contact hole 37. Excessive carriers generated in the channel region of nMOS are diffused within $p^+$ region 33 through channel stop region 22a. These excessive carriers are then drawn out externally by interconnection layer 20 formed on $p^+$ region 33.

With reference to FIGS. 44–54, a method of manufacturing the semiconductor device having the SOI structure in this embodiment shown in FIG. 43 will be described. FIGS. 44–54 are cross sectional views showing first through eleventh steps of a manufacturing process of the semiconductor device having the SOI structure in this embodiment.

Figure 44:
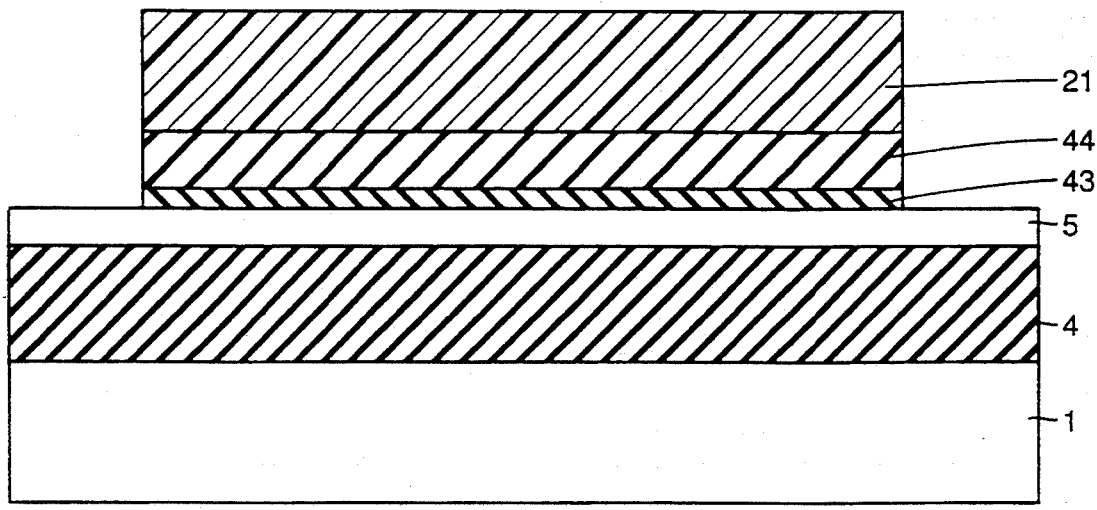
FIGS. 44–54 are cross sectional views showing first through eleventh steps of a manufacturing process of the semiconductor device having the SOI structure shown in FIG. 43.

As can be seen from FIG. 44, the SOI substrate is formed by the same method as in the above first embodiment. A silicon oxide film 43 is formed to have a thickness of 100 Å on SOI layer 5 by CVD. A silicon nitride film 44 is formed to have a thickness of 2000 Å on silicon oxide film 43 by CVD. A resist pattern 21 patterned into a predetermined shape is formed on silicon nitride film 44. Using the resist pattern as a mask, silicon nitride film 44 and silicon oxide film 43 are patterned into a predetermined shape. Then, resist pattern 21 is removed. SOI layer 5 is selectively oxidized in a wet ambience at a temperature of 950° C.–1000° C., thus forming an isolation oxide film 32. Isolation oxide film 32 is formed only in a region between nMOS and pMOS. Then, silicon nitride film 44 and silicon oxide film 43 are removed by wet etching.

Figure 45:
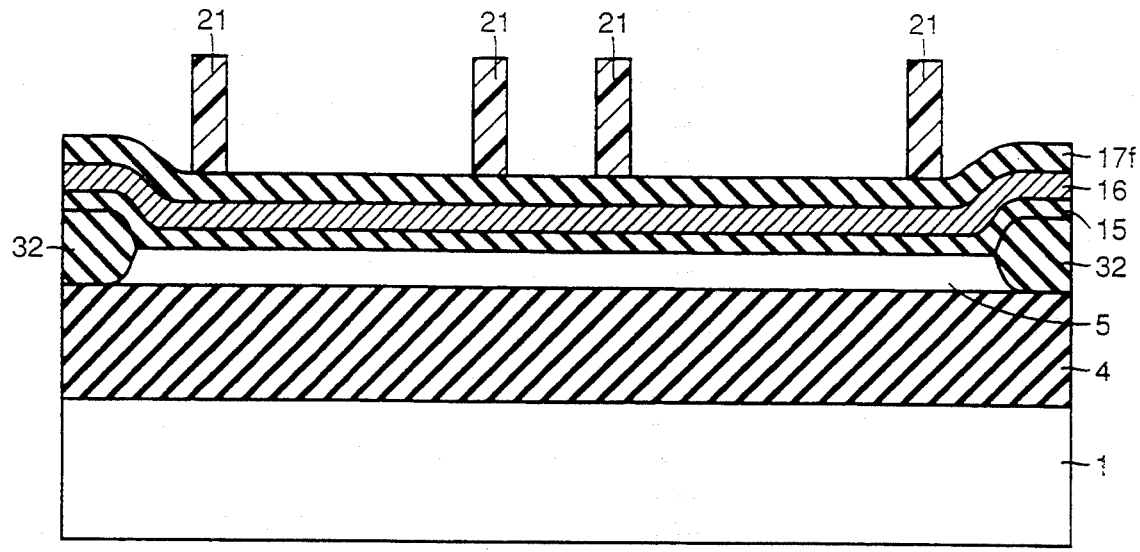

With reference to FIG. 45, a silicon oxide film 15 is formed to have a thickness of 500 Å by CVD. A polycrystalline silicon layer 16 including phosphorus (P) at a high concentration is formed to have a thickness of 2000 Å on silicon oxide film 15. A silicon oxide film 17f is formed to have a thickness of 2000 Å on polycrystalline silicon layer 16 by CVD. A resist pattern 21 patterned into a predetermined shape is formed on silicon oxide film 17f. Then, an FS gate 16 is formed by etching as in the above first embodiment.

Figure 46:
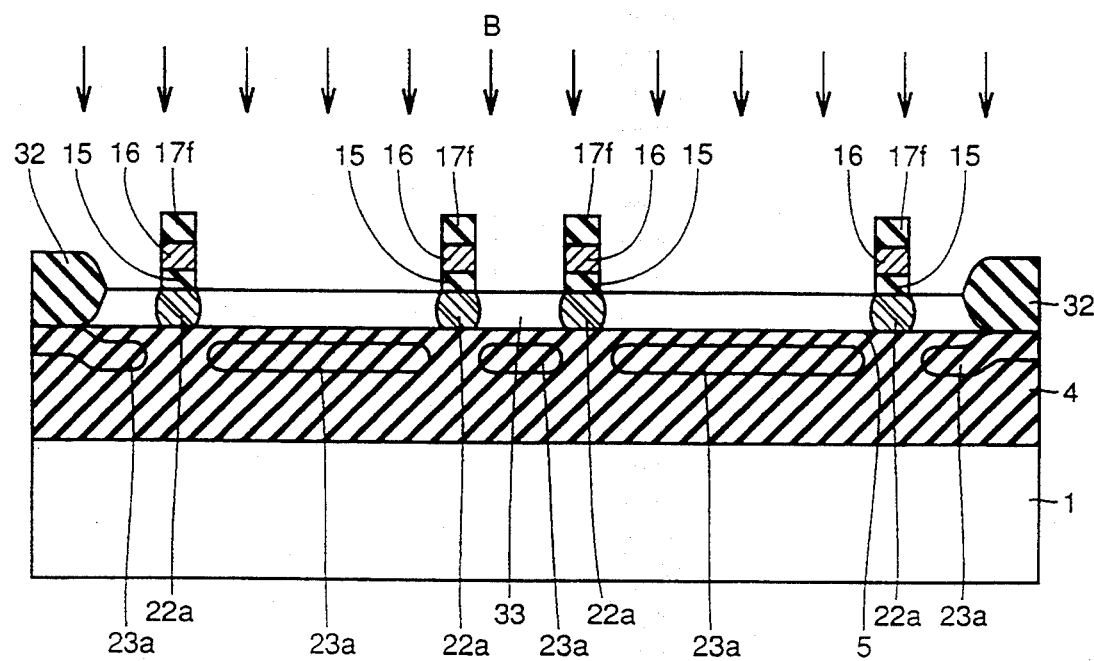

With reference to FIG. 46, a resist pattern is formed to cover only a pMOS formation region (not shown). By using the resist pattern as a mask, boron (B) ions are implanted into SOI layer 5 at 200 keV for $1–5 \times 10^{13}/cm^2$, whereby a channel stop region 22a is formed in SOI layer 5 located under FS gate 16. At the same time, an impurity implantation region 23a is formed in a buried oxide film 4.

Figure 47:
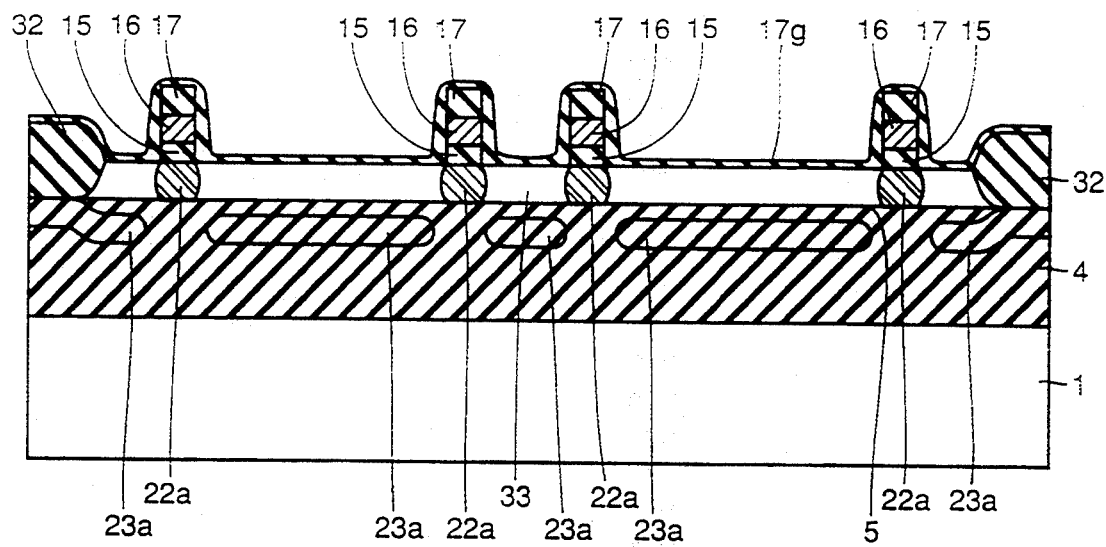

With reference to FIG. 47, a silicon oxide film 17g is formed to have a thickness of 2000 Å by CVD. Silicon oxide film 17g is subjected to etching in an ambience of gas having a strong anisotropic characteristic, whereby a silicon oxide film 17 enclosing FS gate 16 is formed.

Figure 48:
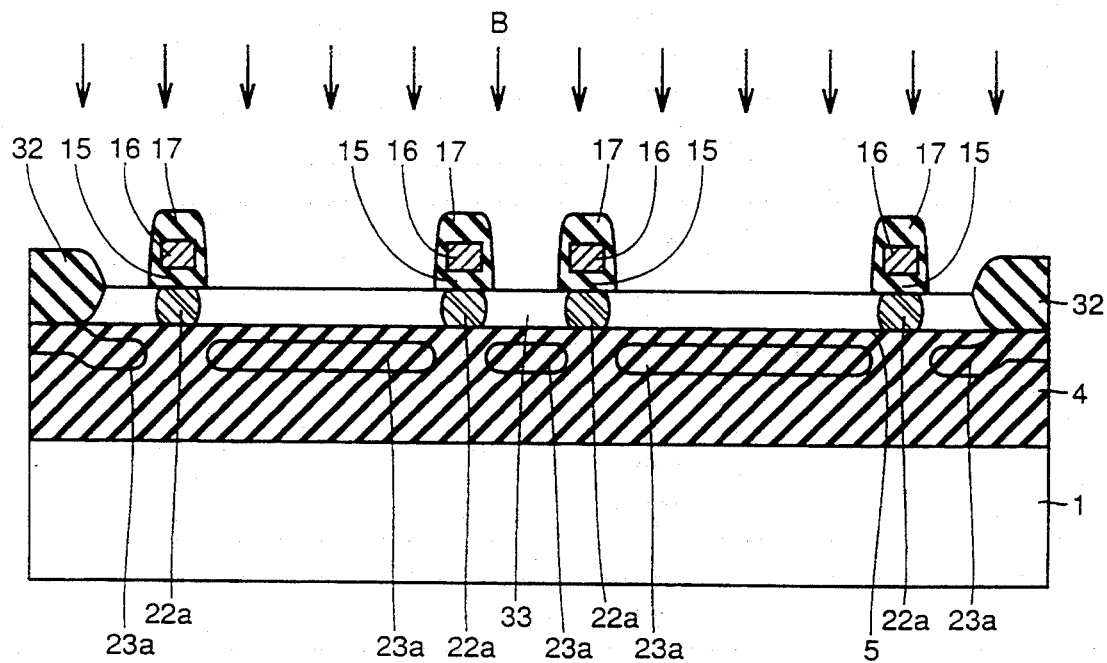

With reference to FIG. 48, by using FS gate 16 as a mask, boron (B) ions are implanted into SOI layer 5 at 20 keV for $3–5 \times 10^{12}/cm^2$, thus carrying out channel doping of nMOS 2.

Figure 49:
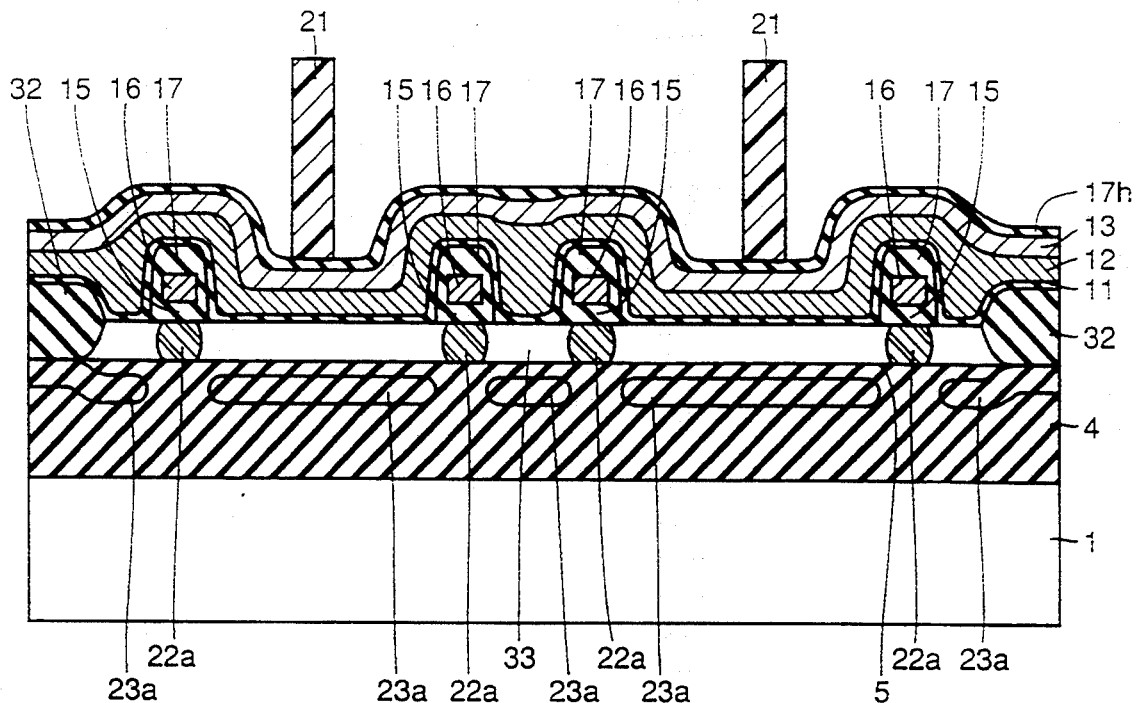

With reference to FIG. 49, a foreign object or natural oxide film on the surface of SOI layer 5 in the formation region of nMOS 2 is removed by the same method as in the above first embodiment. Then, a gate oxide film, a polycrystalline silicon layer 12, a $WSi_2$ layer 13, a silicon oxide film 17h, a resist patter 21 are respectively formed by the same method as in the above first embodiment. Then, a gate electrode 12 is also formed by the same method as in the above first embodiment.

Figure 50:
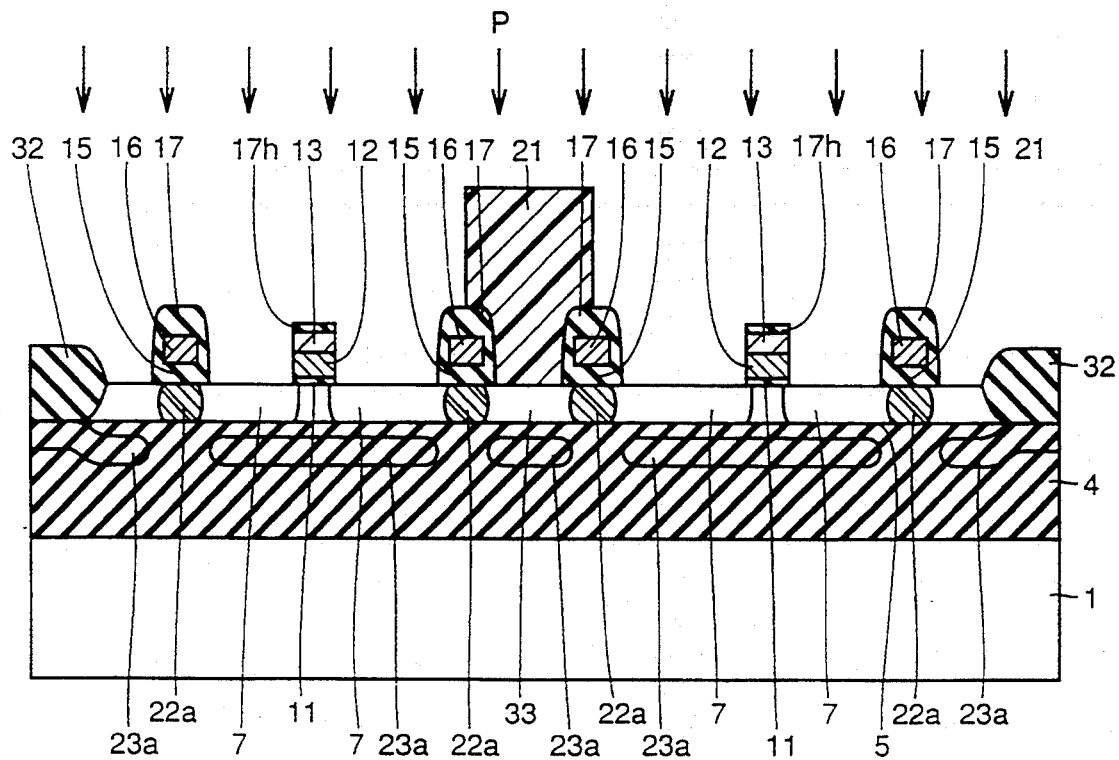

With reference to FIG. 50, a resist pattern 21 is formed to cover formation regions of pMOS and $p^+$ region 33. By using resist pattern 21 as mask, phosphorus (P) ions are implanted into SOI layer at 40 keV for $1-2\times 10^{13}/cm^2$, whereby an n+ diffusion region 7 is formed.

Figure 51:
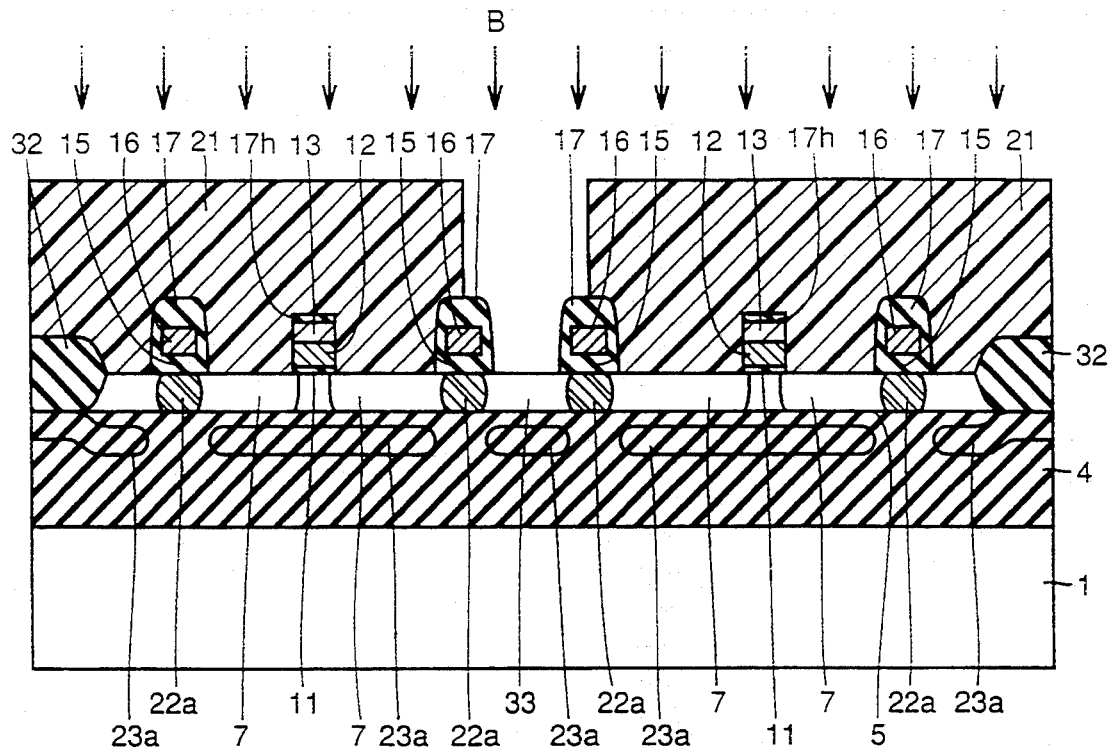

With reference to FIG. 51, resist pattern 21 is formed to cover only the nMOS formation region. By using resist pattern 21 as a mask, boron (B) ions are implanted into SOI layer 5 at 20 keV for $1-2\times 10^{13}/cm^2$, whereby p− diffusion region (not shown) of pMOS is formed. At this time, boron (B) ions are also implanted into the formation region of p+ region 33.

Figure 52:
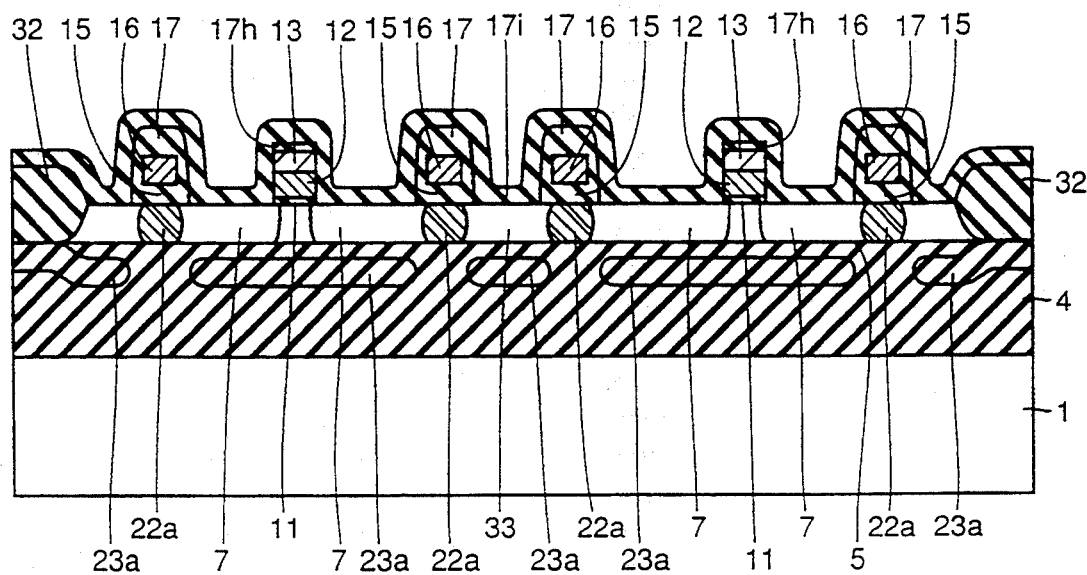

With reference to FIG. 52, after removal of resist pattern 21, a silicon oxide film 17i is formed to have a thickness of 1000-2000 Å by CVD. Silicon oxide film 17i subjected to etching in an ambience of gas having a strong anisotropic characteristic, whereby a silicon oxide film 17 enclosing gate electrode 12 is formed.

Figure 53:
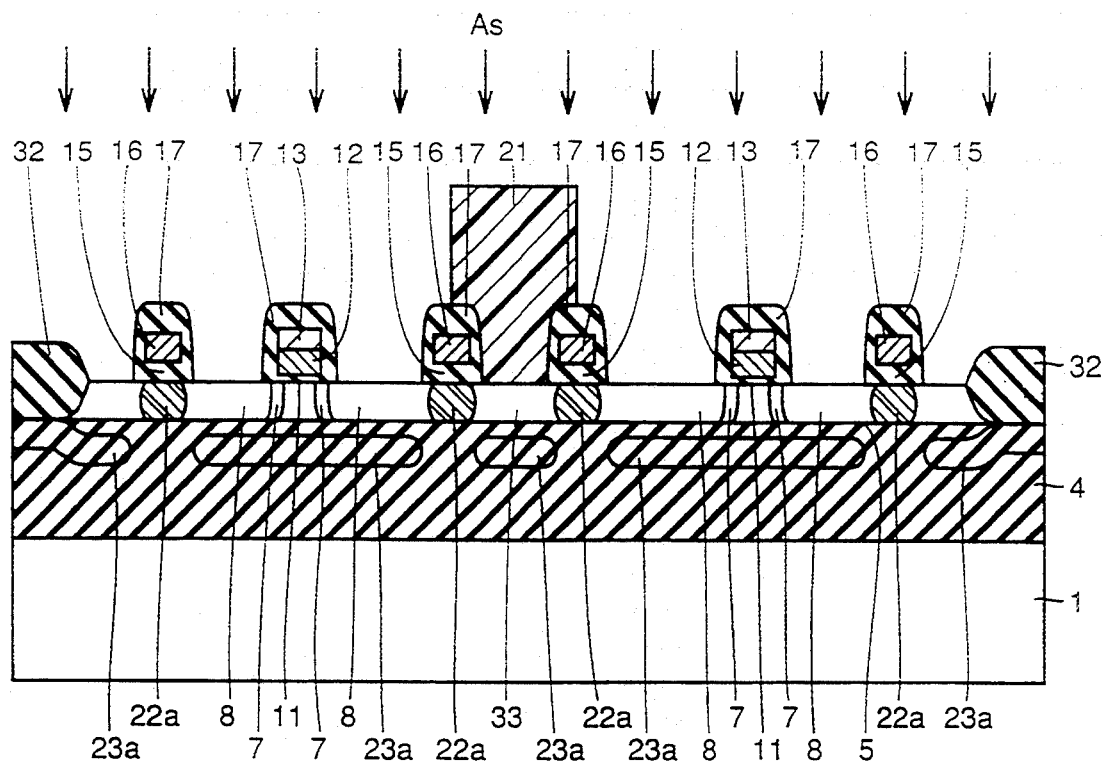

With reference to FIG. 53, resist pattern 21 is formed to cover formation regions of pMOS and p+ region 33. By using resist pattern 21 as a mask, arsenic (As) is implanted into SOI layer 5 at 50 keV for $4-6\times 10^{15}/cm^2$, whereby an n+ diffusion region 8 is formed.

Figure 54:
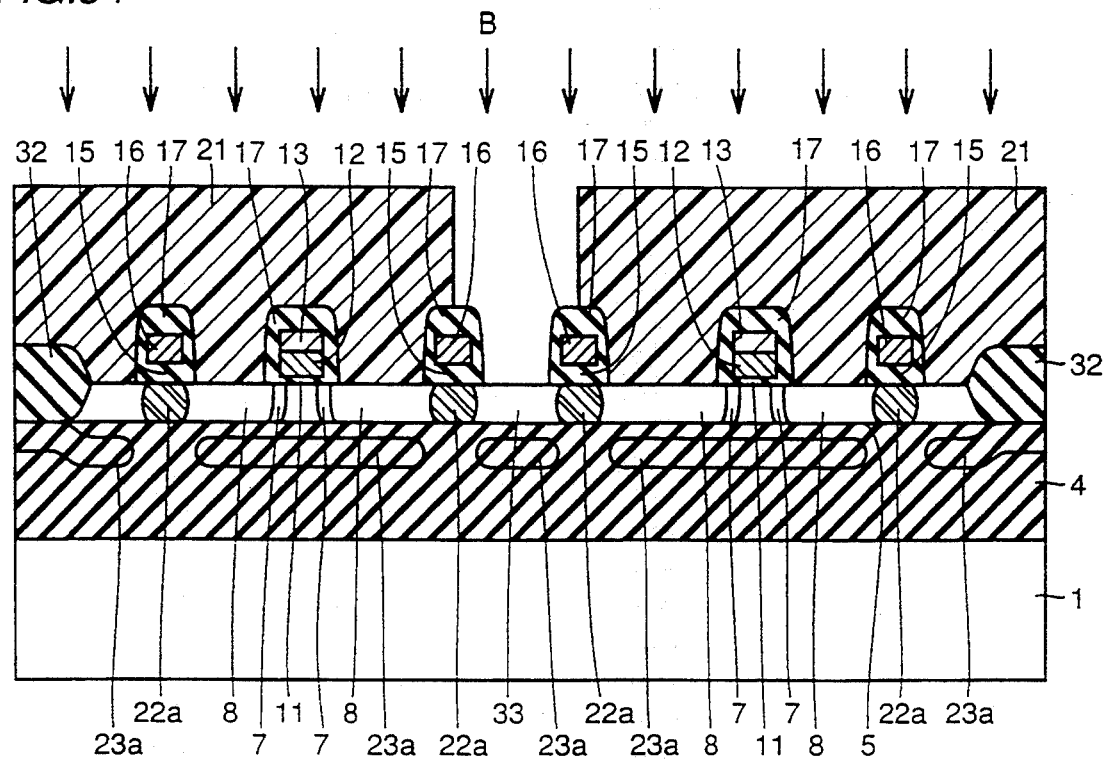

With reference to FIG. 54, resist pattern 21 is formed to cover only the formation region of nMOS. By using resist pattern 21 as a mask, boron (B) ions are implanted into SOI layer 5 at 20 keV for $4-6\times 10^{15}/cm^2$, whereby a p+ diffusion region (not shown) of pMOS is formed, and at the same time p+ region 33 is formed. Then, resist pattern 21 is removed. Then, the same steps as in the above first embodiment are carried out to obtain the semiconductor device having the SOI structure shown in FIG. 43.

(Embodiment 4)

Figure 55:
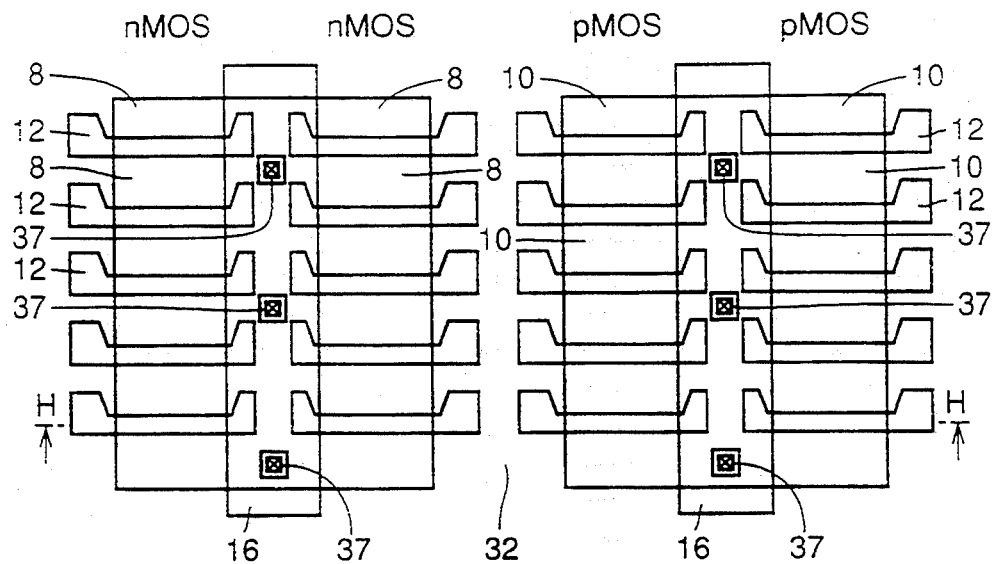
FIG. 55 is a plan view showing the semiconductor device having an SOI structure according to a fourth embodiment of the present invention.
Figure 56:
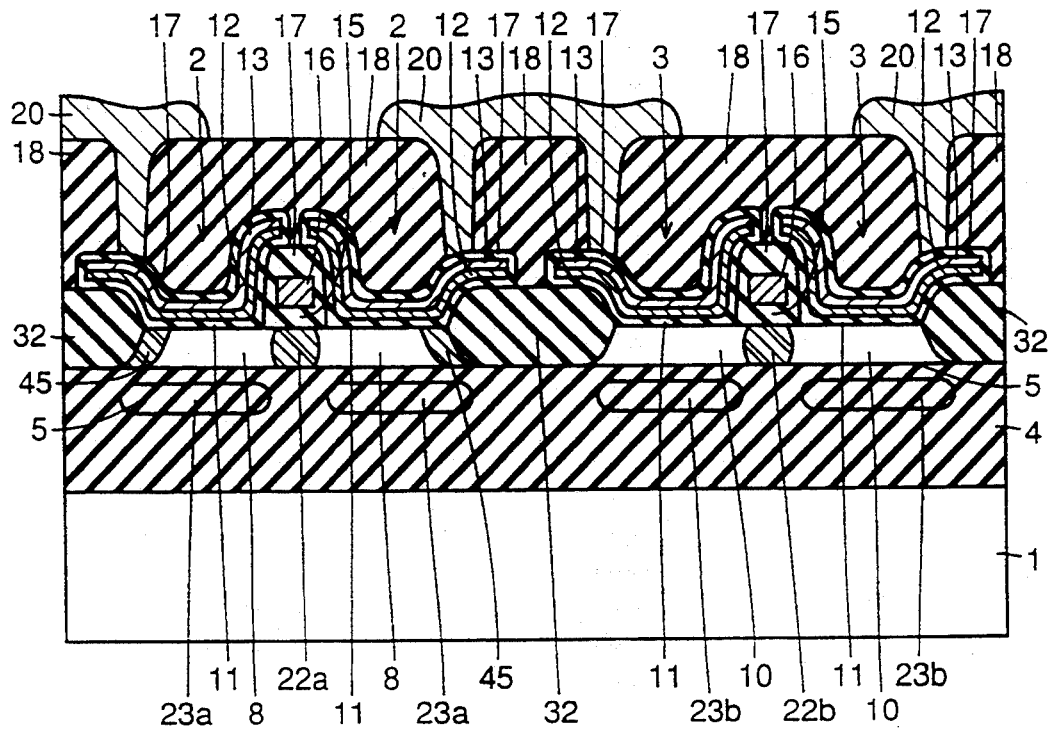
FIG. 56 is a cross sectional view taken along line H—H in FIG. 55.

Now, with reference to FIGS. 55-58, a fourth embodiment of the present invention will be described. FIG. 55 is a plan view of the semiconductor device having the SOI structure of this embodiment. FIG. 56 is a cross sectional view taken along line H—H in FIG. 55.

As can be seen from FIG. 55, the present invention is applied to an SOG (Sea Of Gate) gate array in this embodiment. With reference to FIG. 55, both isolation by FS gate 16 and isolation by isolation oxide film 32 are used as in the above third embodiment, whereby the same effect as in the third embodiment can be obtained.

Referring to FIG. 55 again, FS gate 16 is formed across formation regions of nMOS and pMOS. Channel stop regions 22a and 22b having high concentrations are formed under the FS gate as in the above respective embodiments. Within channel stop regions 22a and 22b are diffused excessive carriers generated in respective channel regions of nMOS 2 and pMOS 3. A contact hole 37 is provided penetrating through part of FS gate 16 to reach the surface of channel stop regions 22a and 22b. An interconnection layer (not shown) is formed in contact hole 37 to externally draw out these excessive carriers. The excessive carriers generated in the channel regions of nMOS 2 and pMOS 3 are externally drawn out by the interconnection layer. The excessive carriers are diffused efficiently within channel stop regions 22a and 22b to reach the interconnection layer, as in the above respective embodiments.

With reference to FIG. 56, a cross section of this embodiment will be described. As can be seen from FIG. 56, nMOSs 2 are isolated from each other by FS gate 16 and pMOSs 3 are isolated from each other by FS gate 16, while pMOS 3 and nMOS 2 are isolated by isolation oxide film 32. Also, a p type high concentration region 45 is formed at the end of isolation oxide film 32 in the formation region of nMOS 2.

Figure 57:
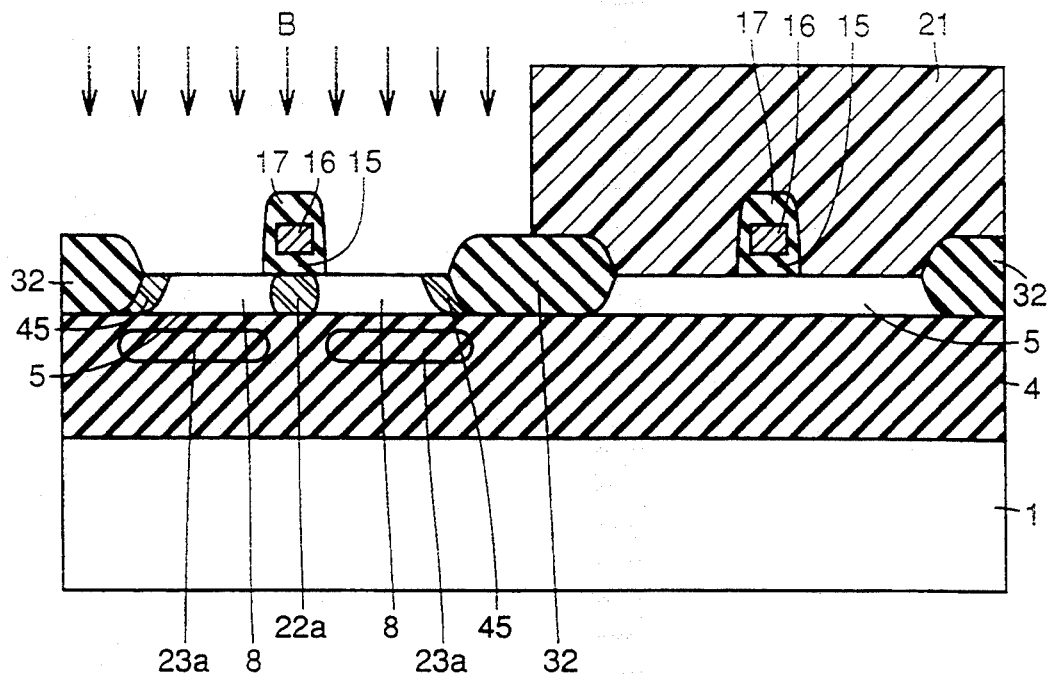
FIGS. 57 and 58 are cross sectional views showing characteristic first and second steps for manufacturing the semiconductor device having the SOI structure shown in FIG. 56.
Figure 58:
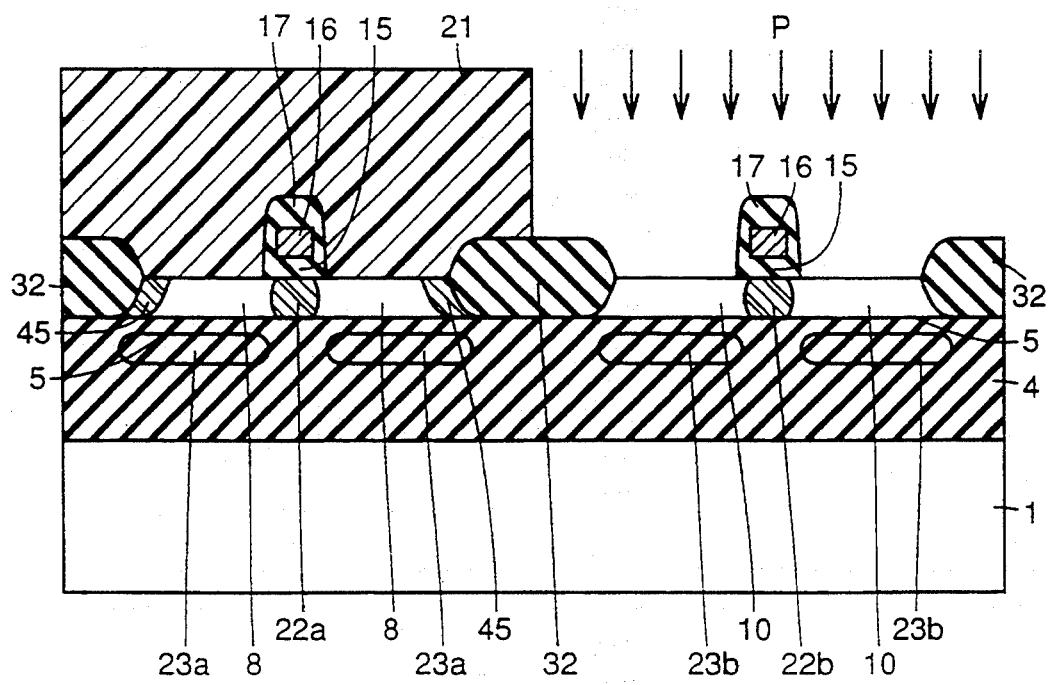

With reference to FIGS. 57 and 58, a method of manufacturing the semiconductor device having the SOI structure shown in FIG. 56 will be described. FIGS. 57 and 58 are cross sectional views showing characteristic first and second steps for manufacturing the semiconductor device having the SOI structure of this embodiment shown in FIG. 56.

As can be seen from FIG. 57, the same steps as in the above third embodiment are carried out to form silicon oxide film 17. Then, resist pattern 21 is formed to cover only the formation region of pMOS 3. Using the resist pattern as a mask, boron (B) ions are implanted into SOI layer 5 at 190 keV for $1-3\times 10^{13}/cm^2$, whereby channel stop region 22a is formed. At this time, impurity implantation region 23a is formed in buried oxide film 4.

With reference to FIG. 58, after removal of resist pattern 21, resist pattern 21 is again formed to cover only the formation region of nMOS. Using resist pattern 21 as a mask, phosphorus (P) ions are implanted into SOI layer 5 at 190 keV for $1-3\times 10^{13}/cm^2$, whereby channel stop region 22b is formed. At this time, impurity implantation region 23b is formed in buried oxide film 4. Then, resist pattern 21 is removed. Then, the same steps as in the first embodiment are carried out to form the semiconductor device having the SOI structure shown in FIG. 56.

(Embodiment 5)

Figure 59:
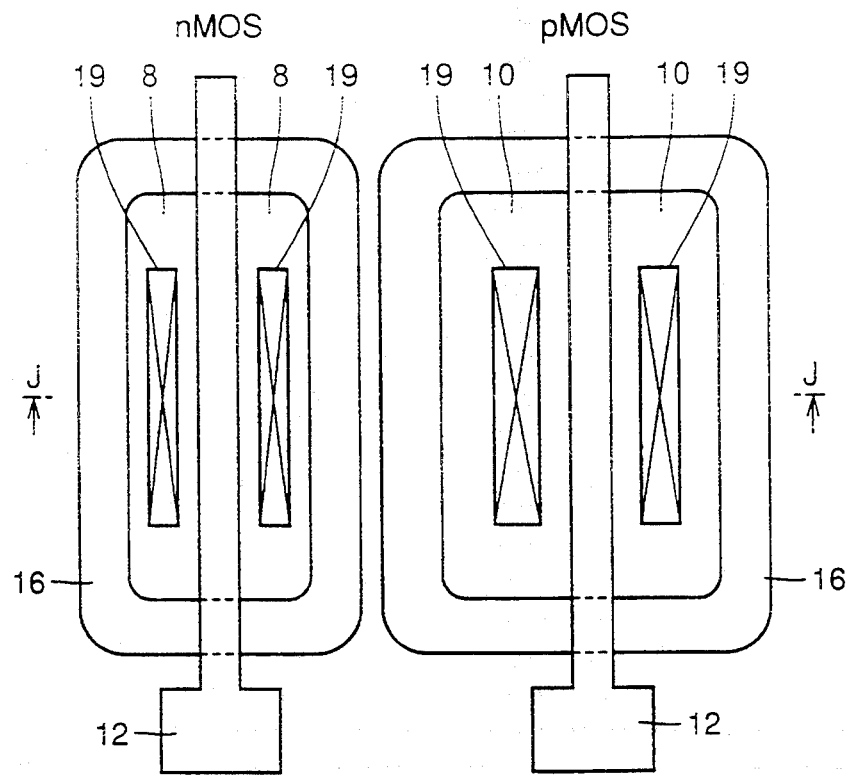
FIG. 59 is a plan view showing a semiconductor device having an SOI structure according to fifth embodiment of the present invention.
Figure 60:
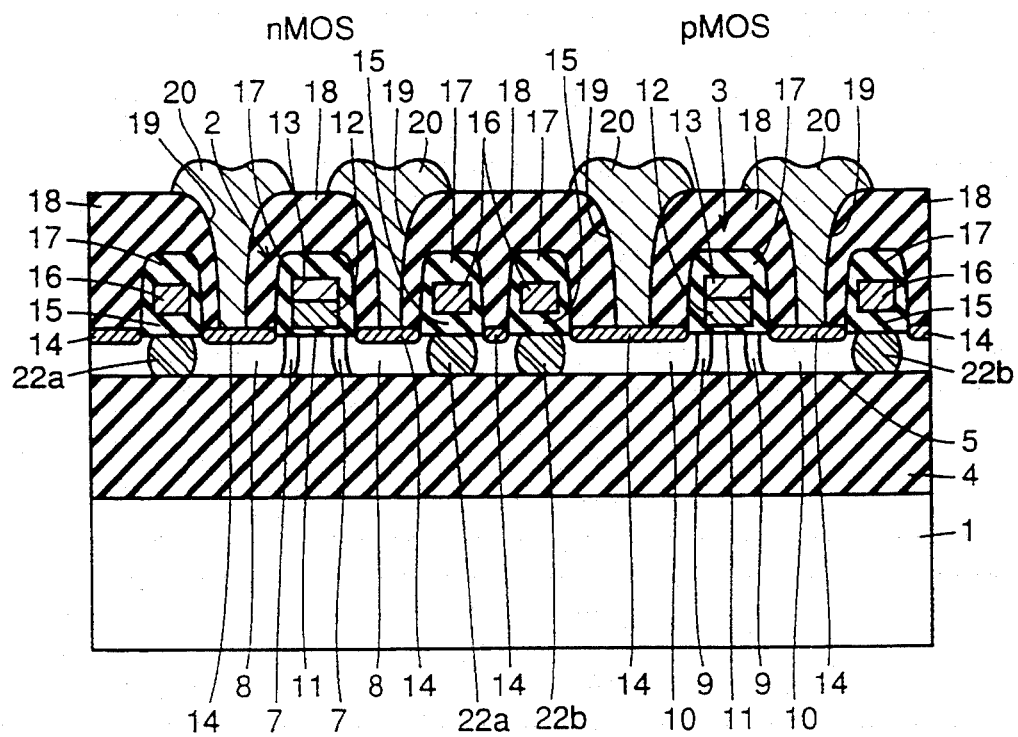
FIG. 60 is a cross sectional view taken along line J—J in FIG. 59.

With reference to FIGS. 59-64, a fifth embodiment of the present invention will be described. FIG. 59 is a plan view showing the semiconductor device having the SOI structure according to the fifth embodiment of the present invention. FIG. 60 is a cross sectional view taken along line J—J in FIG. 59.

As can be seen from FIG. 59, FS gate 16 is formed to enclose formation regions of nMOS 2 and pMOS 3 as in the above first embodiment. Channel stop regions 22a and 22b are respectively formed under the FS gate.

With reference to FIG. 60, unlike the above respective embodiments, an impurity implantation region is not formed in buried oxide film 4 in this embodiment. Since this is attributable to a manufacturing process, the description will be given later. The other parts of the structure are the same as in the semiconductor device having the SOI structure of the first embodiment shown in FIG. 1. Therefore, the same effect as in the first embodiment can be obtained.

With reference to FIGS. 61-64 a method of manufacturing the semiconductor device having the SOI structure according the fifth embodiment of the present invention will be described. FIGS. 61-64 are cross sectional views showing characteristic first through fourth steps for manufacturing the semiconductor device having the SOI structure in this embodiment.

Figure 61:
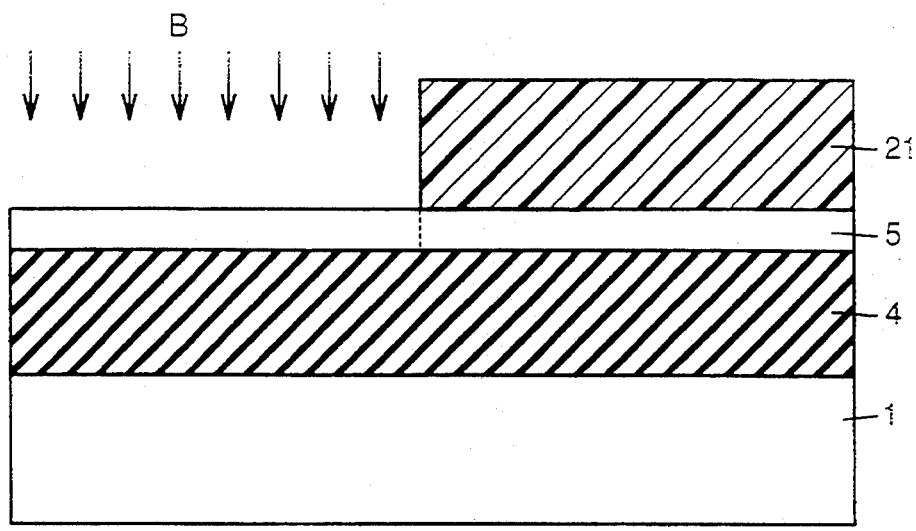
FIGS. 61–64 are cross sectional views showing first through fourth steps in a manufacturing process of the semiconductor device having the SOI structure shown in FIG. 60.

As can be seen from FIG. 61, the same steps as in the above first embodiment are carried out to form the SOI structure. Resist pattern 21 is then formed to cover only the formation region of pMOS. Using resist pattern 21 as a mask, boron (B) ions are implanted into SOI layer 5 at 20 keV for $1-3\times 10^{13}/cm^2$ for forming channel stop region 22a. Then, resist pattern 21 is removed.

Figure 62:
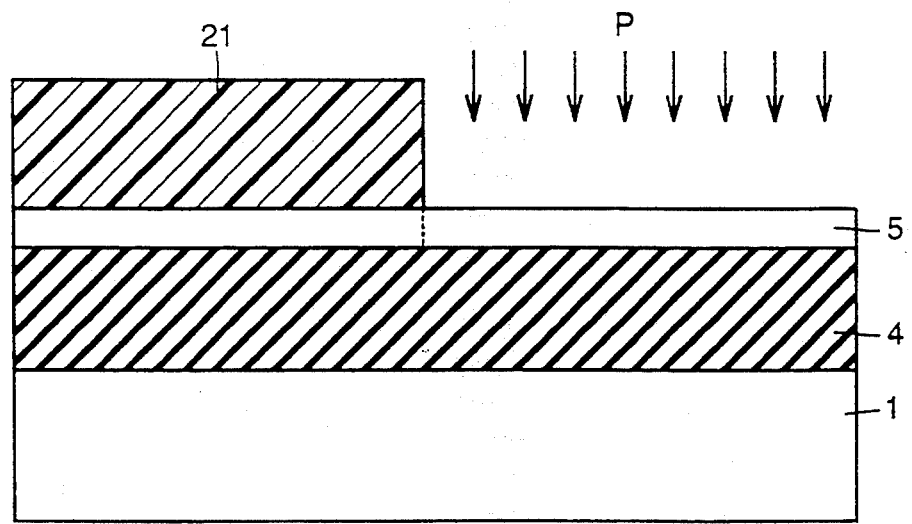

With reference to FIG. 62, resist pattern 21 is formed to cover only the formation region of nMOS. Using resist pattern 21 as a mask, phosphorus (P) ions are implanted into SOI layer at 30 keV for $1-3\times 10^{13}/cm^2$ for forming channel stop region 22b. Then, resist patter 21 is removed.

Figure 63:
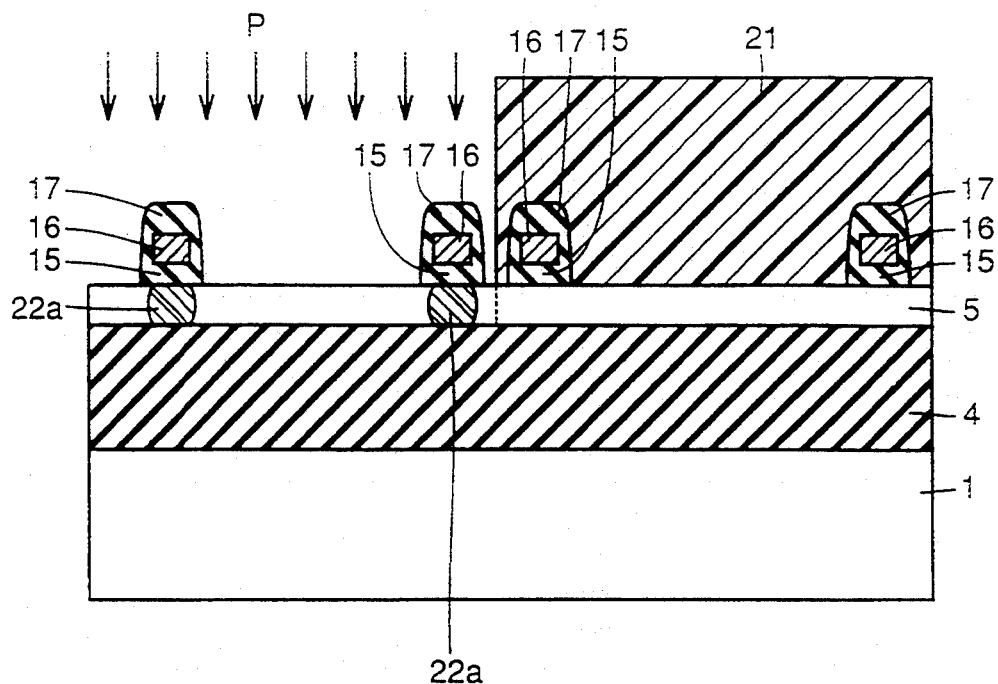

With reference to FIG. 63, gate oxide film 15, FS gate 16 and silicon oxide film 17 are formed by the same steps as in the above first embodiment. Then, resist pattern 21 is formed to cover only the formation region of pMOS. At this time, since resist pattern 21 can be formed by using the same mask as is shown in FIG. 61, the manufacturing cost can be suppressed as in the above respective embodiments. Using resist pattern 21 and FS gate 16 as a mask, phosphorus (P) ions are implanted into SOI layer 5 at 20 keV for $8-9 \times 10^{12}/cm^2$, whereby channel doping of nMOS is carried out and channel stop region 22a is formed only under FS gate 16. At this time, implantation of impurities into SOI layer 5 is carried out twice for boron (B) and phosphorus (P), thus incurring concern over degradation of a crystal characteristic of SOI layer 5 in the nMOS formation region. In this case, degradation of the crystal characteristic of SOI layer 5 can be prevented effectively by the method shown in the above first embodiment.

Figure 64:
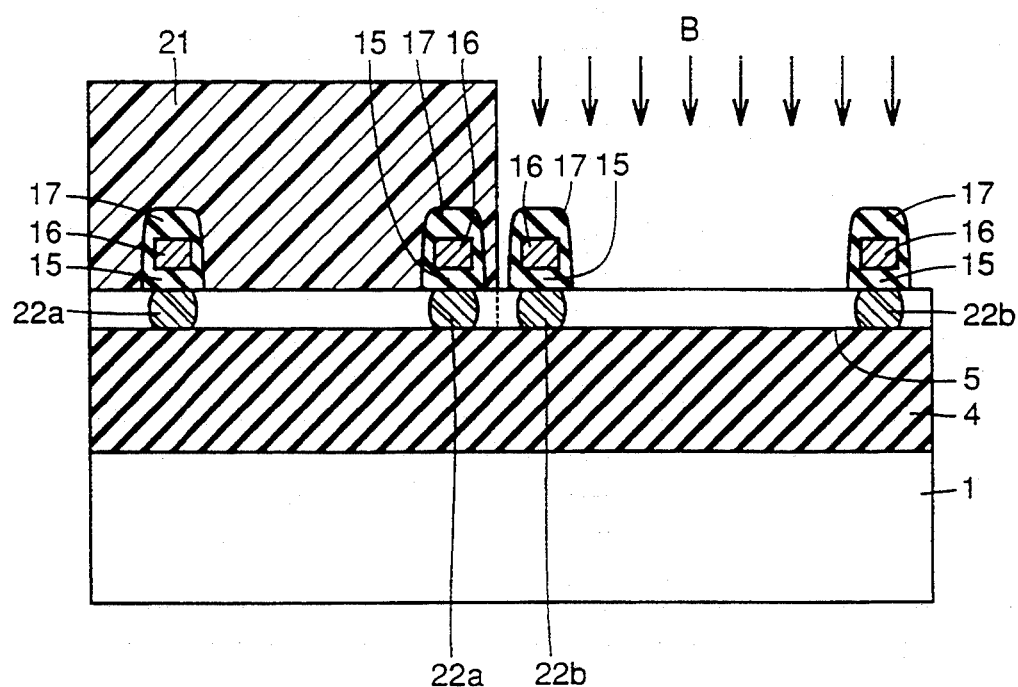

With reference to FIG. 64, resist pattern 21 is formed to cover only the nMOS formation region. Using resist pattern 21 and FS gate 16 as a mask, boron (B) ions are implanted into SOI layer 5 at 30 keV for $0.95-1.25 \times 10^{13}/cm^2$, whereby channel doping of the pMOS is carried out and channel stop region 22b is formed under FS gate 16. Then, resist pattern 21 is removed. Thus, the same steps as in the first embodiment are carried out to form the semiconductor device having the SOI structure shown in FIG. 60. Unlike the above respective embodiments, the impurity implantation region is not formed in buried oxide film 4, since channel stop regions 22a and 22b are formed by the above steps.

(Embodiment 6)

Figure 65:
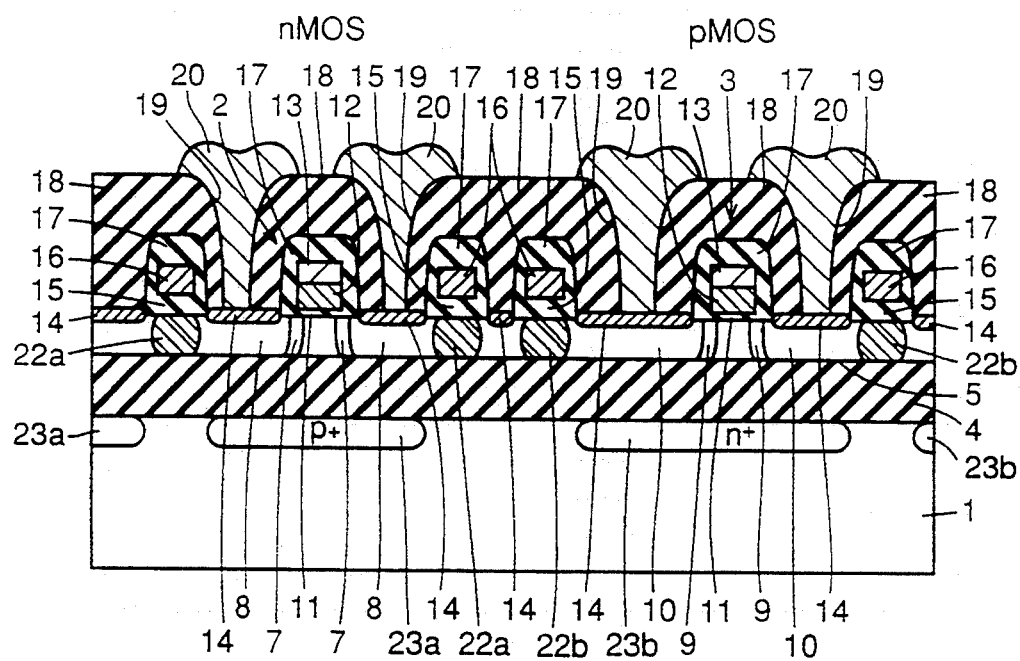
FIG. 65 is a cross sectional view showing a semiconductor device having an SOI structure according to a sixth embodiment of the present invention.

Now, with reference to FIGS. 65-67, a sixth embodiment of the present invention will be described. FIG. 65 is a cross sectional view of the semiconductor device having the SOI structure according to the sixth embodiment of the present invention. As can be seen from FIG. 65, impurity implantation regions 23a and 23b are respectively formed in portions located directly under formation regions of nMOS 2 and pMOS 3 on the main surface of the silicon substrate 1. More specifically, impurity implantation region 23a including the p type impurity at a high concentration is formed on the main surface of silicon substrate 1 located directly under nMOS2, while the impurity implantation region 23b including the n type impurity at a high concentration is formed on the main surface of silicon substrate 1 located directly under the formation region of pMOS 3. The other parts of the structure are the same as in the first embodiment shown in FIG. 1.

In an ordinary semiconductor device having the SOI structure, a potential at the bottom surface of silicon substrate 1 is grounded. Therefore, a potential at the bottom surface of either nMOS 2 or pMOS 3 is fixed through buried oxide film 4 depending on whether silicon substrate 1 is the p type or the n type. For instance, if silicon substrate 1 is the p type, the potential at the bottom surface of nMOS 2 is fixed at 0 V, whereby a leak current between source and drain of nMOS 2 can be restrained. In this case, since impurity implantation region 23b including the n type impurity at a high concentration is formed under pMOS 3, the potential at the bottom surface of pMOS 3 can be suppressed at a potential equivalent to a difference in work function (at least 1 V). Thus, impurity implantation regions 23a and 23b are respectively formed on the main surface of silicon substrate 1, so that a high performance CMOS can be obtained.

Now, a method of manufacturing the semiconductor device having the SOI structure shown in FIG. 65 will be described with reference to FIGS. 66 and 67. FIG. 66 and 67 are cross sectional views showing characteristic first and second steps for manufacturing the semiconductor device having the SOI structure in this embodiment.

Figure 66:
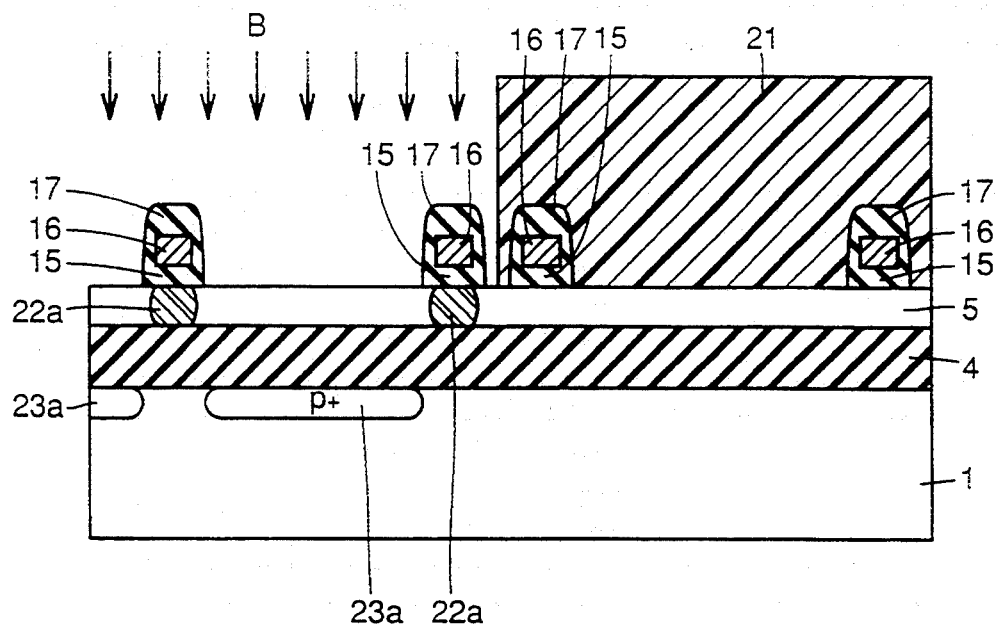
FIGS. 66 and 67 are cross sectional views showing characteristic first and second steps in a manufacturing process of the semiconductor device having the SOI structure shown in FIG. 65.

With reference to FIG. 66, the same steps as in the first embodiment are carried out to form silicon oxide film 17. Then, resist pattern 21 is formed to cover only the formation region of pMOS 3. Using resist pattern 21 as a mask, boron (B) ions are implanted into SOI layer 5. At this time, unlike the above respective embodiments, conditions such as implantation energy are set such that implanted boron (B) has a peak concentration in SOI layer 5 located directly under FS gate 16 and in the main surface of silicon substrate 1 located directly under the formation region of nMOS 2. Based on such a condition, channel stop region 22a and impurity implantation region 23a are formed. Therefore, a concentration of boron (B) included in channel stop region 22a is almost equal to that included in impurity implantation region 23a. Then, resist patter 21 is removed.

Figure 67:
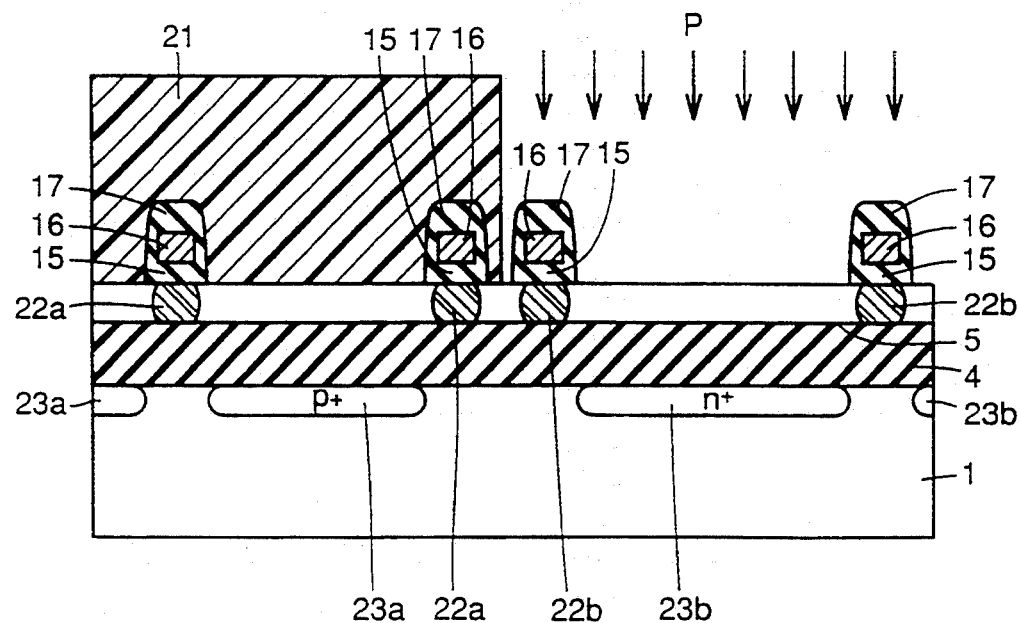

With reference to FIG. 67, resist pattern 21 is formed to cover only the formation region of nMOS 2. Using resist pattern 21 as a mask, phosphorus (P) is implanted into SOI layer 5. As in the above example, conditions such as the implantation energy of phosphorus (P) are set such that a peak concentration of phosphorus (P) is in SOI layer 5 located directly under FS gate 16 and in the main surface of silicon substrate 1 located directly under the formation region of pMOS 3. Channel stop region 22b and impurity implantation region 23b are thus formed. Therefore, a concentration of phosphorus (P) included in channel stop region 22b is almost equal to that included in impurity implantation region 23b. Then, resist pattern 21 is removed. The same steps as in the first embodiment are carried out subsequently to form the semiconductor device having the SOI structure of this embodiment.

(Embodiment 7)

Figure 68:
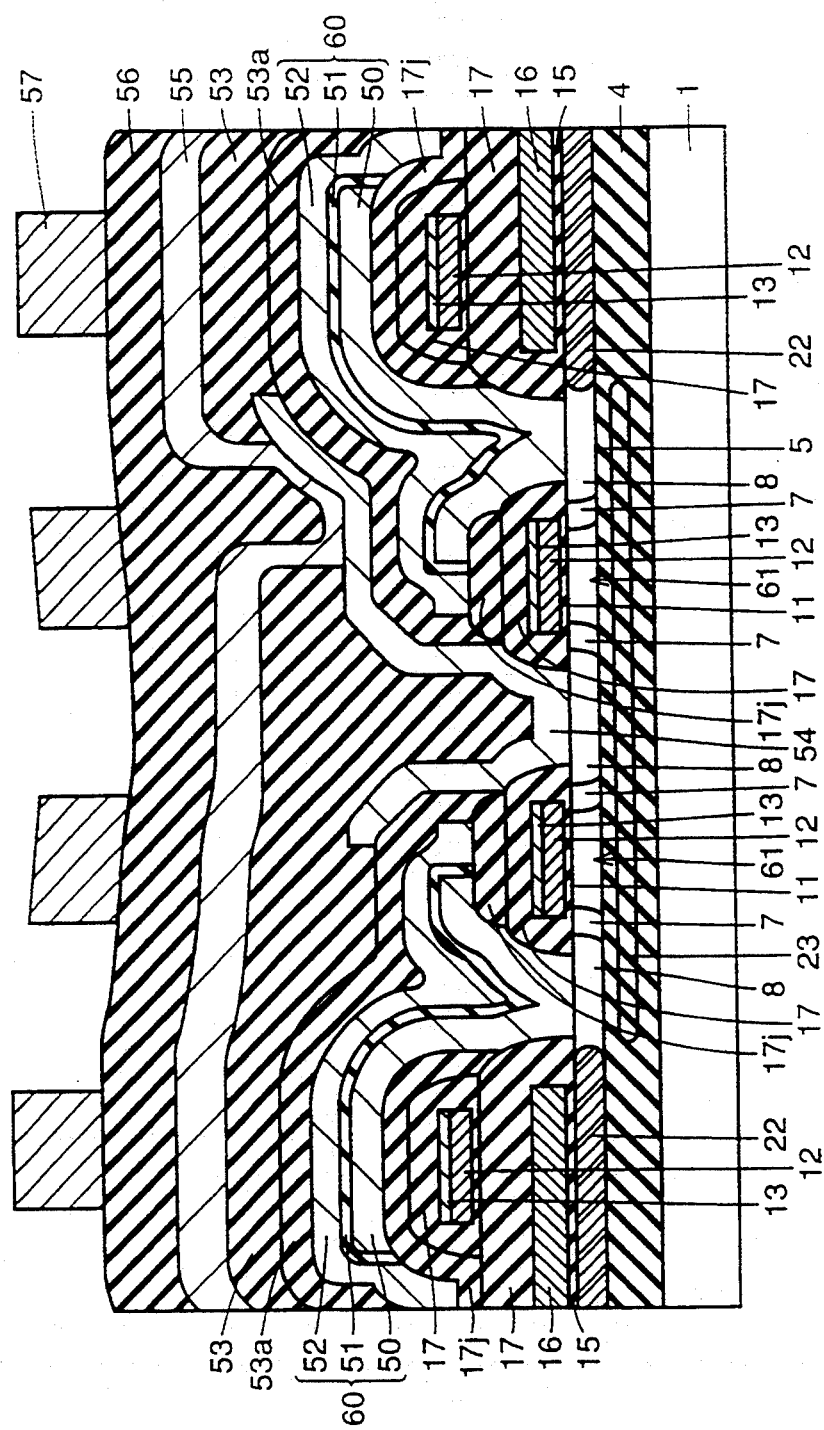
FIG. 68 is a cross sectional view showing a semiconductor device having an SOI structure according to a seventh embodiment of the present invention.
Figure 69:
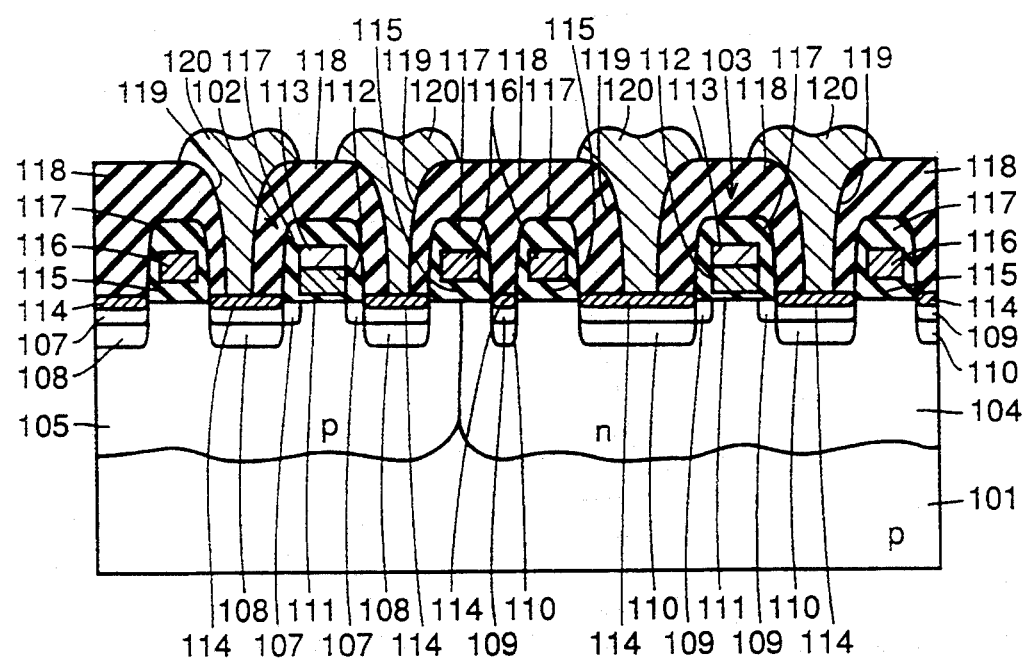
FIG. 69 is a cross sectional view showing a conventional semiconductor device in which field shield isolation is carried out on a bulk silicon substrate.
Figure 70:
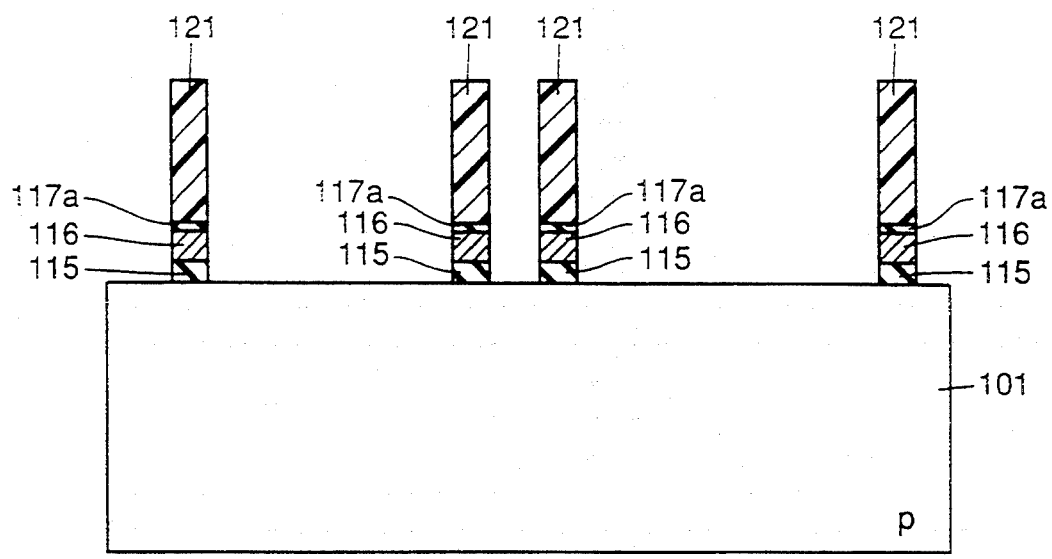
FIGS. 70-82 are cross sectional views showing first through thirteenth steps of a manufacturing process of the semiconductor device shown in FIG. 69.
Figure 71:
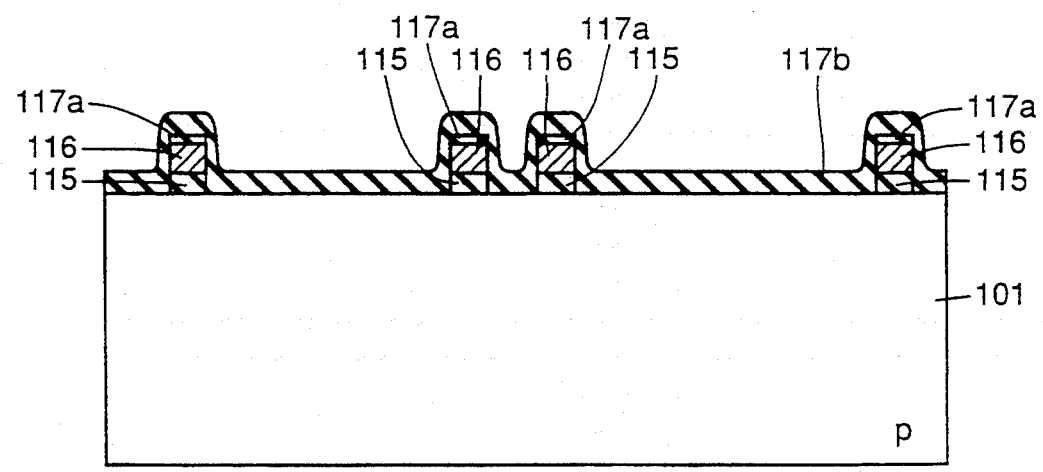
Figure 72:
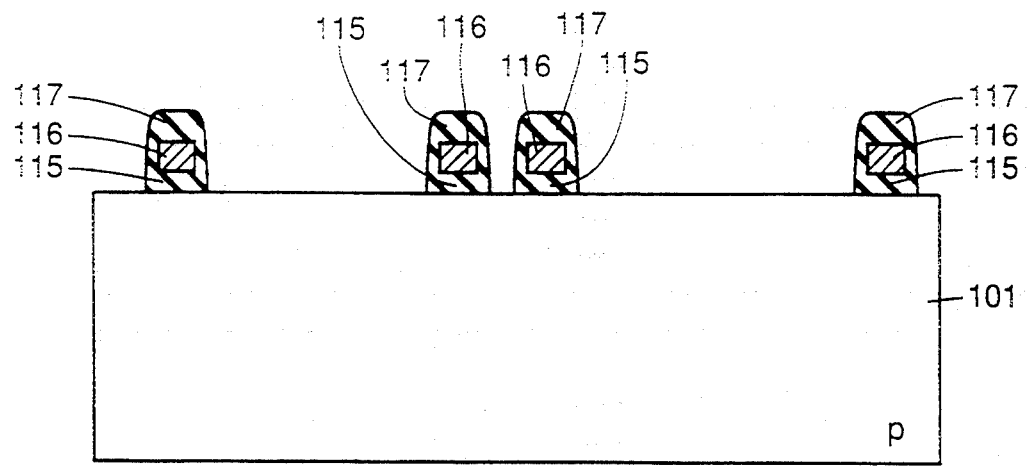
Figure 73:
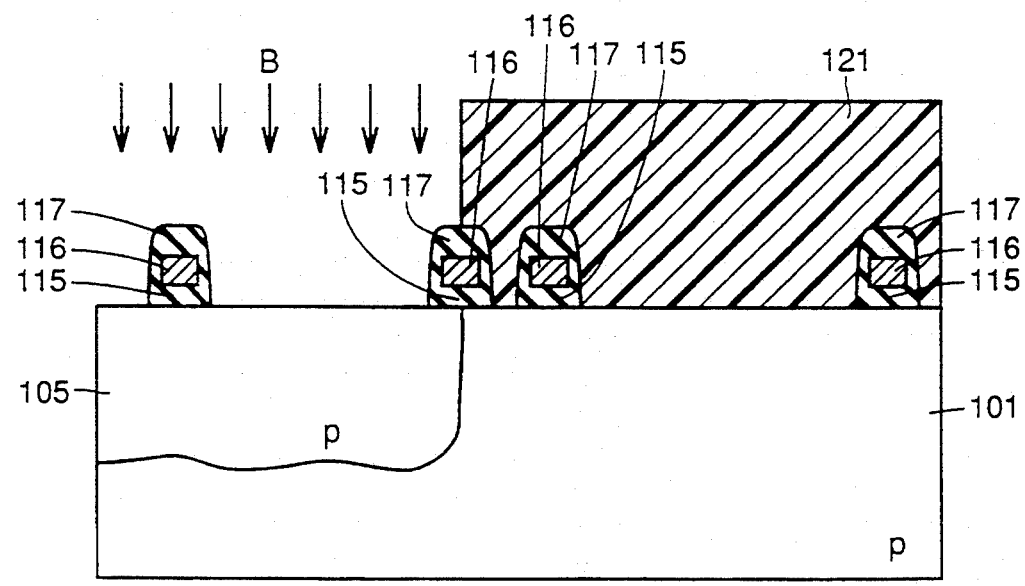
Figure 74:
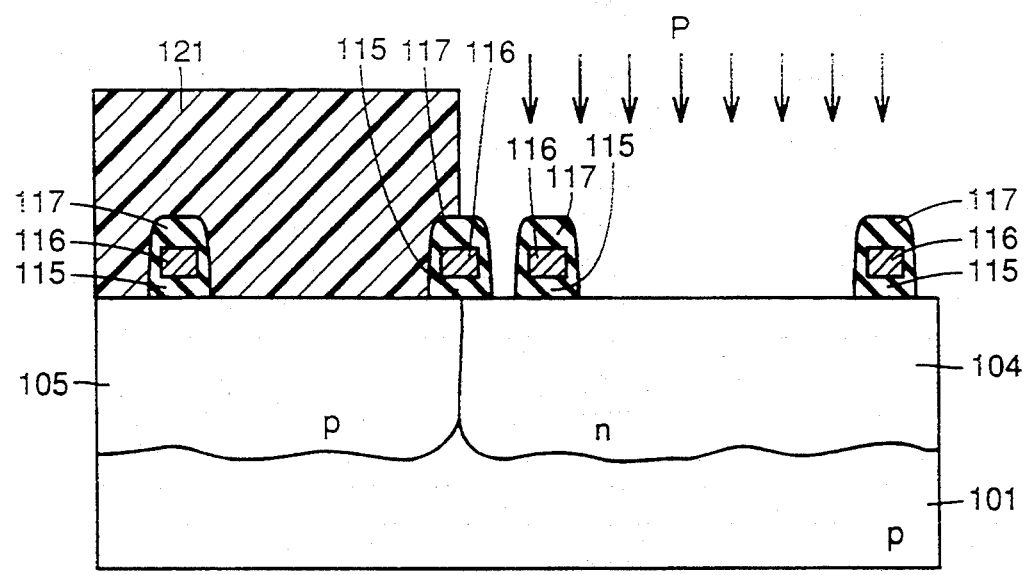
Figure 75:
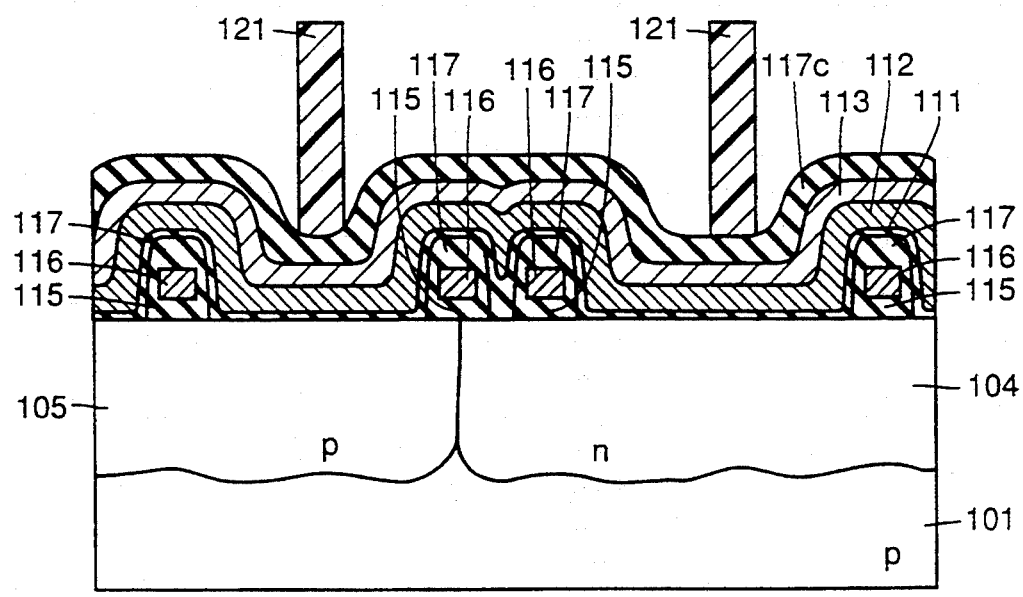
Figure 76:
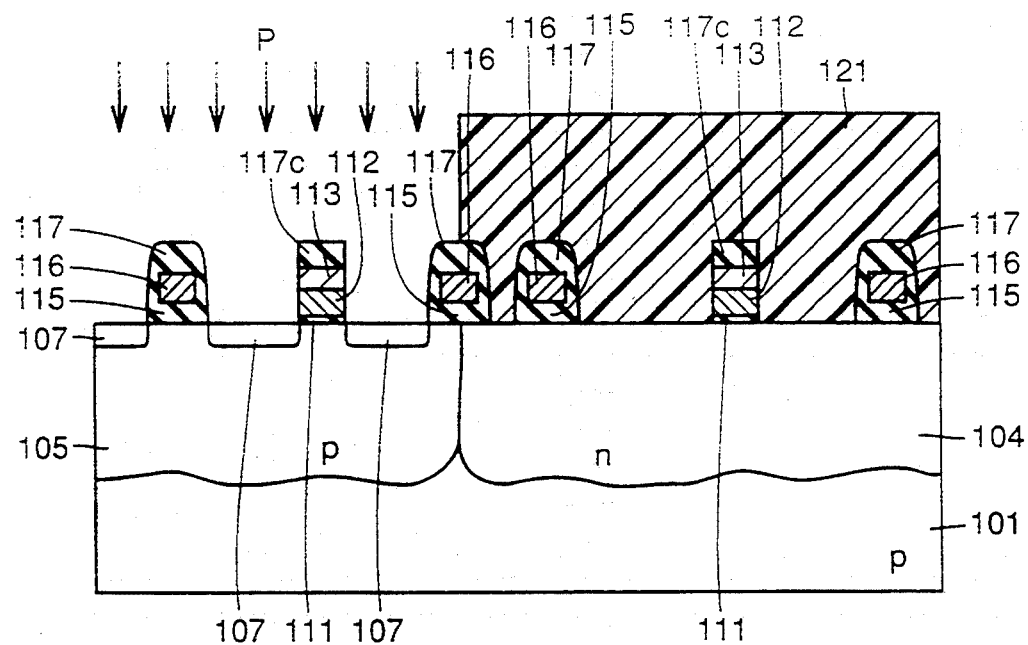
Figure 77:
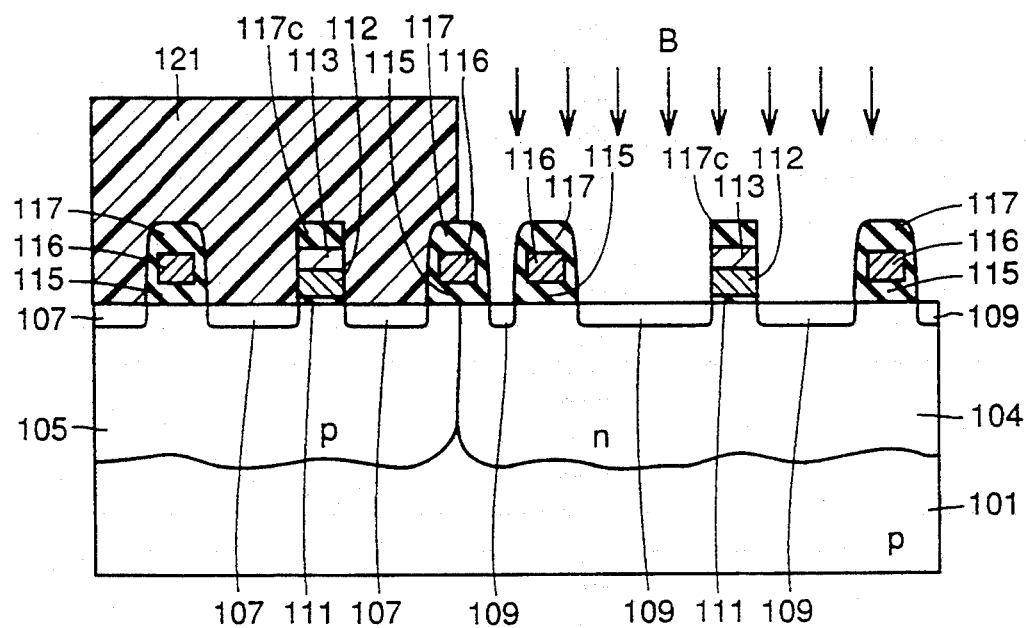
Figure 78:
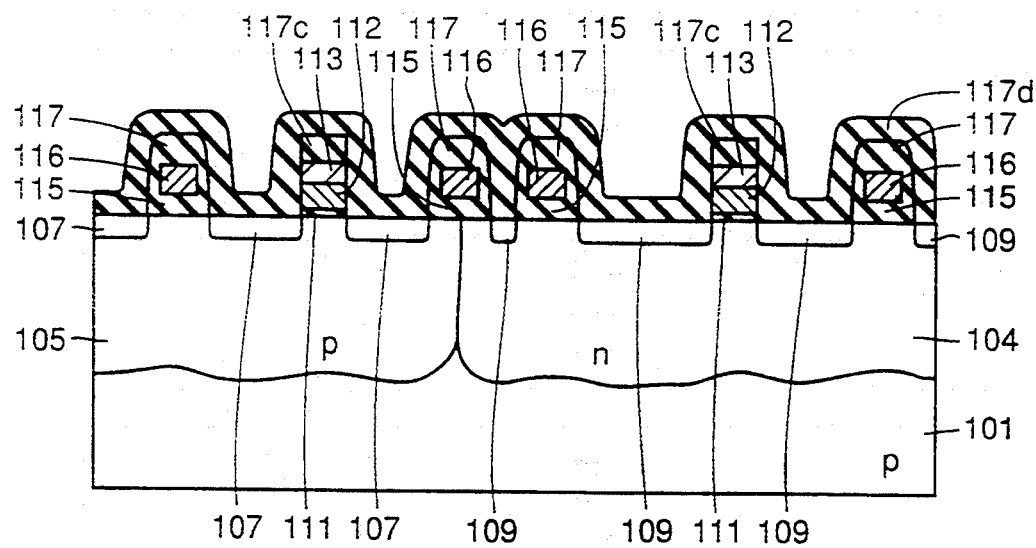
Figure 79:
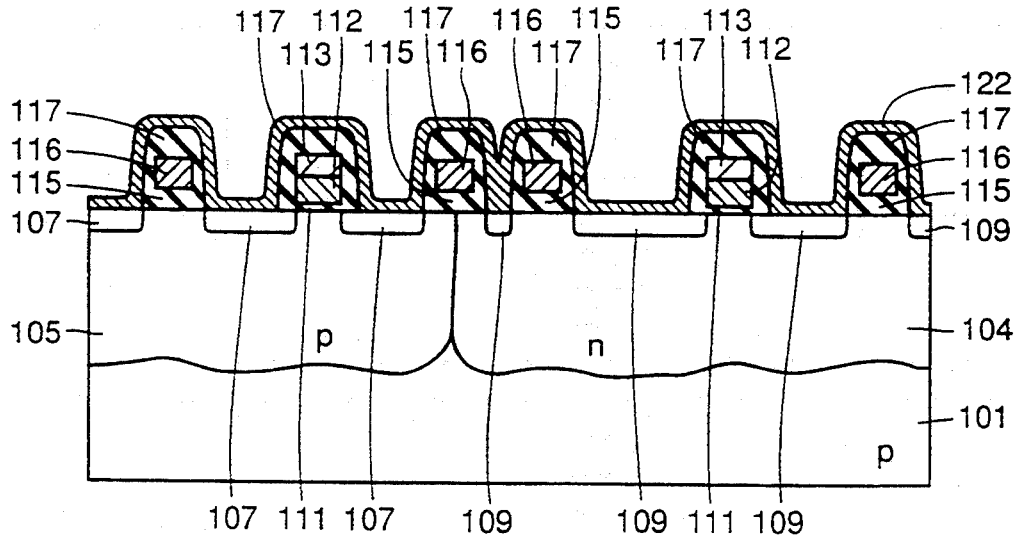
Figure 80:
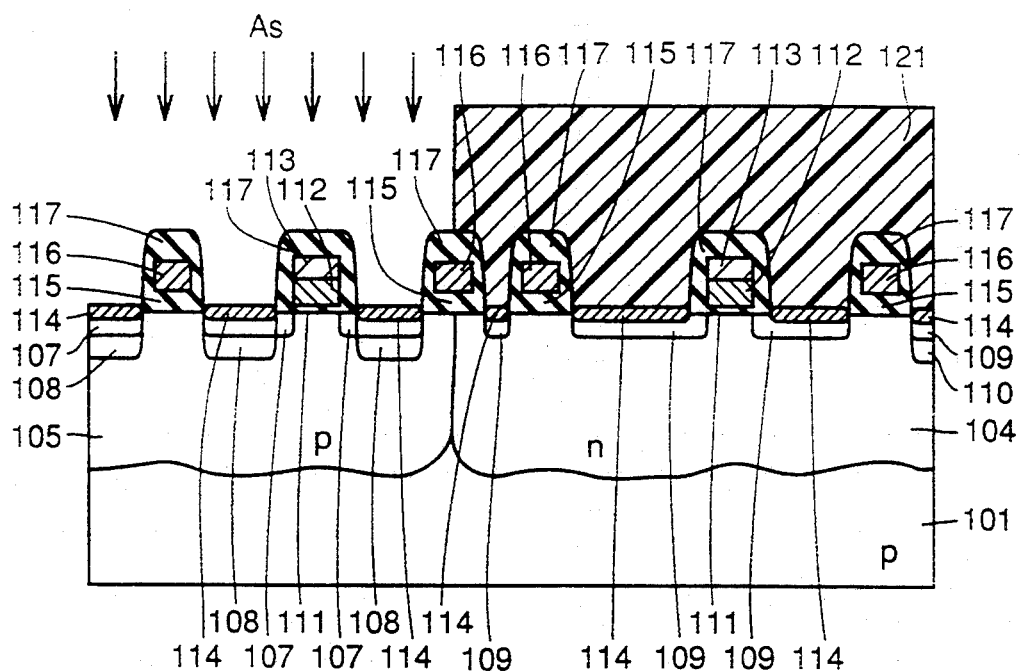
Figure 81:
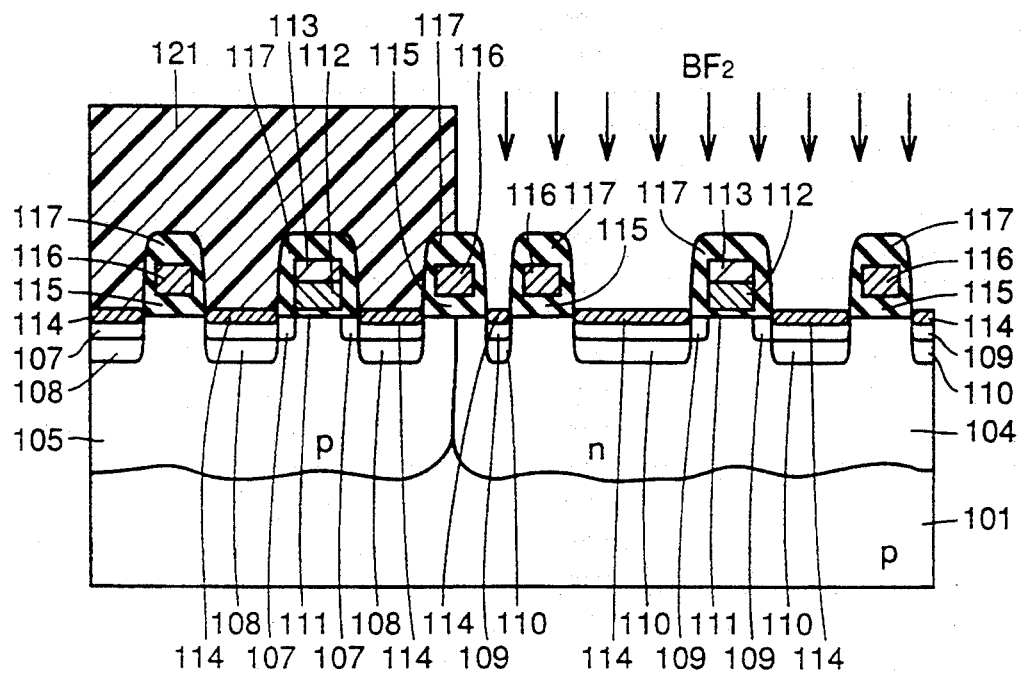
Figure 82:
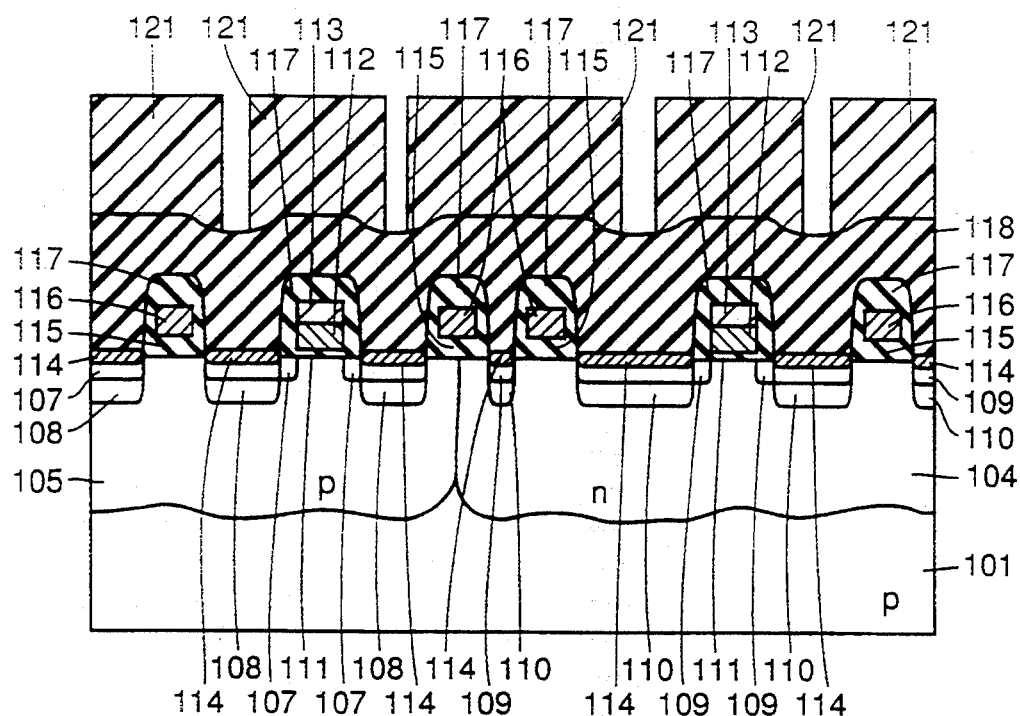
Figure 83:
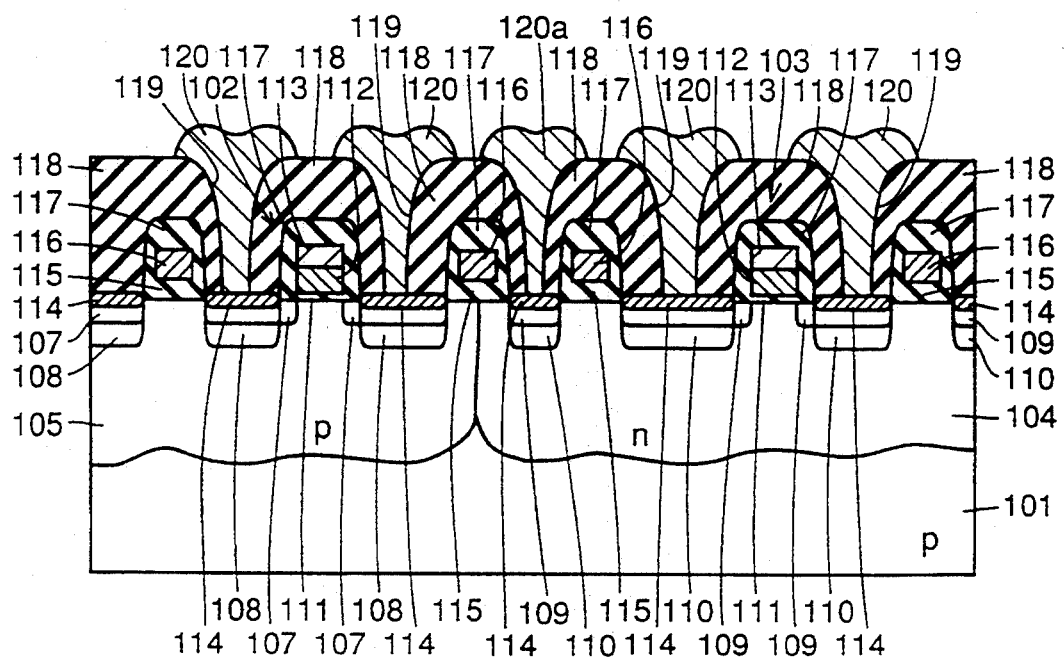
FIG. 83 is a cross sectional view showing an electrode formed connected to a power supply Vcc between FS gates in the semiconductor device shown in FIG. 69.
Figure 84:
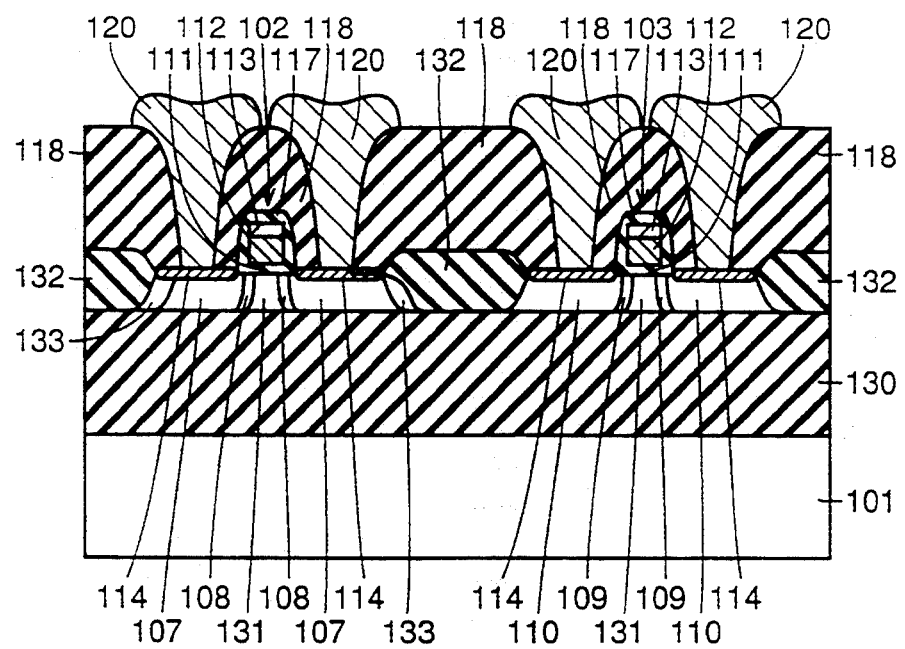
FIG. 84 is a cross sectional view showing a conventional semiconductor device having an SOI structure.
Figure 85:
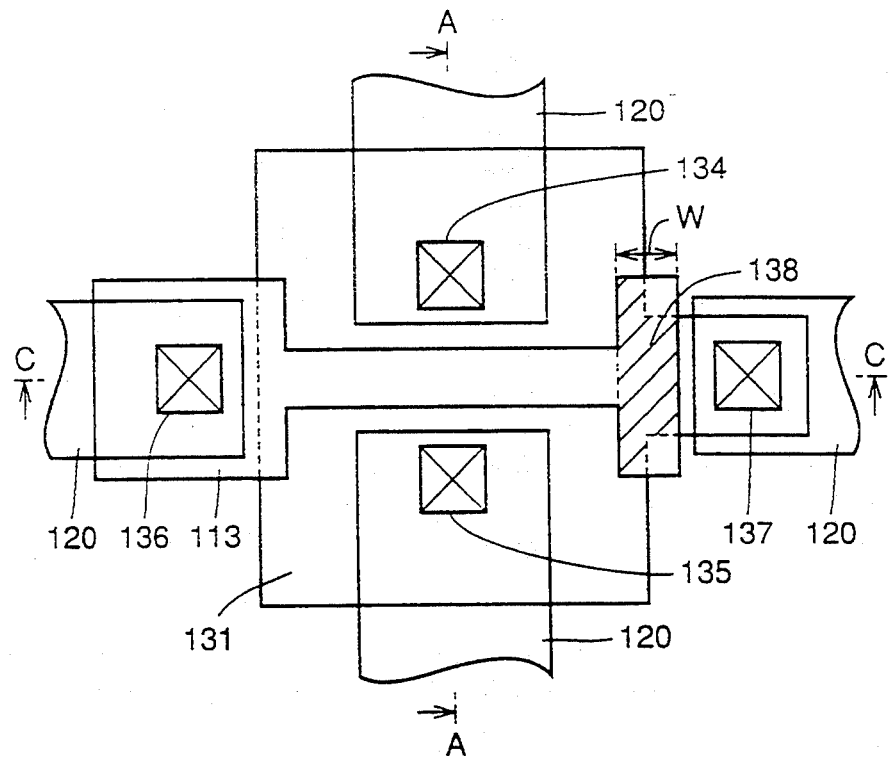
FIG. 85 is a plan view showing an nMOS region in an improved conventional semiconductor device having the SOI structure.
Figure 86:
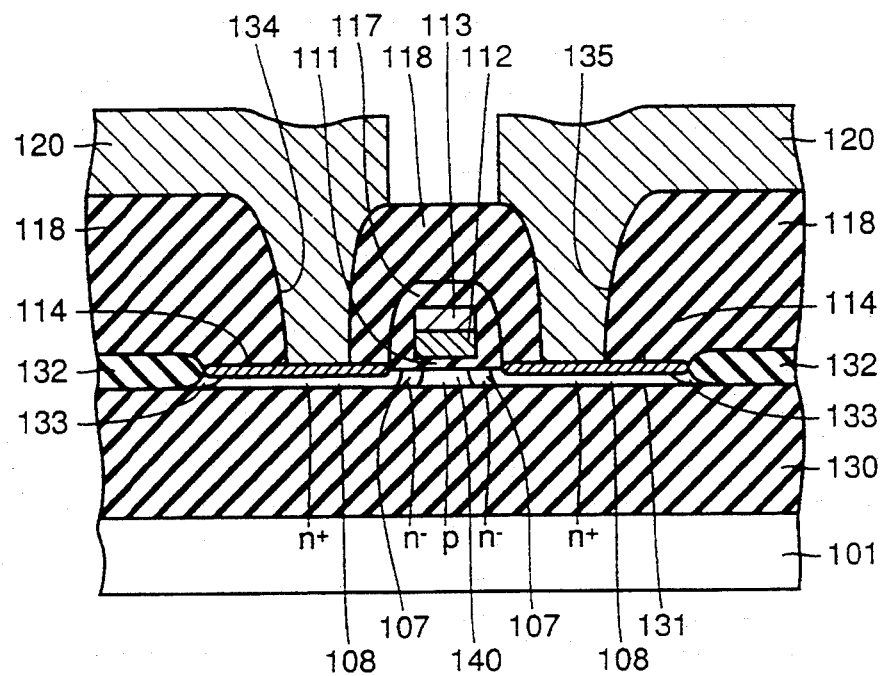
FIG. 86 is a cross sectional view taken along line A—A in FIG. 85.
Figure 87:
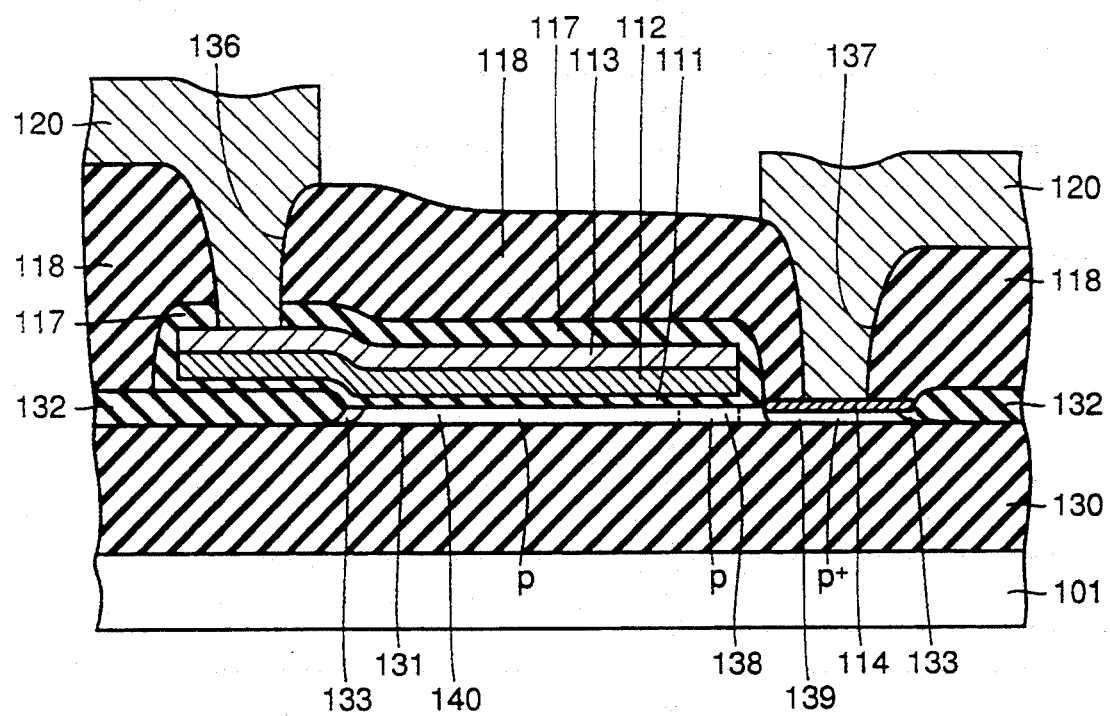
FIG. 87 is a cross sectional view taken along line C—C in FIG. 85.

With reference to FIG. 68, a seventh embodiment of the present invention will be described. FIG. 68 is a cross sectional view showing the semiconductor device having the SOI structure according to the seventh embodiment of the present invention.

With reference to FIG. 7, the present invention is applied to a DRAM (Dynamic Random Access Memory) having the SOI structure in this embodiment.

As can be seen from FIG. 68, a buried oxide film 4 is formed on a main surface of a silicon substrate 1. An SOI layer 5 is formed on buried oxide film 4. A transfer gate transistor 61 is formed at a predetermined position in SOI layer 5. Transfer gate transistor 61 includes an $n^-$ diffusion region 7, an $n^+$ diffusion region 8, and a gate electrode 12. Gate electrode 12 is formed on a channel region sandwiched by a pair of $n^-$ diffusion regions 7 with a gate oxide film 11 interposed therebetween. A $WSi_2$ layer 13 is formed on gate electrode 12.

In the meanwhile, a channel stop region 22 is formed in an element isolation region in SOI layer 5. The p type impurity having a high concentration is introduced into channel stop region 22, as in the above respective embodiments. A concentration of the p type impurity included in channel stop region 22 is set higher than that of the p type impurity included in the channel region of transfer gate transistor 61. An FS gate 16 is formed on channel stop region 22 with an FS gate oxide film 15 interposed therebetween. A silicon oxide film 17 is formed to cover FS gate 16 and gate electrode 12.

An impurity implantation region 23 is formed in a portion located under transfer gate transistor 61 in buried oxide film 4. A polycrystalline silicon pad 54 is formed on n+ diffusion region 8 which is one of diffusion regions of transfer gate transistor 61. On the other hand, a storage node 50 is formed on n+ diffusion region 9 which is the other diffusion region of transfer gate 61. A capacitor dielectric film 51 is formed on the surface of storage node 50. A cell plate 52 is formed to cover capacitor dielectric film 51. A capacitor 60 is formed by cell plate 52, capacitor dielectric film 51, and storage node 50.

An interlayer insulating layer 53a is formed to cover cell plate 52. An interlayer insulating layer 53 is further formed on interlayer insulating layer 53a. A contact hole is provided in a portion located on polycrystalline silicon pad 54 in interlayer insulating layer 53. A bit line 55 is formed from the contact hole to extend onto interlayer insulating layer 54. Preferably, bit line 55 is made of WSi$_2$. An interlayer insulating layer 56 is formed to cover bit line 55. An interconnection layer 57 made of a material including Al is formed on interlayer insulating layer 56.

In the DRAM having the above structure, as in the first embodiment, excessive carriers generated in the channel region of transfer gate transistor 61 can efficiently be drawn out externally through channel stop region 22, whereby the DRAM of a high reliability can be obtained. It is noted that characteristic parts included in the above respective embodiments are applicable to other embodiments.

As described above, in the semiconductor device having the SOI structure according to the present invention, excessive carriers generated in the channel region of the MOS transistor can be drawn out effectively, whereby the parasitic bipolar operation can be suppressed effectively. Consequently, the semiconductor device having the SOI structure which has excellent performance and reliability can be obtained.

Also, in the method of manufacturing the semiconductor device having the SOI structure according to the present invention, the channel stop region can be formed by using the same mask as is used during channel doping of the MOS transistor. Therefore, increase of the number of masks can be prevented, thus suppressing the manufacturing cost. More particularly, the semiconductor device having the SOI structure which has excellent performance and reliability can be obtained at the suppressed manufacturing cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an SOI structure, comprising:

a semiconductor substrate having a main surface;

an insulating layer formed on the main surface of said semiconductor substrate;

a semiconductor layer formed on said insulating layer and having an element formation region and an element isolation region;

a channel region formed in said element formation region of said semiconductor layer and including a first conductivity type impurity of a first concentration;

a pair of impurity diffusion regions of a second conductivity type formed to sandwich said channel region in said element formation region;

a gate electrode formed on said channel region with an insulating layer interposed therebetween;

a channel stop region formed in said element isolation region of said semiconductor layer so as to be connected to said channel region, and including the first conductivity type impurity of a second concentration higher than said first concentration; and a field shield gate formed on said channel stop region with an insulating layer interposed therebetween.

2. The semiconductor device having an SOI structure according to claim 1, wherein
   said semiconductor layer has a thickness greater than the maximum width of a depletion layer in a direction of depth formed in said channel stop region.

3. The semiconductor device having an SOI structure according to claim 2, wherein
   said semiconductor layer has a thickness twice the maximum width of said depletion layer in a direction of depth.

4. The semiconductor device having an SOI structure according to claim 1, wherein
   said field shield gate has a multi-layered structure including a first layer made of polycrystalline silicon and a second layer made of a material having a larger atomic weight than silicon.

5. The semiconductor device having an SOI structure according to claim 4, wherein
   said second layer is made of at least one kind of material selected from the group consisting of a metal, a metal oxide, a metal nitride, and a silicide.

6. The semiconductor device having an SOI structure according to claim 4, wherein
   said second layer is made of a metal silicide formed on said first layer,
   said field shield gate further includes a third layer made of a metal on said second layer, and
   a barrier layer for suppressing a reaction between said first and third layers is formed between said second and third layers.

7. The semiconductor device having an SOI structure according to claim 6, wherein
   said barrier layer is made of at least one kind of material selected from the group consisting of a silicon oxide film, a silicon nitride film, a metal oxide, and a metal nitride.

8. The semiconductor device having an SOI structure according to claim 1, wherein
   a second impurity diffusion region of the first conductivity type is formed at a portion located directly under said element formation region in the main surface of said semiconductor substrate.

9. The semiconductor device having an SOI structure according to claim 1, wherein
   assuming an impurity concentration of the first conductivity type included in said channel stop region is represented by $N_A$, Boltzmann's constant by k, an absolute temperature by T, a dielectric constant of silicon by $\epsilon S$, charge by q, and a density of holes (electrons) in a vacuum semiconductor by ni, a thickness $t_{SOI}$ of said semiconductor layer can be expressed as:

$$t_{SOI} > \sqrt{\frac{4\epsilon_s kT \ln(N_A/ni)}{q^2 N_A}}.$$

10. The semiconductor device having an SOI structure according to claim 1, wherein
the first conductivity type impurity having an approximately the same concentration as that of the first conductivity type impurity included in said channel stop region is included within said insulating layer located directly under said semiconductor layer in said element formation region.

11. The semiconductor device having an SOI structure according to claim 1, wherein
said semiconductor device having an SOI structure is a DRAM (Dynamic Random Access Memory).

12. A semiconductor device having an SOI structure, comprising:
a semiconductor substrate having a main surface;
an insulating layer formed on the main surface of said semiconductor substrate;
a semiconductor layer formed on said insulating layer;
a channel region formed in said semiconductor layer and including a first conductivity type impurity of a first concentration;
a pair of impurity diffusion regions of a second conductivity type formed in said semiconductor layer so as to sandwich said channel region;
a gate electrode of a MOS transistor formed on said channel region with an insulating layer interposed therebetween;
a channel stop region including the first conductivity type impurity of a second concentration higher than said first concentration, and formed in said semiconductor layer so as to be connected to both ends of said channel region and to enclose said channel region and said pair of impurity diffusion regions;
a field shield gate formed on said channel stop region with an insulating layer interposed therebetween;
an interlayer insulating layer formed to cover said field shield gate and said gate electrode, and having a contact hole which penetrates through a part of said field shield gate to reach the surface of said channel stop region; and
an electrode formed in said contact hole for drawing out an excessive carrier generated in said channel region externally through said channel stop region.

13. The semiconductor device having an SOI structure according to claim 12, wherein
a second impurity diffusion region including the first conductivity type impurity of a third concentration higher than said second concentration is formed in the surface of said semiconductor layer under said electrode.

14. A semiconductor device having an SOI structure, comprising:
a semiconductor substrate having a main surface;
an insulating layer formed on the main surface of said semiconductor substrate;
a semiconductor layer formed on said insulating layer and including an element isolation region and an element formation region;
a channel region formed in said element formation region of said semiconductor layer and including a first conductivity type impurity of a first concentration;
a pair of impurity diffusion regions of a second conductivity type formed in said element formation region so as to sandwich said channel region;
a gate electrode formed on said channel region with an insulating layer interposed therebetween;
an isolation insulating layer formed selectively in the element isolation region of said semiconductor layer;
a channel stop region formed in a region of said element isolation region where said isolation insulating layer is not formed so as to be connected to said channel region, and including the first conductivity type impurity of a second concentration higher than said first concentration; and
a field shield gate formed on said channel stop region with an insulating layer interposed therebetween.

15. The semiconductor device having an SOI structure according to claim 14, wherein:
one end of said channel region is connected to said channel stop region, and the other end of said channel region is connected to said isolation insulating layer.

16. A semiconductor device having an SOI structure comprising:
a semiconductor substrate having a main surface;
an insulating layer formed on said main surface of said semiconductor substrate;
a semiconductor layer formed on said insulating layer and including an element formation region and an element isolation region;
first and second channel regions formed in the element formation region of said semiconductor layer and including a first conductivity type impurity of a first concentration;
a pair of first impurity diffusion regions of the second conductivity type formed within said element formation region so as to sandwich said first channel region;
a pair of second impurity diffusion regions of a second conductivity type formed within said element formation region so as to sandwich said second channel region;
first and second gate electrodes formed on said first and second channel regions with an insulating layer interposed therebetween;
an isolation insulating layer formed in the element isolation region of said semiconductor layer so as to enclose said first and second impurity diffusion regions;
a channel stop region formed connected to said first and second channel regions between said first and second impurity diffusion regions, and including the first conductivity type impurity of a second concentration higher than said first concentration; and
a field gate formed on said channel stop region with an insulating layer interposed therebetween.

17. A method of manufacturing a semiconductor device having an SOI structure, comprising the steps of:
forming a semiconductor layer on a main surface of a semiconductor substrate with an insulating layer interposed therebetween for forming an SOI (Semiconductor On Insulator) substrate;

forming a field shield gate on a predetermined region of said semiconductor layer with an insulating layer interposed therebetween;

implanting a first conductivity type impurity so as to penetrate through said field shield gate to reach said semiconductor layer for forming a channel stop region in the semiconductor layer located under said field shield gate; and forming a MOS transistor at a predetermined region on said semiconductor layer.

18. A method of manufacturing a semiconductor device having an SOI structure, comprising the steps of:

forming a semiconductor layer on a main surface of a semiconductor substrate with an insulating layer interposed therebetween for forming an SOI (Semiconductor On Insulator) substrate;

implanting a first conductivity type impurity on the entire surface of said semiconductor layer;

forming a field shield gate at a predetermined position on said semiconductor layer with an insulating layer interposed therebetween;

implanting a second conductivity type impurity into said semiconductor layer using said field shield gate as a mask for carrying out channel doping of a MOS transistor and forming a channel stop region under said field shield gate; and forming a MOS transistor at a predetermined region on said semiconductor layer.

* * * * *